(12) United States Patent
Hanekawa et al.

(10) Patent No.: US 12,032,280 B2
(45) Date of Patent: Jul. 9, 2024

(54) REFLECTIVE MASK BLANK, REFLECTIVE MASK, AND METHOD FOR MANUFACTURING REFLECTIVE MASK

(71) Applicant: AGC INC., Tokyo (JP)

(72) Inventors: Hiroshi Hanekawa, Fukushima (JP); Taiga Fudetani, Fukushima (JP); Yusuke Ono, Fukushima (JP); Shunya Taki, Fukushima (JP)

(73) Assignee: AGC INC., Tokyo (JP)

( * ) Notice: Subject to any disclaimer, the term of this patent is extended or adjusted under 35 U.S.C. 154(b) by 0 days.

(21) Appl. No.: 18/544,970

(22) Filed: Dec. 19, 2023

(65) Prior Publication Data

US 2024/0160097 A1 May 16, 2024

Related U.S. Application Data

(63) Continuation of application No. PCT/JP2023/016365, filed on Apr. 25, 2023.

(30) Foreign Application Priority Data

Apr. 28, 2022 (JP) .................................. 2022-074386

(51) Int. Cl.
*G03F 1/24* (2012.01)
*G03F 1/26* (2012.01)

(52) U.S. Cl.
CPC . *G03F 1/24* (2013.01); *G03F 1/26* (2013.01)

(58) Field of Classification Search
CPC ..................................... G03F 1/24; G03F 1/26
USPC ............................................................ 430/5
See application file for complete search history.

(56) References Cited

FOREIGN PATENT DOCUMENTS

| JP | 2003-501823 | 1/2003 |
| JP | 2016-072438 A | 5/2016 |
| JP | 2021-081644 | 5/2021 |
| JP | 2021-144075 | 9/2021 |
| WO | WO 2019/225737 A1 | 11/2019 |
| WO | WO 2022/050156 A1 | 3/2022 |

OTHER PUBLICATIONS

International Search Report dated Jul. 11, 2023, in PCT/JP2023/016365 with English language translation.
Written Opinion of the International Searching Authority dated Jul. 11, 2023, in PCT/JP2023/016365 with English language translation.

*Primary Examiner* — Christopher G Young
(74) *Attorney, Agent, or Firm* — Oblon, McClelland, Maier & Neustadt, L.L.P.

(57) ABSTRACT

A reflective mask blank includes: a substrate; a multilayer reflective film configured to reflect EUV light; a protective film; and a phase shift film configured to shift a phase of EUV light, in this order, in which the phase shift film includes a first layer including one or more first elements selected from a group consisting of ruthenium, rhenium, iridium, silver, osmium, gold, palladium, and platinum, and a second layer including one or more second elements selected from a group consisting of tantalum and chromium, the first layer includes a region A1 in which a content of an element having a highest content among the one or more first elements increases in a thickness direction from a side opposite to the second layer toward the second layer, and the region A1 is present adjacent to the second layer.

18 Claims, 13 Drawing Sheets

REFLECTIVE MASK BLANK, REFLECTIVE MASK, AND METHOD FOR MANUFACTURING REFLECTIVE MASK

CROSS-REFERENCE TO RELATED APPLICATIONS

This is a bypass continuation of International Patent Application No. PCT/JP2023/016365, filed on Apr. 25, 2023, which claims priority to Japanese Patent Application No. 2022-074386, filed on Apr. 28, 2022. The contents of these applications are hereby incorporated by reference in their entireties.

TECHNICAL FIELD

The present invention relates to a reflective mask used for Extreme Ultra Violet (EUV) exposure used in an exposure process for semiconductor manufacturing, a method for manufacturing the same, a reflective mask blank which is an original plate of the reflective mask, and a method for manufacturing the same.

BACKGROUND ART

In recent years, EUV lithography using EUV light having a center wavelength of about 13.5 nm as a light source has been studied for further miniaturization of a semiconductor device.

In the EUV exposure, a reflective optical system and a reflective mask are used according to characteristics of EUV light. In the reflective mask, a multilayer reflective film that reflects EUV light is formed on a substrate, and a film having a low EUV light reflectance is patterned on the multilayer reflective film. As the film having a low EUV light reflectance, a phase shift film may be used for the purpose of a higher image resolution. The phase shift film is a film that gives a phase difference to the transmitted EUV light and reduces the EUV light reflectance due to interference among the EUV light in which a phase difference occurs.

A protective film is often provided between the multilayer reflective film and the film having a low reflectance for the purpose of protecting the multilayer reflective film at the time of patterning the film having a low reflectance.

In the case where a phase shift film is used as the film having a low reflectance of the reflective mask, the EUV light incident on the reflective mask from an illumination optical system of an exposure device is reflected at a portion (opening portion) where the phase shift film is not present, and reflection becomes small at a portion (non-opening portion) where the phase shift film is present. As a result, a mask pattern is transferred as a resist pattern onto a wafer through a reduction projection optical system of the exposure device, and the subsequent processing is performed.

Here, in order to cope with further miniaturization of a semiconductor device, a reflective mask capable of forming a higher-definition resist pattern is required. Patent Literature 1 discloses a two-layer type phase shift film including a first layer containing a specific element and a second layer containing a specific element for the purpose of reducing a shadowing effect.

Patent Literature 1: WO2019/225737

SUMMARY OF INVENTION

A reflective mask including the above-described phase shift film is manufactured by patterning a phase shift film of a reflective mask blank including a multilayer reflective film and the phase shift film. In addition, at the time of manufacturing the reflective mask, the reflective mask blank may be subjected to a heat treatment.

The present inventors have studied a reflective mask blank including the two-layer type phase shift film described in Patent Literature 1, and have found that peeling is likely to occur at an interface during a heat treatment. The reflective mask blank is not preferable because the occurrence of peeling at the interface affects the pattern accuracy of the reflective mask to be manufactured, and thus affects the resist pattern to be formed.

Accordingly, an object of the present invention is to provide a reflective mask blank in which occurrence of interfacial peeling due to a heat treatment is suppressed.

In addition, another object of the present invention is to provide a method for manufacturing a reflective mask using the reflective mask blank, and a reflective mask.

As a result of intensive studies on the above problems, the present inventors have found that the above problems can be solved by providing a region in which a content of an element having a highest content increases in one layer of a two-layer type phase shift film so as to be adjacent to the other layer, and have completed the present invention.

That is, the inventors have found that the above problems can be solved by the following configurations.

1. A reflective mask blank including:
   a substrate;
   a multilayer reflective film configured to reflect EUV light;
   a protective film; and
   a phase shift film configured to shift a phase of EUV light, in this order, in which
   the phase shift film includes a first layer including one or more first elements selected from a group consisting of ruthenium, rhenium, iridium, silver, osmium, gold, palladium, and platinum, and a second layer including one or more second elements selected from a group consisting of tantalum and chromium,
   the first layer includes a region A1 in which a content of an element having a highest content among the one or more first elements increases in a thickness direction from a side opposite to the second layer toward the second layer, and the region A1 is present adjacent to the second layer.

2. The reflective mask blank according to item 1, in which
   in a case where the first layer is disposed closer to the protective film than the second layer in the phase shift film, the first layer includes a region B1 in which a content of an element having a highest content among the one or more first elements increases in a thickness direction from a side opposite to the protective film toward the protective film, and the region B1 is located closer to the protective film than the first layer and is adjacent to a layer in contact with the first layer, and
   in a case where the second layer is disposed closer to the protective film than the first layer in the phase shift film, the second layer includes a region B2 in which a content of an element having a highest content among the one or more second elements increases in a thickness direction from a side opposite to the protective film toward the protective film, and the region B2 is located closer to the protective film than the second layer and is adjacent to a layer in contact with the second layer.

3. The reflective mask blank according to item 1 or 2, in which the phase shift film includes a third layer including one or more third elements selected from a group consisting of tantalum and chromium, the first layer, and the second layer in this order.

4. The reflective mask blank according to item 3, in which the first layer includes a region C1 in which a content of an element having a highest content among the one or more first elements increases in a thickness direction from a side opposite to the third layer toward the third layer, and the region C1 is present adjacent to the third layer.

5. The reflective mask blank according to item 4, in which
in a case where the third layer is disposed closer to the protective film in the phase shift film, the second layer includes a region D2 in which a content of an element having a highest content among the one or more second elements increases in a thickness direction from a side opposite to the first layer toward the first layer, and the region D2 is present adjacent to the first layer, and
in a case where the second layer is disposed closer to the protective film in the phase shift film,
the second layer includes the region D2 in which a content of an element having the highest content among the one or more second elements increases in a thickness direction from a side opposite to the first layer toward the first layer, and the region D2 is present adjacent to the first layer, or
the second layer includes a region E2 in which a content of an element having a highest content among the one or more second elements increases in a thickness direction from a side opposite to the protective film toward the protective film, and the region E2 is present adjacent to the protective film.

6. The reflective mask blank according to any of items 3 to 5, in which
in a case where the third layer is disposed closer to the protective film in the phase shift film, the third layer includes a region F3 in which a content of an element having a highest content among the one or more third elements increases in a thickness direction from a side opposite to the first layer toward the first layer, and the region F3 is present adjacent to the first layer, or
the third layer includes a region G3 in which a content of an element having a highest content among the one or more third elements increases in a thickness direction from a side opposite to the protective film toward the protective film, and the region G3 is present adjacent to the protective film, and
in a case where the second layer is disposed closer to the protective film in the phase shift film, the third layer includes the region F3 in which a content of an element having a highest content among the one or more third elements increases in a thickness direction from a side opposite to the first layer toward the first layer, and the region F3 is present adjacent to the first layer.

7. A reflective mask blank including:
a substrate;
a multilayer reflective film configured to reflect EUV light;
a protective film; and
a phase shift film configured to shift a phase of EUV light, in this order, in which
the phase shift film includes a first layer including one or more first elements selected from a group consisting of ruthenium, rhenium, iridium, silver, osmium, gold, palladium, and platinum, and a second layer including one or more second elements selected from a group consisting of tantalum and chromium, the second layer includes a region G2 in which a content of an element having a highest content among the one or more second elements increases in a thickness direction from a side opposite to the first layer toward the first layer, and the region G2 is present adjacent to the first layer.

8. The reflective mask blank according to item 7, in which
in a case where the first layer is disposed closer to the protective film than the second layer in the phase shift film, the first layer includes a region H1 in which a content of an element having a highest content among the one or more first elements increases in a thickness direction from a side opposite to the protective film toward the protective film, and the region H1 is located closer to the protective film than the first layer and is adjacent to a layer in contact with the first layer, and
in a case where the second layer is disposed closer to the protective film than the first layer in the phase shift film, the second layer includes a region I2 in which a content of an element having a highest content among the one or more second elements increases in a thickness direction from a side opposite to the protective film toward the protective film, and the region I2 is located closer to the protective film than the second layer and is adjacent to a layer in contact with the second layer.

9. The reflective mask blank according to item 7 or 8, in which the phase shift film includes a third layer including one or more third elements selected from a group consisting of tantalum and chromium, the first layer, and the second layer in this order.

10. The reflective mask blank according to item 9, in which
in a case where the third layer is disposed closer to the protective film in the phase shift film, the third layer includes a region J3 in which a content of an element having a highest content among the one or more third elements increases in a thickness direction from a side opposite to the first layer toward the first layer, and the region J3 is present adjacent to the first layer, or
the third layer includes a region K3 in which a content of an element having a highest content among the one or more third elements increases in a thickness direction from the side opposite to the protective film toward the protective film, and the region K3 is present adjacent to the protective film, and
in a case where the second layer is disposed closer to the protective film in the phase shift film, the third layer includes the region J3 in which a content of an element having a highest content among the one or more third elements increases in a thickness direction from a side opposite to the first layer toward the first layer, and the region J3 is present adjacent to the first layer.

11. A reflective mask blank including:
a substrate;
a multilayer reflective film configured to reflect EUV light;
a protective film; and
a phase shift film configured to shift a phase of EUV light, in this order, in which
the phase shift film includes, from a side of the protective film, a first layer including one or more first elements selected from a group consisting of ruthenium, rhenium, iridium, silver, osmium, gold, palladium, and platinum, and a second layer including one or more second elements selected from a group consisting of tantalum and chromium in this order, the first layer includes a region N1 in which a content of an element having a highest content among the one or more first elements increases in a thickness direction from a side opposite to the protective film toward the protective film, and the region N1 is present adjacent to the protective film.

12. A reflective mask blank including:
a substrate;
a multilayer reflective film configured to reflect EUV light;
a protective film; and
a phase shift film configured to shift a phase of EUV light, in this order, in which
the phase shift film includes, from a side of the protective film, a second layer including one or more second elements selected from a group consisting of tantalum and chromium, and a first layer including one or more first elements selected from a group consisting of ruthenium, rhenium, iridium, silver, osmium, gold, palladium, and platinum in this order,
the second layer includes a region O2 in which a content of an element having a highest content among the one or more second elements increases in a thickness direction from a side opposite to the protective film toward the protective film, and the region O2 is present adjacent to the protective film.

13. The reflective mask blank according to any of items 1 to 12, in which at least one of the first layer and the second layer includes one or more elements selected from a group consisting of boron, carbon, nitrogen, and oxygen.

14. The reflective mask blank according to any of items 1 to 13, in which
the first layer has a refractive index of 0.860 to 0.950 for an electromagnetic wave having a wavelength of 13.5 nm, and
the first layer has an extinction coefficient of 0.009 to 0.095 an electromagnetic wave having a wavelength of 13.5 nm.

15. The reflective mask blank according to any of items 1 to 14, having a reflectance of 1% to 30% for an electromagnetic wave having a wavelength of 13.5 nm.

16. The reflective mask blank according to any of items 1 to 15, in which the phase shift film has a film thickness of 20 nm to 65 nm.

17. A reflective mask including:
a phase shift film pattern formed by patterning the phase shift film of the reflective mask blank according to any of items 1 to 16.

18. A method for manufacturing a reflective mask, the method including:
patterning the phase shift film of the reflective mask blank according to any of items 1 to 16.

According to the present invention, it is possible to provide a reflective mask blank in which occurrence of interfacial peeling due to a heat treatment is suppressed.

In addition, according to the present invention, it is also possible to provide a method for manufacturing a reflective mask using the reflective mask blank, and a reflective mask.

Figure 1:
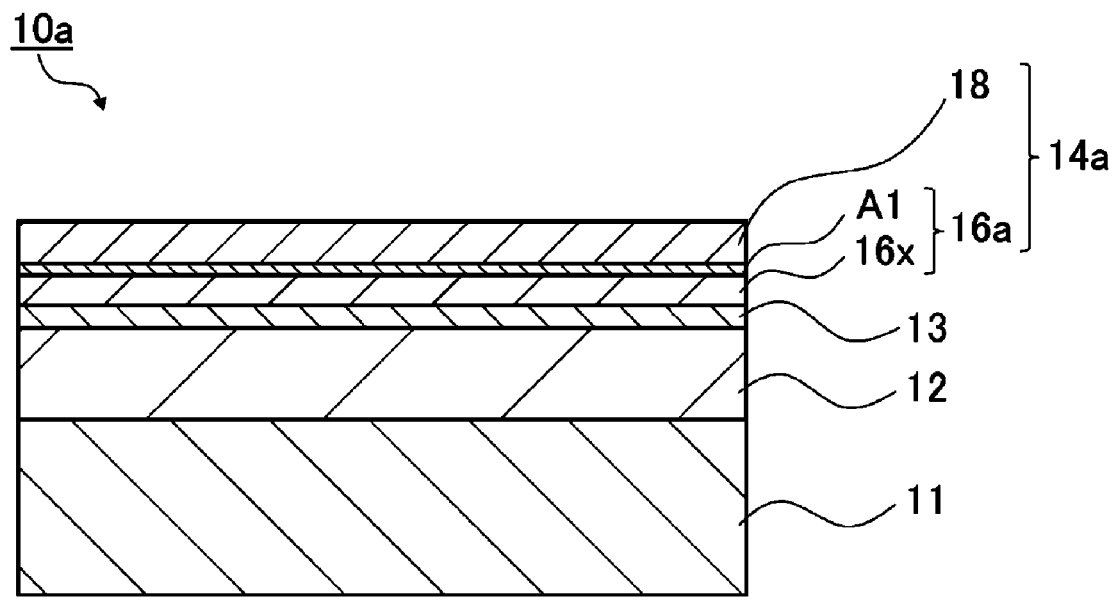
FIG. 1 is a schematic view showing an example of a reflective mask blank according to a first embodiment of the present invention.

Each of FIG. 23A to FIG. 23D is a schematic views showing an example of a manufacturing process of a reflective mask using the reflective mask blank according to the present invention.

DESCRIPTION OF EMBODIMENTS

Hereinafter, the present invention will be described in detail.

Constituent elements described below may be described based on representative embodiments of the present invention, but the present invention is not limited to such embodiments.

Meanings of the respective descriptions in the present description are shown.

In the present description, the symbol "-" or the word "to" that is used to express a numerical range includes the numerical values before and after the symbol or the word as the upper limit and the lower limit of the range, respectively.

In the present description, elements such as hydrogen, boron, carbon, nitrogen, oxygen, silicon, titanium, chromium, zirconium, niobium, molybdenum, ruthenium, rhodium, palladium, tantalum, rhenium, iridium, silver, osmium, gold, palladium, and platinum may be represented by corresponding element symbols (H, B, C, N, O, Si, Ti, Cr, Zr, Nb, Mo, Ru, Rh, Pd, Ta, Re, Ir, Ag, Os, Au, Pd, and Pt).

Examples of a reflective mask blank according to the present invention include a first embodiment, a second embodiment, a third embodiment, a fourth embodiment, a fifth embodiment, and a sixth embodiment. The respective embodiments will be described below.

Reflective Mask Blank (First Embodiment)

The reflective mask blank according to the first embodiment of the present invention includes, a substrate, a multilayer reflective film that reflects EUV light, a protective film, and a phase shift film that shifts a phase of EUV light, in this order, in which the phase shift film includes a first layer containing one or more first elements selected from the group consisting of Ru, Re, Ir, Ag, Os, Au, Pd, and Pt, and a second layer containing one or more second elements selected from the group consisting of Ta and Cr, the first layer includes a region A1 in which a content of an element having a highest content among the one or more first elements increases in a thickness direction from a side opposite to the second layer toward the second layer, and the region A1 is present adjacent to the second layer.

Regarding the first layer, in other words, the first layer includes the region A1 present adjacent to the second layer, and in the region A1, the content of the element having the highest content among the one or more first elements increases in the thickness direction from the side opposite to the second layer toward the second layer.

Here, a content of an element M refers to a proportion (atomic %) of atoms of the element M to all atoms.

The reflective mask blank according to the first embodiment will be described with reference to FIG. 1. A reflective mask blank 10a shown in FIG. 1 includes a substrate 11, a multilayer reflective film 12, a protective film 13, and a phase shift film 14a in this order. The phase shift film 14a includes, from the protective film 13, a first layer 16a containing the one or more first elements and a second layer 18 containing the one or more second elements in this order. In addition, the first layer 16a includes the region A1 in which the content of the element having the highest content among the one or more first elements increases in a thickness direction from a side opposite to the second layer 18 toward the second layer 18, and the region A1 is present adjacent to the second layer 18. A region of the first layer 16a other than the region A1 is a first layer normal region 16x, and the content of the element having the highest content among the one or more first elements in the first layer normal region 16x is smaller than that in the region A1.

In the reflective mask blank according to the first embodiment of the present invention, occurrence of interfacial peeling is suppressed even when a heat treatment is performed.

The present inventors presume a mechanism of suppressing the occurrence of interfacial peeling by the heat treatment as follows.

When the heat treatment is performed, stress may occur between a film and a layer constituting the reflective mask blank.

The present inventors have studied a reflective mask blank including a two-layer type phase shift film, and interfacial peeling may occur at an interface between the first layer and the second layer of the phase shift film.

In the reflective mask blank according to the first embodiment, the region A1 is present adjacent to the second layer 18, as shown in FIG. 1. Here, the content of the element having the highest content among the one or more first elements in the region A1 increases, and thus the composition is varied, and adhesiveness between the first layer 16a and the second layer 18 may be improved. As a result, it is considered that interfacial peeling is suppressed.

Hereinafter, the configuration of the reflective mask blank according to the first embodiment of the present invention will be described.

Hereinafter, suppression of the occurrence of interfacial peeling even when the reflective mask blank according to the present invention is subjected to a heat treatment is also simply referred to as "interfacial peeling can be suppressed".

(Substrate)

The substrate included in the reflective mask blank according to the first embodiment of the present invention preferably has a small thermal expansion coefficient. When the thermal expansion coefficient of the substrate is small, it is possible to suppress occurrence of distortion in the phase shift film pattern due to heat at the time of exposure with EUV light.

The thermal expansion coefficient of the substrate at 20° C. is preferably $0\pm1.0\times10^{-7}/°$ C., and more preferably $0\pm0.3\times10^{-7}/°$ C.

Examples of a material having a small thermal expansion coefficient include a $SiO_2$—$TiO_2$-based glass, but without being limited thereto, it is also possible to use a substrate of a crystallized glass in which a β-quartz solid solution is precipitated, a quartz glass, a metallic silicon, metal or the like.

The $SiO_2$—$TiO_2$-based glass is preferably a quartz glass containing 90 mass % to 95 mass % of $SiO_2$ and 5 mass % to 10 mass % of $TiO_2$. In the case where the content of $TiO_2$ is 5 mass % to 10 mass %, a linear expansion coefficient around room temperature is substantially zero, and a dimensional change around room temperature hardly occurs. The $SiO_2$—$TiO_2$-based glass may contain trace components other than $SiO_2$ and $TiO_2$.

A surface of the substrate on which the multilayer reflective film is laminated (hereinafter also referred to as "first main surface") preferably has a high surface smoothness. The surface smoothness of the first main surface can be evaluated by surface roughness. The surface roughness of the first main surface is preferably 0.15 nm or less in terms of a root mean square roughness Rq. The surface roughness can be measured with an atomic force microscope, and the surface roughness is described as the root mean square roughness Rq based on JIS-B 0601: 2013.

The first main surface is preferably subjected to surface processing so as to have a predetermined flatness from the viewpoint of enhancing pattern transfer accuracy and positional accuracy of a reflective mask obtained using the reflective mask blank. The flatness of the substrate in a predetermined region (for example, a 132 mm×132 mm region) of the first main surface is preferably 100 nm or less, more preferably 50 nm or less, and still more preferably 30 nm or less. The flatness can be measured by a flatness measuring instrument manufactured by Fujinon Corporation.

A size, a thickness, and the like of the substrate are appropriately determined according to design values and the like of the mask. For example, an outer shape may be 6 inches (152 mm) square, and the thickness may be 0.25 inches (6.3 mm).

Further, the substrate preferably has a high rigidity from the viewpoint of preventing deformation due to film stress of films (such as the multilayer reflective film and the phase shift film) formed on the substrate. For example, the Young's modulus of the substrate is preferably 65 GPa or more.

(Multilayer Reflective Film)

The multilayer reflective film included in the reflective mask blank according to the first embodiment of the present invention is not particularly limited as long as it has desired characteristics as a reflective film of an EUV mask blank. The multilayer reflective film preferably has a high EUV light reflectance, and specifically, when the EUV light is incident on a surface of the multilayer reflective film at an incident angle of 6°, the maximum value of the EUV light reflectance in the vicinity of a wavelength of 13.5 nm is preferably 60% or more, and more preferably 65% or more. Similarly, even when the protective film is laminated on the multilayer reflective film, the maximum value of the EUV light reflectance in the vicinity of the wavelength of 13.5 nm is preferably 60% or more, and more preferably 65% or more.

Since the multilayer reflective film can implement a high EUV light reflectance, a multilayer reflective film in which a high-refractive-index layer having a high refractive index for EUV light and a low-refractive-index layer having a low refractive index for EUV light are alternately laminated a plurality of times is usually used.

The multilayer reflective film may be obtained by lamination for a plurality of cycles with, as one cycle, a laminated structure in which a high-refractive-index layer and a low-refractive-index layer are laminated in this order from the substrate, or may be obtained by lamination for a plurality of cycles with, as one cycle, a laminated structure in which a low-refractive-index layer and a high-refractive-index layer are laminated in this order.

As the high-refractive-index layer, a layer containing Si can be used. As a material containing Si, in addition to elemental Si, an Si compound containing Si and one or more selected from the group consisting of B, C, N, and O can be used. By using a high-refractive-index layer containing Si, a reflective mask having an excellent EUV light reflectance can be obtained.

A layer containing a metal selected from the group consisting of Mo, Ru, Rh, and Pt, or an alloy thereof can be used as the low-refractive-index layer.

Si is widely used for the high-refractive-index layer, and Mo is widely used for the low-refractive-index layer. That is, an Mo/Si multilayer reflective film is the most common. However, the multilayer reflective film is not limited thereto, and an Ru/Si multilayer reflective film, an Mo/Be multilayer reflective film, an Mo compound/Si compound multilayer reflective film, an Si/Mo/Ru multilayer reflective film, an Si/Mo/Ru/Mo multilayer reflective film, and an Si/Ru/Mo/Ru multilayer reflective film can also be used.

A film thickness of each of the layers constituting the multilayer reflective film and the number of repeating units of the layer can be appropriately selected according to a film material to be used and the EUV light reflectance required for the reflective layer. When taking the Mo/Si multilayer reflective film as an example, in order to obtain a multilayer reflective film having the maximum value of the EUV light reflectance of 60% or more, an Mo film having a film thickness of 2.3 nm±0.1 nm and an Si film having a film thickness of 4.5 nm±0.1 nm may be laminated such that the number of repeating units is 30 to 60.

Each of the layers constituting the multilayer reflective film can be formed to have a desired thickness by using a known film formation method such as a magnetron sputtering method or an ion beam sputtering method. For example, in the case where a multilayer reflective film is prepared using an ion beam sputtering method, ion particles are supplied from an ion source to a target of a high-refractive-index material and a target of a low-refractive-index material. In the case where the multilayer reflective film is an Mo/Si multilayer reflective film, an Si layer having a predetermined film thickness is first formed on the substrate by an ion beam sputtering method by using, for example, an Si target. Thereafter, a Mo layer having a predetermined film thickness is formed by using an Mo target. An Mo/Si multilayer reflective film is formed by lamination for 30 cycles to 60 cycles with the Si layer and the Mo layer as one cycle.

A layer of the multilayer reflective film in contact with the protective film is preferably a layer made of a material that is not easily oxidized. The layer made of a material that is hardly oxidized functions as a cap layer for the multilayer reflective film. Examples of the layer made of a material that is hardly oxidized include an Si layer. When the multilayer reflective film is an Si/Mo multilayer reflective film, the layer in contact with the protective film functions as a cap layer in the case where the layer in contact with the protective film is an Si layer. In this case, a film thickness of the cap layer is preferably 11 nm±2 nm.

(Protective Film)

The protective film included in the reflective mask blank according to the first embodiment of the present invention is provided for the purpose of protecting the multilayer reflective film so that the multilayer reflective film is not damaged by an etching process (usually, dry etching process) at the time of forming a pattern on the phase shift film by the etching process.

Examples of the material that can implement the above object include a material containing at least one element selected from the group consisting of Ru and Rh. That is, the protective film preferably contains at least one element selected from the group consisting of Ru and Rh.

More specifically, examples of the material include an Ru metal simple substance, an Ru alloy containing Ru and one or more metals selected from the group consisting of Si, Ti, Nb, Rh, and Zr, an Rh metal simple substance, an Rh alloy containing Rh and one or more metals selected from the group consisting of Si, Ti, Nb, Ta, and Zr, and an Rh-based material such as an Rh-containing nitride containing the Rh alloy and nitrogen, and an Rh-containing oxynitride containing the Rh alloy, nitrogen, and oxygen.

In addition, examples of the material that can implement the above object include a nitride containing nitrogen as well as Al and these metals, and $Al_2O_3$.

Among them, the Ru metal simple substance, the Ru alloy, the Rh metal simple substance, or the Rh alloy is preferable as the material that can implement the above object. The Ru alloy is preferably an Ru—Si alloy, and the Rh alloy is preferably an Rh—Si alloy.

A film thickness of the protective film is not particularly limited as long as it can function as the protective film. From the viewpoint of maintaining the EUV light reflectance reflected by the multilayer reflective film, the film thickness of the protective film is preferably 1 nm to 10 nm, more preferably 1.5 nm to 6 nm, and still more preferably 2 nm to 5 nm.

It is also preferable that the material of the protective film is the Ru metal simple substance, the Ru alloy, the Rh metal simple substance, or the Rh alloy, and the film thickness of the protective film is the above preferable film thickness.

In addition, the protective film may be a film including a single layer or a multilayer film including a lower layer and an upper layer. The lower layer is a layer formed in contact with the uppermost surface of the multilayer reflective film, and the upper layer is a layer formed on the lower layer. By making the protective film to have a multilayer structure in this way, a material excellent in predetermined function can be used for each layer, and thus multi-functionalization of the entire protective film can be implemented.

The upper layer of the protective film preferably contains Rh, and more preferably contains an Rh compound. The lower layer of the protective film preferably contains at least one element selected from the group consisting of Ru, Nb, Mo, Zr, Y, C, and B, and more preferably contains Ru. In addition, in the case where the protective film is a multilayer film, a total film thickness of the multilayer film is preferably the film thickness of the protective film within the following preferable range.

The total film thickness of the multilayer film in the case where the protective film is a multilayer film is preferably 1.0 nm to 4.0 nm, more preferably 2.0 nm to 3.5 nm, and still more preferably 2.5 nm to 3.0 nm. When the thickness of the protective film is 1.0 nm or more, the etching resistance is good. In addition, when the thickness of the protective film is 4.0 nm or less, the EUV light reflectance is good.

The protective film can be formed by a known film formation method such as a magnetron sputtering method and an ion beam sputtering method. In the case where an Ru film is formed by a magnetron sputtering method, it is preferable to perform film formation by using an Ru target as a target and an Ar gas as a sputtering gas.

(Phase Shift Film)

The phase shift film included in the reflective mask blank according to the first embodiment of the present invention includes a first layer containing one or more first elements selected from the group consisting of Ru, Re, Ir, Ag, Os, Au, Pd, and Pt, and a second layer containing one or more second elements selected from the group consisting of Ta and Cr.

In addition, the phase shift film may include a third layer containing one or more third elements selected from the group consisting of Ta and Cr as in an aspect to be described later.

Hereinafter, the respective layers constituting the phase shift film will be described in detail.

In the first embodiment, the first layer contains one or more first elements selected from the group consisting of Ru, Re, Ir, Ag, Os, Au, Pd, and Pt. The first layer preferably contains one or more elements selected from the group consisting of B, C, N, and O.

In the case where the first layer contains Ru as the one or more first elements, the first layer preferably contains an element other than Ru, and examples of the other element include one or more elements selected from the group consisting of B, C, N, O, Mo, Ta, and Nb. Among them, as the elements other than Ru, one or more elements selected from the group consisting of B, N, and O are preferable. In the case where the first layer contains Ru, examples of a material constituting the first layer include ruthenium boride, ruthenium nitride, ruthenium oxide, ruthenium oxynitride, complex nitride of Ru and Mo, complex oxynitride of Ru and Mo, complex oxycarbide of Ru and Mo, complex nitride of Ru and Ta, complex oxynitride of Ru and Ta, and complex oxycarbide of Ru and Ta.

In the case where the first layer contains Re as the one or more first elements, the first layer preferably contains an element other than Re, and examples of the other element include one or more elements selected from the group consisting of B, C, N, O, and Ru. In the case where the first layer contains Re, examples of the material constituting the first layer include rhenium boride, rhenium carbide, rhenium nitride, rhenium oxide, rhenium oxycarbide, rhenium oxynitride, Re—Ru alloy, complex nitride of Re and Ru, and complex oxynitride of Re and Ru.

In the case where the first layer contains Ir as the one or more first elements, the first layer preferably contains an element other than Ir, and examples of the other element include one or more elements selected from the group consisting of B, C, N, O, and Ru. In the case where the first layer contains Ir, examples of the material constituting the first layer include iridium boride, iridium nitride, iridium oxide, iridium oxynitride, Ir—Ru alloy, composite nitride of Ir and Ru, and composite oxynitride of Ir and Ru.

In the case where the first layer contains Ag as the one or more first elements, the first layer preferably contains an element other than Ag, and examples of the other element include one or more elements selected from the group consisting of B, C, N, O, and Ru. In the case where the first layer contains Ag, examples of the material constituting the first layer include silver boride, silver nitride, silver oxide, silver oxynitride, Ag—Ru alloy, composite nitride of Ag and Ru, and composite oxynitride of Ag and Ru.

In the case where the first layer contains Os as the one or more first elements, the first layer preferably contains an element other than Os, and examples of the other element include one or more elements selected from the group consisting of B, C, N, O, and Ru. In the case where the first layer contains Os, examples of the material constituting the first layer include osmium boride, osmium nitride, osmium oxide, osmium oxynitride, Os—Ru alloy, composite nitride of Os and Ru, and composite oxynitride of Os and Ru.

In the case where the first layer contains Au as the one or more first elements, the first layer preferably contains an element other than Au, and examples of the other element include one or more elements selected from the group consisting of B, C, N, O, and Ru. In the case where the first layer contains Au, examples of the material constituting the first layer include gold boride, gold nitride, gold oxide, gold oxynitride, Au—Ru alloy, composite nitride of Au and Ru, and composite oxynitride of Au and Ru.

In the case where the first layer contains Pd as the one or more first elements, the first layer preferably contains an element other than Pd, and examples of the other element include one or more elements selected from the group consisting of B, C, N, O, and Ru. In the case where the first layer contains Pd, examples of the material constituting the first layer include palladium boride, palladium nitride, palladium oxide, palladium oxynitride, Pd—Ru alloy, composite nitride of Pd and Ru, and composite oxynitride of Pd and Ru.

In the case where the first layer contains Pt as the one or more first elements, the first layer preferably contains an element other than Pt, and examples of the other element include one or more elements selected from the group consisting of B, C, N, O, and Ru. In the case where the first layer contains Pt, examples of the material constituting the first layer include platinum boride, platinum nitride, platinum oxide, platinum oxynitride, Pt—Ru alloy, composite nitride of Pt and Ru, and composite oxynitride of Pt and Ru.

In the phase shift film, the first layer contains one or more first elements selected from the group consisting of Ru, Re, Ir, Ag, Os, Au, Pd, and Pt, and the second layer contains one or more second elements selected from the group consisting of Ta and Cr, for the following reasons. The reasons are that the one or more first elements has a low refractive index with respect to EUV exposure light and can enhance a phase shift effect by being used in an absorption layer, and in the case of being disposed under the one or more first elements, the one or more second elements function as a buffer layer that suppresses damage on the protective film due to an etching gas of the one or more first elements. In addition, the reason is that in the case of being disposed on the one or more first elements, the one or more second elements function as a reflectance adjusting layer for a wavelength of an inspection light of the blank. In addition, the phase shift film may further include a third layer containing one or more third elements selected from the group consisting of Ta and Cr as in an aspect to be described later.

In the phase shift film, the first layer preferably contains one or more first elements selected from the group consisting of Ru and Ir, and the second layer preferably contains one or more second elements selected from the group consisting of Ta and Cr.

Among them, as a material constituting the first layer, ruthenium boride, ruthenium nitride, ruthenium oxynitride, composite nitride of Ru and Ta, composite nitride of Ru and Mo, Re—Ru alloy, composite oxynitride of Re and Ru, and Ir—Ru alloy or composite oxynitride of Ir and Ru are preferable.

In the first embodiment, the first layer includes the region A1 in which a content of an element having a highest content among the one or more first elements increases in a thickness direction from a side opposite to the second layer toward the second layer, and the region A1 is present adjacent to the second layer.

The element having the highest content among the one or more first elements (hereinafter, also simply referred to as "first specific element") is an element having the highest content (atomic %) among the one or more first elements contained in the first layer. The first specific element is determined by determining the elements contained in the first layer and contents thereof by a measurement method to be described later.

The expression "in the region A1, a content of the first specific element increases in a thickness direction from a side opposite to the second layer toward the second layer" means that the content of the first specific element may continuously increase in the thickness direction from the side opposite to the second layer toward the second layer, and the content of the first specific element may increase stepwise in the thickness direction from the side opposite to the second layer toward the second layer. In addition, continuous increase and stepwise increase may be combined.

In addition, the expression "in the region A1, a content of the first specific element increases in a thickness direction from a side opposite to the second layer toward the second layer" means that in the region A1, the first specific element may increase as an overall tendency as viewed from the entire first layer. Specific examples in which the first specific element increases as an overall tendency as viewed from the entire first layer include an aspect in which the region A1 includes a region in which the content of the first specific element continuously increases in the thickness direction from the side opposite to the second layer toward the second layer and a region in which the content of the first specific element is substantially constant, and an aspect in which the region A1 includes a region in which the content of the first specific element increases stepwise in the thickness direction from the side opposite to the second layer toward the second layer and a region in which the content of the first specific element is substantially constant.

The content of the element (particularly, the first specific element) contained in the first layer can be measured by a known measurement method.

Examples of the measurement method include a method in which a cross-sectional sample of the reflective mask blank according to the present invention is prepared by a method such as a microtome method or a focused ion beam method, and the cross-sectional sample is analyzed. Examples of a method for analyzing the cross-sectional sample include a scanning transmission electron microscope-energy dispersive X-ray spectroscopy (STEM-EDS) method and a scanning transmission electron microscope-electron energy loss spectroscopy (STEM-EELS) method.

In addition, in the measurement, a surface analysis method may be used. Examples of the surface analysis method include secondary ion mass spectrometry (SIMS), X-ray photoelectron spectroscopy (XPS), and low-energy ion scattering (LEIS). The surface analysis can be performed while cutting the measurement surface in the thickness direction by ion sputtering or the like to analyze the content of the element in the thickness direction.

In addition, as the measurement method, other spectroscopy may be used. Examples of the other spectroscopy include an X-ray reflectance (XRR) method and a Rutherford backscattering (RBS) method. The other spectroscopy is preferably performed in combination with the above analysis method on the cross-sectional sample or the surface analysis method.

The measurement may be performed by combining the above-described methods.

In the region (first layer normal region) of the first layer other than the region A1, the content of the first specific element is usually substantially constant in the thickness direction in many cases. That is, the content of the first specific element in the region of the first layer other than the region A1 in the thickness direction of the first layer is substantially constant in many cases regardless of the thickness position.

A film thickness of the first layer is preferably 2 nm to 55 nm, more preferably 10 nm to 50 nm, and still more preferably 20 nm to 45 nm.

The film thickness of the first layer is determined by the XRR method.

The region A1 is usually disposed in a part of the first layer in the thickness direction, and a proportion of a thickness of the region A1 to a total thickness of the first layer is preferably 1% to 30%, and more preferably 3% to 15%.

A film thickness of the region A1 is preferably 0.1 nm to 10 nm, and more preferably 0.5 nm to 5 nm.

The film thickness of the region A1 is determined based on a measurement result of the content of the element measured by the above-described measurement method.

A content of the first specific element in a portion of the region A1 closest to the first layer on a vertical cross section is preferably 50 at % to 95 at %, more preferably 50 at % to 85 at %, and still more preferably 50 at % to 75 at %. In addition, the content of the first specific element in a portion of the region A1 closest to the second layer on the vertical cross section is preferably 60 at % to 100 at %, more preferably 70 at % or more and less than 100 at %, and still more preferably 80 at % or more and less than 100 at %.

A difference obtained by subtracting the content of the first specific element in the portion closest to the first layer from the content of the first specific element in the portion closest to the second layer is preferably 5 at % to 50 at %, and more preferably 10 at % to 50 at %.

A refractive index n of the first layer for an electromagnetic wave (EUV light) having a wavelength of 13.5 nm is preferably 0.860 to 0.950, and more preferably 0.885 to 0.915.

An extinction coefficient k of the first layer for an electromagnetic wave (EUV light) having a wavelength of 13.5 nm is preferably 0.009 to 0.095, and more preferably 0.015 to 0.060.

The refractive index n and the extinction coefficient k of the first layer are determined by measuring incident angle dependence of the reflectance using an electromagnetic wave (EUV light) having a wavelength of 13.5 nm and performing fitting using the refractive index n and the extinction coefficient k as parameters in the obtained profile.

As a sample for which the incident angle dependence is measured, a sample in which a first layer is formed on a substrate in the same manner as the manufacturing conditions of the reflective mask blank is used. In addition, a reflective mask blank can also be used as the sample for the measurement.

In the first embodiment, the second layer contains one or more second elements selected from the group consisting of Ta and Cr. The second layer preferably further contains one or more elements selected from the group consisting of B, C, N, and O.

In the case where the second layer includes Ta as the one or more second elements, the second layer may contain an element other than Ta. Examples of the other element include one or more elements selected from the group consisting of B, C, N, and O. In the case where the second layer contains Ta, examples of a material constituting the second layer include Ta metal simple substance, tantalum boride, tantalum boron nitride, tantalum borate, tantalum carbide, tantalum carbonitride, tantalum oxycarbonitride, tantalum nitride, tantalum oxide, and tantalum oxynitride.

In the case where the second layer contains Cr as the one or more second elements, the second layer may contain an element other than Cr, and examples of the other element include one or more elements selected from the group consisting of B, C, N, and O. In the case where the second layer contains Cr, examples of the material constituting the second layer include Cr metal simple substance, chromium boride, chromium boron nitride, chromium borate, chromium carbide, chromium carbonitride, chromium oxycarbonitride, chromium oxycarbide, chromium nitride, chromium oxide, and chromium oxynitride.

Among them, tantalum boron nitride, tantalum nitride, tantalum oxynitride, chromium nitride, chromium oxide, chromium oxycarbonitride, and chromium oxynitride are preferable as the material constituting the second layer.

A film thickness of the second layer is preferably 2 nm to 45 nm, and more preferably 10 nm to 30 nm.

The film thickness of the second layer is determined by the XRR method.

The first layer and the second layer can be formed by a known film formation method such as a magnetron sputtering method or an ion beam sputtering method. For example, in the case where a tantalum oxynitride layer is formed as the second layer by a magnetron sputtering method, reactive sputtering may be performed by using a Ta target and supplying a gas containing an Ar gas, a nitrogen gas, and an oxygen gas.

As a method for forming the region A1 included in the first layer, film formation may be performed under a condition that the element (first specific element) having the highest content among the one or more first elements contained in the first layer increases. Examples of the film formation method include the above-described film formation method.

Examples of the film formation condition for forming the region A1 include a condition that in the case where the first layer is formed by sputtering by supplying a gas containing a nitrogen gas and an oxygen gas, a supply amount of at least one of the nitrogen gas and the oxygen gas is smaller than that at the time of forming the first layer normal region. In addition, examples of the condition include a condition that in the case of using an alloy target as a sputtering target for forming the first layer, an alloy target in which a content of an element having the highest content is higher than that at the time of forming the first layer normal region is used.

In the case where the film formation is performed under the above condition, when film formation is performed, under a condition for forming the first layer normal region, on the layer formed under the above condition, mixing occurs at an interface of the layer, and the region A1 in which the first specific element continuously increases may be formed. A degree of mixing at the interface can be controlled by adjusting a kinetic energy of particles containing atoms for forming the first layer, which are supplied to a non-film-formation material. The kinetic energy of the particles can be adjusted by adjusting the film formation condition. In addition, the degree of mixing at the interface can also be adjusted by the film formation condition such as the temperature during film formation.

Examples of the method for manufacturing the reflective mask blank according to the first embodiment include a method of forming the region A1 under the above condition after formation of the protective film, during formation of the first layer, and before completion of the formation of the first layer, and then forming the second layer.

A film thickness of the phase shift film is preferably 20 nm to 65 nm, and more preferably 30 nm to 55 nm. The film thickness of the phase shift film refers to a total film thickness of the first layer and the second layer, and in the case where a third layer is included, the film thickness of the phase shift film refers to a total film thickness of the first layer, the second layer, and the third layer.

A reflectance of the reflective mask blank for an electromagnetic wave (EUV light) having a wavelength of 13.5 nm is preferably 1% to 30%, and more preferably 2% to 15%. The reflectance can be measured using an EUV reflectometer for a mask blank (MBR manufactured by AIXUV GmbH).

In addition, a phase difference caused by the phase shift film in an electromagnetic wave having a wavelength of 13.5 nm is preferably 150° to 250°, and more preferably 180° to 220°. The phase difference caused by the phase shift film refers to a phase difference between reflected light of EUV light on a surface of the phase shift film opposite to the protective film and reflected light from the multilayer reflective film.

From the viewpoint of performing pattern inspection on a reflective mask formed using the reflective mask blank, the reflectance of the phase shift film for deep-UV (wavelength of 190 nm to 260 nm) is preferably 0% to 50%, and more preferably 0 to 35%.

(Back Surface Conductive Film)

In the reflective mask blank according to the first embodiment of the present invention, a back surface conductive film may be provided on a surface (second main surface) of the substrate opposite to the first main surface. By providing the back surface conductive film, the reflective mask blank may be handled by an electrostatic chuck.

The back surface conductive film preferably has a low sheet resistance value. The sheet resistance value of the back surface conductive film is, for example, preferably 200Ω/□ or less, and more preferably 100Ω/□ or less.

A constituent material of the back surface conductive film can be widely selected from those described in known literatures. For example, a coating having a high dielectric constant, specifically, a coating made of Si, Mo, Cr, CrON, or TaSi, as described in JP2003-501823A, can be applied. In addition, the constituent material of the back surface conductive film may be a Cr compound containing Cr and one or more selected from the group consisting of B, N, O, and C, or a Ta compound containing Ta and one or more selected from the group consisting of B, N, O, and C.

A thickness of the back surface conductive film is preferably 10 nm to 1,000 nm, and more preferably 10 nm to 400 nm.

In addition, the back surface conductive film may provide a function of stress adjustment on the second main surface side of the reflective mask blank. That is, the back surface conductive film can perform adjustment to flatten the reflective mask blank by balancing stresses from various films formed on the first main surface side.

The back surface conductive film can be formed by a known film formation method, for example, a sputtering method such as a magnetron sputtering method or an ion beam sputtering method, a CVD method, a vacuum deposition method, or an electrolytic plating method.

(Other Films)

The reflective mask blank according to the present invention may include other films. Examples of the other films include an etching mask film. The etching mask film is preferably disposed on a side opposite to the protective film of the phase shift film.

The etching mask film preferably exhibits etching resistance to dry etching using an oxygen gas or a mixed gas of an oxygen gas and a halogen gas (chlorine gas or fluorine gas) as an etching gas.

The etching mask film preferably has an etching selectivity to the phase shift film of 1/10 or less when dry etching using the etching gas is performed. The etching selectivity is determined by the following equation.

(Etching selectivity)=(Etching rate of etching mask film)/(Etching rate of phase shift film)

On the other hand, the etching mask film is preferably removable with a cleaning solution containing an acid or a base, which is used as a cleaning solution for a resist. Here, "the etching mask film is removable with a cleaning solution containing an acid or a base" means that a film thickness of the etching mask film when being immersed in a liquid containing an acid or a base at a predetermined temperature for 20 minutes decreases by 5 nm or more, and preferably decreases by 10 nm or more. Specific examples of the cleaning solution used for the above purpose include sulfuric peroxide mixture (SPM), ammonia peroxide mixture, and hydrofluoric acid. The SPM is a solution containing sulfuric acid, hydrogen peroxide, and water, and examples thereof include a solution obtained by mixing concentrated sulfuric acid and 30 mass % hydrogen peroxide water at a volume ratio of 4:1 to 1:3, and preferably 3:1. A temperature of the SPM is preferably 100° C. or higher from the viewpoint of improving the etching rate. The ammonia peroxide mixture is a solution containing ammonium hydroxide, hydrogen peroxide, and water, and examples thereof include a solution obtained by mixing 30 mass % ammonia water, 30 mass % hydrogen peroxide, and water at a volume ratio of 1:1:5 to 3:1:5. A temperature of the ammonia peroxide mixture is preferably 70° C. to 80° C.

The etching mask film preferably contains one or more elements selected from the group consisting of Nb, Ti, Mo, and Si. The etching mask film may further contain one or more elements selected from the group consisting of O, N, and B.

Examples of a material constituting the etching mask film include Nb-based materials such as Nb metal simple substance, niobium oxide, and niobium oxynitride, and Mo-based materials such as Mo metal simple substance, molybdenum oxide, and molybdenum oxynitride. The etching mask film made of an Nb-based material or an Mo-based material can also be etched by dry etching using a chlorine gas. The material constituting the etching mask film may be an Si-based material such as elemental Si, silicon oxide, and silicon nitride. The etching mask film made of an Si-based material can also be etched by dry etching using a fluorine gas. In the case where an Si-based material is used as the etching mask film, it is preferable to use a cleaning solution containing hydrofluoric acid as the cleaning solution for a resist.

A film thickness of the etching mask film is preferably 20 nm or less. In the case where the etching mask film is made of an Nb-based material, the film thickness thereof is preferably 5 nm to 15 nm.

The etching mask film can be formed by a known film formation method, for example, a magnetron sputtering method or an ion beam sputtering method.

In the case where a niobium oxide (for example, $Nb_2O_5$) film is formed by a sputtering method, a reactive sputtering method using an Nb target may be performed in a gas atmosphere in which an inert gas containing at least one of He, Ar, Ne, Kr, and Xe is mixed with oxygen.

In the reflective mask blank 10a described above, the second layer 18 may include a region A2 in which a content of an element having a highest content among the one or more second elements contained in the second layer 18 increases in a thickness direction from a side opposite to the first layer 16a toward the first layer 16a.

In an aspect including the region A2, interfacial peeling at an interface between the first layer 16a and the second layer 18 can be further suppressed.

Examples of a method for forming the region A2 include a method in accordance with a method for forming a region D2 of a reflective mask blank 10e to be described later.

(Modification)

Hereinafter, modifications of the reflective mask blank according to the first embodiment will be described.

In an aspect to be described below, a definition and an aspect of "increase" are the same as those in the region A1.

Figure 2:
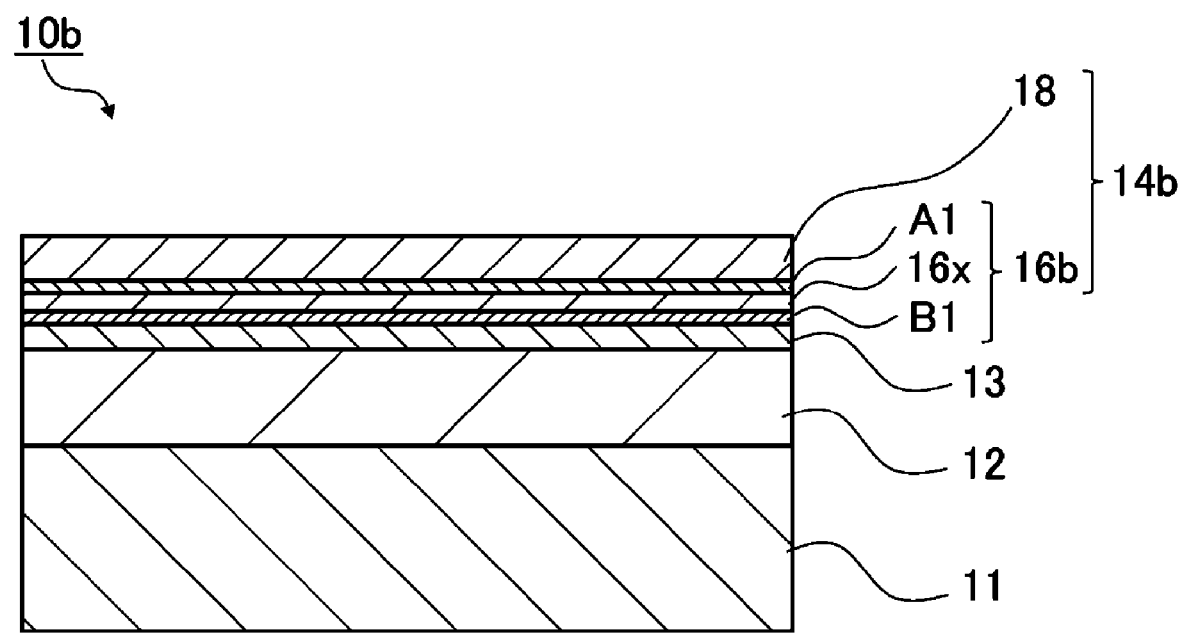
FIG. 2 is a schematic view showing an example of the reflective mask blank according to the first embodiment of the present invention.

FIG. 2 shows a modification of the reflective mask blank according to the first embodiment of the present invention.

A reflective mask blank 10b shown in FIG. 2 includes the substrate 11, the multilayer reflective film 12, the protective film 13, and a phase shift film 14b in this order. The phase shift film 14b includes a first layer 16b containing the one or more first elements and the second layer 18 containing the one or more second elements in this order from the protective film 13. In addition, the first layer 16b includes the region A1 in which a content of an element (first specific element) having a highest content among the one or more first elements increases in a thickness direction from a side opposite to the second layer 18 toward the second layer 18, and the region A1 is present adjacent to the second layer 18. In addition, the first layer 16b includes a region B1 in which a content of an element having a highest content among the one or more first elements increases in a thickness direction from a side opposite to the protective film 13 toward the protective film 13, and the region B1 is present adjacent to the protective film 13. A region of the first layer 16b other than the region A1 and the region B1 is the first layer normal region 16x, and the content of the element having the highest content among the one or more first elements in the first layer normal region 16x is smaller than that in the regions A1 and B1.

In the case of being compared, the reflective mask blank 10a shown in FIG. 1 and the reflective mask blank 10b shown in FIG. 2 have the same configuration except that the first layer 16b of the reflective mask blank 10b shown in FIG. 2 includes the region B1. Therefore, description of the same configuration is omitted, and only the region B1 will be mainly described later.

In the reflective mask blank 10b shown in FIG. 2, interfacial peeling at an interface between the first layer 16b and the protective film 13 can be suppressed due to the presence of the region B1.

The content of the first specific element in a portion of the region B1 closest to the first layer on a vertical cross section is preferably 50 at % to 95 at %, more preferably 50 at % to 85 at %, and still more preferably 50 at % to 75 at %. In addition, the content of the first specific element in a portion of the region B1 closest to the protective film on the vertical cross section is preferably 60 at % to 100 at %, more preferably 70 at % or more and less than 100 at %, and still more preferably 80 at % or more and less than 100 at %.

A difference obtained by subtracting the content of the first specific element in the portion closest to the first layer from the content of the first specific element in the portion closest to the protective film is preferably 5 at % to 50 at %, and more preferably 10 at % to 50 at %.

As described above, in the modification of the first embodiment, the first layer includes the region B1 in which a content of the first specific element increases in a thickness direction from a side opposite to the protective film toward the protective film, and the region B1 is present adjacent to the protective film.

The expression "in the region B1, a content of the first specific element increases in a thickness direction from a side opposite to the protective film toward the protective film" means that the content of the first specific element may continuously increase in the thickness direction from the side opposite to the protective film toward the protective film, or may increase stepwise in the thickness direction from the side opposite to the protective film toward the protective film. In addition, continuous increase and stepwise increase may be combined.

In addition, the expression "in the region B1, a content of the first specific element increases in a thickness direction from a side opposite to the protective film toward the protective film" means that in the region B1, the first specific element may increase as an overall tendency as viewed from the entire first layer. Specific examples in which the first specific element increases as an overall tendency as viewed from the entire first layer include an aspect in which the region B1 includes a region in which the content of the first specific element continuously increases in the thickness direction from the side opposite to the protective film toward the protective film and a region in which the content of the first specific element is substantially constant, and an aspect in which the region B1 includes a region in which the content of the first specific element increases stepwise in the thickness direction from the side opposite to the protective film toward the protective film and a region in which the content of the first specific element is substantially constant.

The content of the element (particularly, the first specific element) contained in the region B1 can be measured by the above-described method.

The region B1 is usually disposed in a part of the first layer in the thickness direction, and a proportion of a thickness of the region B1 to a total thickness of the first layer is preferably 1% to 30%, and more preferably 3% to 15%.

A film thickness of the region B1 is preferably 0.1 nm to 10 nm, and more preferably 0.5 nm to 5 nm.

Examples of a method for forming the region B1 include a method in accordance with the method for forming the region A1. Examples of the method for manufacturing the reflective mask blank according to the modification of the first embodiment include a method of forming the region B1 under the above condition after formation of the protective film and at the start of the formation of the first layer, forming the region A1 under the above condition before completion of the formation of the first layer, and then forming the second layer.

Figure 3:
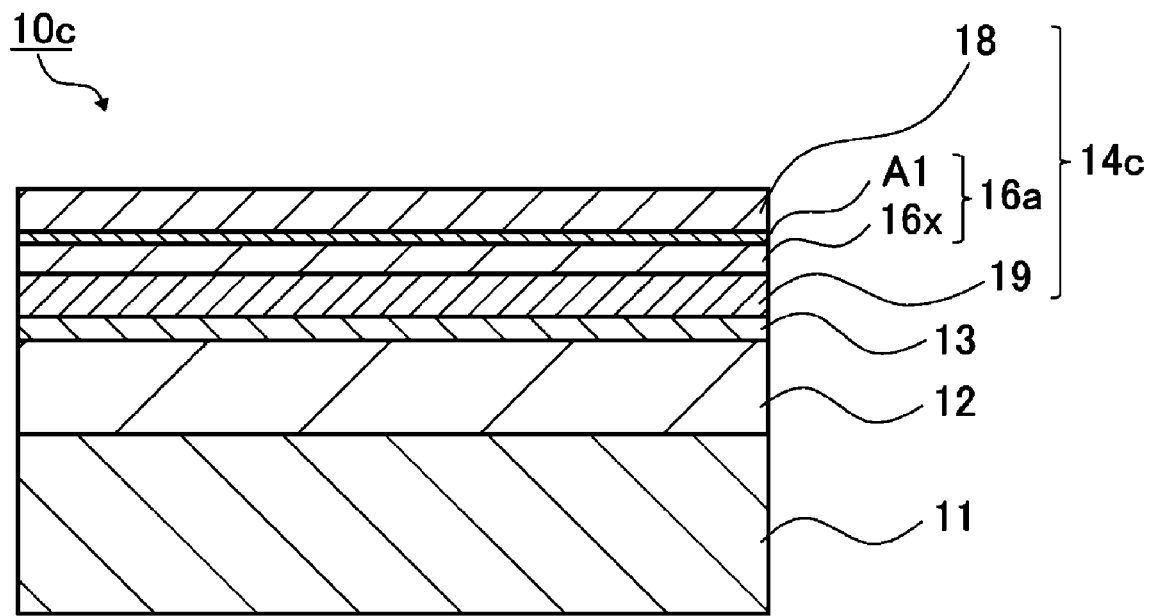
FIG. 3 is a schematic view showing an example of the reflective mask blank according to the first embodiment of the present invention.

FIG. 3 shows a modification of the reflective mask blank according to the first embodiment of the present invention.

A reflective mask blank 10c shown in FIG. 3 includes the substrate 11, the multilayer reflective film 12, the protective film 13, and a phase shift film 14c in this order. The phase shift film 14c includes, from the protective film 13, a third layer 19 containing one or more third elements selected from the group consisting of Ta and Cr, the first layer 16a containing the one or more first elements, and the second layer 18 containing the one or more second elements in this order. In addition, the first layer 16a includes the region A1 in which a content of an element (first specific element) having a highest content among the one or more first elements increases in a thickness direction from a side opposite to the second layer 18 toward the second layer 18, and the region A1 is present adjacent to the second layer 18. A region of the first layer 16a other than the region A1 is a first layer normal region 16x, and the content of the element having the highest content among the one or more first elements in the first layer normal region 16x is smaller than that in the region A1.

In the case of being compared, the reflective mask blank 10a shown in FIG. 1 and the reflective mask blank 10c shown in FIG. 3 have the same configuration except that the reflective mask blank 10c shown in FIG. 3 includes the third layer 19. Therefore, description of the same configuration is omitted, and only the third layer 19 will be mainly described later.

In the reflective mask blank 10c shown in FIG. 3, the third layer 19 may function as an etching stopper when a reflective mask to be described later is prepared.

The third layer includes one or more third elements selected from the group consisting of Ta and Cr. The third layer preferably further contains one or more elements selected from the group consisting of B, C, N, and O.

In the case where the third layer contains Ta as the one or more third elements, the third layer may contain an element other than Ta, and examples of the other element include one or more elements selected from the group consisting of B, C, N, and O. In the case where the third layer contains Ta, examples of a material constituting the third layer include Ta metal simple substance, tantalum boride, tantalum boron nitride, tantalum borate, tantalum carbide, tantalum carbonitride, tantalum oxycarbonitride, tantalum nitride, tantalum oxide, and tantalum oxynitride.

In the case where the third layer contains Cr as the one or more third elements, the third layer may contain an element other than Cr, and examples of the other element include one or more elements selected from the group consisting of B, C, N, and O. In the case where the third layer contains Cr, examples of the material constituting the third layer include Cr metal simple substance, chromium boride, chromium boron nitride, chromium borate, chromium carbide, chromium carbonitride, chromium oxycarbonitride, chromium oxycarbide, chromium nitride, chromium oxide, and chromium oxynitride.

Among them, tantalum boron nitride, tantalum nitride, tantalum oxynitride, chromium nitride, chromium oxide, chromium oxycarbonitride, and chromium oxynitride are preferable as the material constituting the third layer.

In the case where the first layer contains the one or more first elements and Ta or Cr, a layer containing the one or more first elements is defined as the first layer and is not defined as the third layer.

A film thickness of the third layer is preferably 2 nm to 45 nm, and more preferably 10 nm to 30 nm.

The film thickness of the third layer is determined by the XRR method.

The third layer can be formed by the same method as the second layer described above.

Figure 4:
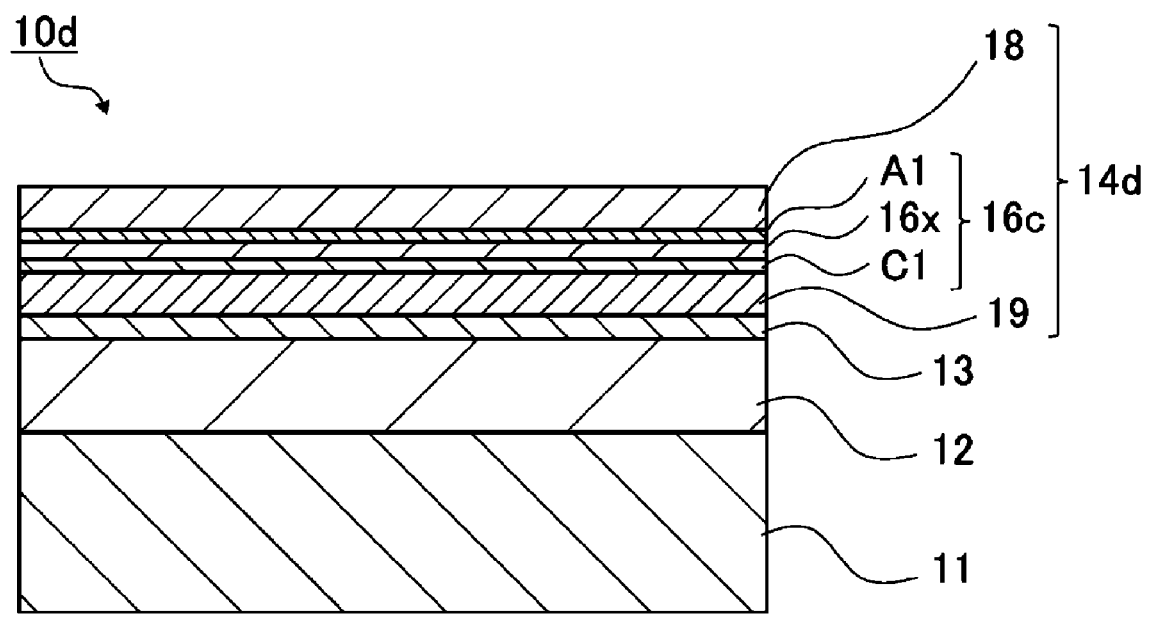
FIG. 4 is a schematic view showing an example of the reflective mask blank according to the first embodiment of the present invention.

FIG. 4 shows a modification of the reflective mask blank according to the first embodiment of the present invention.

A reflective mask blank 10d shown in FIG. 4 includes the substrate 11, the multilayer reflective film 12, the protective film 13, and a phase shift film 14d in this order. The phase shift film 14d includes, from the protective film 13, the third layer 19 containing the one or more third elements, a first layer 16c containing the one or more first elements, and the second layer 18 containing the one or more second elements in this order. In addition, the first layer 16c includes the region A1 in which a content of an element (first specific element) having a highest content among the one or more first elements increases in a thickness direction from a side opposite to the second layer 18 toward the second layer 18, and the region A1 is present adjacent to the second layer 18. In addition, the first layer 16c includes a region C1 in which the content of the element having the highest content among the one or more first elements increases in a thickness direction from a side opposite to the third layer 19 toward the third layer 19, and the region C1 is present adjacent to the third layer 19. A region of the first layer 16c other than the region A1 and the region C1 is the first layer normal region 16x, and the content of the element having the highest content among the one or more first elements in the first layer normal region 16x is smaller than that in the region A1 and the region C1.

In the case of being compared, the reflective mask blank 10c shown in FIG. 3 and the reflective mask blank 10d shown in FIG. 4 have the same configuration except that the first layer 16c of the reflective mask blank 10d shown in FIG. 4 includes the region C1. Therefore, description of the same configuration is omitted, and only the region C1 will be mainly described later.

In the reflective mask blank 10d shown in FIG. 4, interfacial peeling at an interface between the first layer 16c and the third layer 19 can be suppressed due to the presence of the region C1.

The content of the first specific element in a portion of the region C1 closest to the first layer on a vertical cross section is preferably 50 at % to 95 at %, more preferably 50 at % to 85 at %, and still more preferably 50 at % to 75 at %. In addition, the content of the first specific element in a portion of the region C1 closest to the third layer on the vertical cross section is preferably 60 at % to 100 at %, more preferably 70 at % or more and less than 100 at %, and still more preferably 80 at % or more and less than 100 at %.

A difference obtained by subtracting the content of the first specific element in the portion closest to the first layer from the content of the first specific element in the portion closest to the third layer is preferably 5 at % to 50 at %, and more preferably 10 at % to 50 at %.

As described above, in the modification of the first embodiment, the first layer includes the region C1 in which a content of the first specific element increases in a thickness direction from a side opposite to the third layer toward the third layer, and the region C1 is present adjacent to the third layer.

The expression "in the region C1, a content of the first specific element increases in a thickness direction from a side opposite to the third layer toward the third layer" means that the content of the first specific element may continuously increase in the thickness direction from the side opposite to the third layer toward the third layer, or may increase stepwise in the thickness direction from the side opposite to the third layer toward the third layer. In addition, continuous increase and stepwise increase may be combined.

In addition, the expression "in the region C1, a content of the first specific element increases in a thickness direction from a side opposite to the third layer toward the third layer" means that the first specific element may increase as an overall tendency as viewed from the entire first layer. Specific examples in which the first specific element increases as an overall tendency as viewed from the entire first layer include an aspect in which the region C1 includes a region in which the content of the first specific element continuously increases in the thickness direction from the side opposite to the third layer toward the third layer and a region in which the content of the first specific element is substantially constant, and an aspect in which the region C1 includes a region in which the content of the first specific element increases stepwise in the thickness direction from the side opposite to the third layer toward the third layer and a region in which the content of the first specific element is substantially constant.

The content of the element (particularly, the first specific element) contained in the region C1 can be measured by the above-described method.

The region C1 is usually disposed in a part of the first layer in the thickness direction, and a proportion of a thickness of the region C1 to a total thickness of the first layer is preferably 1% to 30%, and more preferably 3% to 15%.

A film thickness of the region C1 is preferably 0.1 nm to 10 nm, and more preferably 0.5 nm to 5 nm.

Examples of a method for forming the region C1 include a method in accordance with the method for forming the region A1. Examples of the method for manufacturing the reflective mask blank according to the modification of the first embodiment include a method of forming the third layer after formation of the protective film, forming the region C1 under the above condition at the start of formation of the first layer, forming the region A1 under the above condition before completion of the formation of the first layer, and then forming the second layer.

Figure 5:
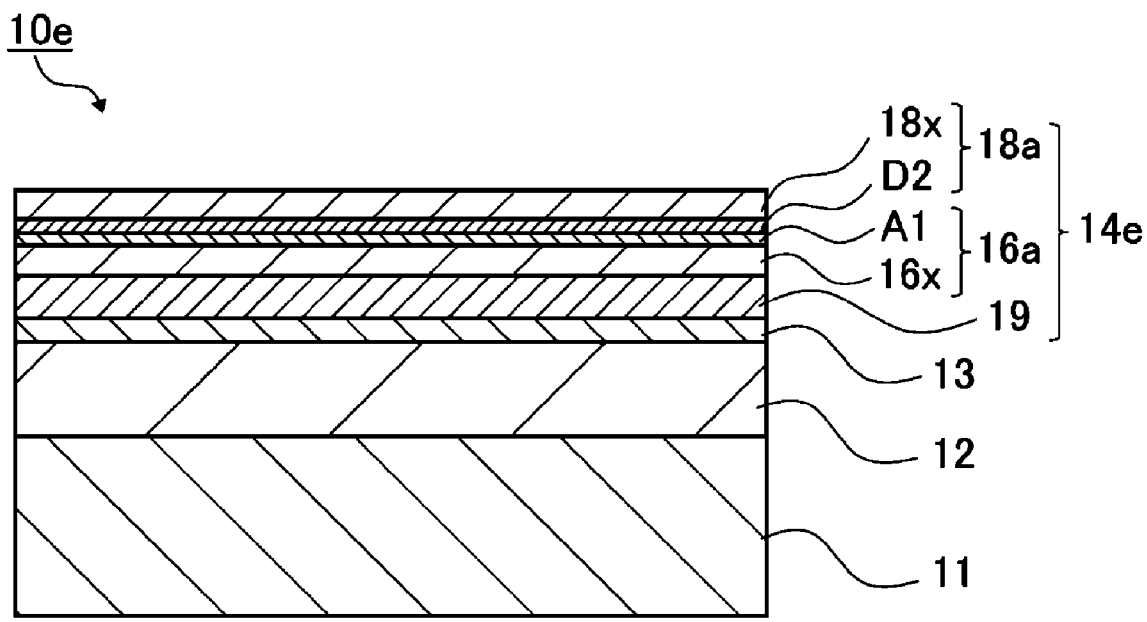
FIG. 5 is a schematic diagram showing an example of the reflective mask blank according to the first embodiment of the present invention.

FIG. 5 shows a modification of the reflective mask blank according to the first embodiment of the present invention.

The reflective mask blank 10e shown in FIG. 5 includes the substrate 11, the multilayer reflective film 12, the protective film 13, and a phase shift film 14e in this order. The phase shift film 14e includes, from the protective film 13, the third layer 19 containing the one or more third elements, the first layer 16a containing the one or more first elements, and a second layer 18a containing the one or more second elements in this order. In addition, the first layer 16a includes the region A1 in which a content of an element (first specific element) having a highest content among the one or more first elements increases in a thickness direction from a side opposite to the second layer 18a toward the second layer 18a, and the region A1 is present adjacent to the second layer 18a. In addition, the second layer 18a includes the region D2 in which a content of an element having a highest content among the one or more second elements (hereinafter, also simply referred to as a "second specific element") increases in a thickness direction from a side opposite to the first layer 16a toward the first layer 16a, and the region D2 is present adjacent to the first layer 16a. A region of the first layer 16a other than the region A1 is a first layer normal region 16x, and the content of the element having the highest content among the one or more first elements in the first layer normal region 16x is smaller than that in the region A1. In addition, a region of the second layer 18a other than the region D2 is a second layer normal region 18x, and the content of the element having the highest content among the one or more second elements in the second layer normal region 18x is smaller than that in the region D2.

In the case of being compared, the reflective mask blank 10c shown in FIG. 3 and the reflective mask blank 10e shown in FIG. 5 have the same configuration except that the second layer 18a of the reflective mask blank 10e shown in FIG. 5 includes the region D2. Therefore, description of the same configuration is omitted, and only the region D2 will be mainly described later.

In the reflective mask blank 10e shown in FIG. 5, interfacial peeling at an interface between the first layer 16a and the second layer 18a can be suppressed due to the presence of the region D2.

As described above, in the modification of the first embodiment, the second layer includes the region D2 in which a content of the second specific element increases in a thickness direction from a side opposite to the first layer toward the first layer, and the region D2 is present adjacent to the first layer.

The second specific element is an element having the highest content (atomic %) among the one or more second elements contained in the second layer. The second specific element is determined by determining the elements contained in the second layer and contents thereof by the measurement method described above.

The expression "in the region D2, a content of the second specific element increases in a thickness direction from a side opposite to the first layer toward the first layer" means that the content of the second specific element may continuously increase in the thickness direction from the side opposite to the first layer toward the first layer, or may increase stepwise in the thickness direction from the side opposite to the first layer toward the first layer. In addition, continuous increase and stepwise increase may be combined.

In addition, the expression "in the region D2, a content of the second specific element increases in a thickness direction from a side opposite to the first layer toward the first layer" means that the second specific element may increase as an overall tendency as viewed from the entire second layer. Specific examples in which the second specific element increases as an overall tendency as viewed from the entire second layer include an aspect in which the region D2 includes a region in which the content of the second specific element continuously increases in the thickness direction from the side opposite to the first layer toward the first layer and a region in which the content of the second specific element is substantially constant, and an aspect in which the region D2 includes a region in which the content of the second specific element increases stepwise in the thickness direction from the side opposite to the first layer toward the first layer and a region in which the content of the second specific element is substantially constant.

The content of the element (particularly, the second specific element) contained in the region D2 can be measured by the above-described method.

The region D2 is usually disposed in a part of the second layer in the thickness direction, and a proportion of a thickness of the region D2 to a total thickness of the second layer is preferably 1% to 50%, and more preferably 3% to 30%.

A film thickness of the region D2 is preferably 0.1 nm to 10 nm, and more preferably 0.5 nm to 5 nm.

Examples of a method for forming the region D2 include a method in accordance with the method for forming the region A1. Specifically, as a method for forming the region D2, film formation may be performed under a condition that the element having the highest content among the one or more second elements contained in the second layer increases. Examples of the film formation method include the above-described film formation method.

Examples of the condition include a condition that in the case where the second layer is formed by sputtering by supplying a gas containing a nitrogen gas and an oxygen gas, a supply amount of at least one of the nitrogen gas and the oxygen gas is smaller than that at the time of forming the second layer normal region. In addition, examples of the above-described condition include a condition that in the case of using an alloy target as a sputtering target for forming the second layer, an alloy target in which a content of an element having the highest content is higher than that at the time of forming the second layer normal region is used.

In the case where the film formation is performed under the above-described condition, when formation is performed, under a condition for forming the second layer normal region, on the layer formed under the above condition, mixing occurs at an interface of the layer, and the region D2 in which the second specific element continuously increases may be formed. A degree of mixing at the interface can be controlled by adjusting a kinetic energy of particles containing atoms for forming the second layer, which are supplied to a non-film-formation material. The kinetic energy of the particles can be adjusted by adjusting the film formation condition. In addition, the degree of mixing at the interface can also be adjusted by the film formation condition such as the temperature during film formation.

Examples of the method for manufacturing the reflective mask blank according to the modification of the first embodiment include a method of forming the third layer after formation of the protective film, forming the region A1 under the above condition during formation of the first layer and before completion of the formation of the first layer, then forming the region D2 under the above condition at the start of formation of the second layer, and then forming the second layer.

The content of the second specific element in a portion of the region D2 closest to the second layer on a vertical cross section is preferably 20 at % to 80 at %, more preferably 20 at % to 60 at %, and still more preferably 20 at % to 40 at %. In addition, the content of the second specific element in a portion of the region D2 closest to the first layer 16a on the vertical cross section is preferably 60 at % to 100 at %, more preferably 70 at % or more and less than 100 at %, and still more preferably 80 at % or more and less than 100 at %.

A difference obtained by subtracting the content of the second specific element in the portion closest to the second layer from the content of the second specific element in the portion closest to the first layer 16a is preferably 10 at % to 80 at %, and more preferably 20 at % to 70 at %.

Figure 6:
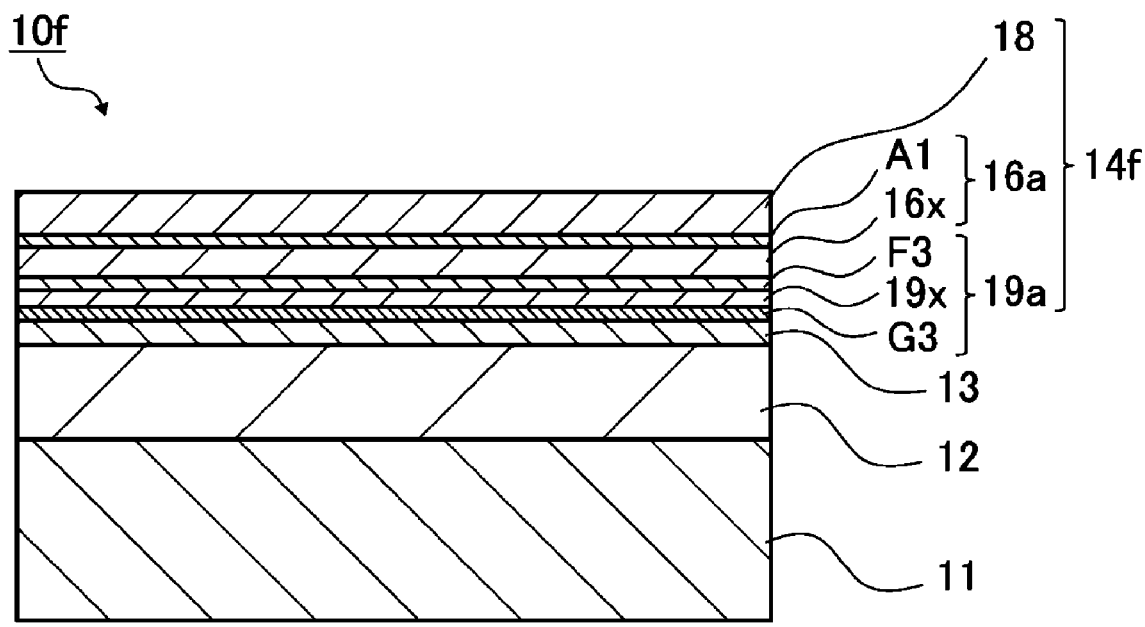
FIG. 6 is a schematic diagram showing an example of the reflective mask blank according to the first embodiment of the present invention.

FIG. 6 shows a modification of the reflective mask blank according to the first embodiment of the present invention.

A reflective mask blank 10f shown in FIG. 6 includes the substrate 11, the multilayer reflective film 12, the protective film 13, and a phase shift film 14f in this order. The phase shift film 14f includes, from the protective film 13, a third layer 19a containing the one or more third elements, the first layer 16a containing the one or more first elements, and the second layer 18 containing the one or more second elements in this order. In addition, the first layer 16a includes the region A1 in which a content of an element (first specific element) having a highest content among the one or more first elements increases in a thickness direction from a side opposite to the second layer 18 toward the second layer 18, and the region A1 is present adjacent to the second layer 18. In addition, the third layer 19a includes a region F3 in which a content of an element having a highest content among the one or more third elements (hereinafter, also simply referred to as a "third specific element") increases in a thickness direction from a side opposite to the first layer 16a toward the first layer 16a, and the region F3 is present adjacent to the first layer 16a. In addition, the third layer 19a includes a region G3 in which the content of the element having the highest content among the one or more third elements increases in a thickness direction from a side opposite to the protective film 13 toward the protective film 13, and the region G3 is present adjacent to the protective film 13. A region of the third layer 19a other than the region F3 and the region G3 is a third layer normal region 19x, and the content of the element having the highest content among the one or more third elements in the third layer normal region 19x is smaller than that in the region F3 and the region G3.

In the case of being compared, the reflective mask blank 10c shown in FIG. 3 and the reflective mask blank 10f shown in FIG. 6 have the same configuration except that the third layer 19a of the reflective mask blank 10f shown in FIG. 6 includes the region F3 and the region G3. Therefore, description of the same configuration is omitted, and only the region F3 and the region G3 will be mainly described later.

In the reflective mask blank 10f shown in FIG. 6, interfacial peeling at an interface between the first layer 16a and the third layer 19a and interfacial peeling at an interface between the third layer 19a and the protective film 13 can be suppressed due to the presence of the region F3 and the region G3.

As described above, in the modification of the first embodiment, the third layer includes the region F3 in which a content of the third specific element increases in a thickness direction from a side opposite to the first layer toward the first layer, and the region F3 is present adjacent to the first layer.

The third specific element is an element having the highest content (atomic %) among the one or more third elements contained in the third layer. The third specific element is determined by determining the elements contained in the third layer and contents thereof by the measurement method described above.

The expression "in the region F3, a content of the third specific element increases in a thickness direction from a side opposite to the first layer toward the first layer" means that the content of the third specific element may continuously increase in the thickness direction from the side opposite to the first layer toward the first layer, or may increase stepwise in the thickness direction from the side opposite to the first layer toward the first layer. In addition, continuous increase and stepwise increase may be combined.

In addition, the expression "in the region F3, a content of the third specific element increases in a thickness direction from a side opposite to the first layer toward the first layer" means that the third specific element may increase as an overall tendency as viewed from the entire third layer. Specific examples in which the third specific element increases as an overall tendency as viewed from the entire third layer include an aspect in which the region F3 includes a region in which the content of the third specific element continuously increases in the thickness direction from the side opposite to the first layer toward the first layer and a region in which the content of the third specific element is substantially constant, and an aspect in which the region F3 includes a region in which the content of the third specific element increases stepwise in the thickness direction from the side opposite to the first layer toward the first layer and a region in which the content of the third specific element is substantially constant.

The content of the element (particularly, the third specific element) contained in the region F3 can be measured by the above-described method.

The region F3 is usually disposed in a part of the third layer in the thickness direction, and a proportion of a thickness of the region F3 to a total thickness of the third layer is preferably 1% to 50%, and more preferably 3% to 30%.

A film thickness of the region F3 is preferably 0.1 nm to 10 nm, and more preferably 0.5 nm to 10 nm.

Examples of a method for forming the region F3 include a method in accordance with the method for forming the region A1. Specifically, as a method for forming the region F3, film formation may be performed under a condition that the element having the highest content among the one or more third elements contained in the third layer increases. Examples of the film formation method include the above-described film formation method.

Examples of the condition include a condition that in the case where the third layer is formed by sputtering by supplying a gas containing a nitrogen gas and an oxygen gas, a supply amount of at least one of the nitrogen gas and the oxygen gas is smaller than that at the time of forming the third layer normal region. In addition, examples of the above-described condition include a condition that in the case of using an alloy target as a sputtering target for forming the third layer, an alloy target in which a content of an element having the highest content is higher than that at the time of forming the third layer normal region is used.

In the case where the film formation is performed under the above-described condition, when film formation is performed, under a condition for forming the third layer normal region, on the layer formed under the above-described condition, mixing occurs at an interface of the layer, and the region F3 in which the third specific element continuously increases may be formed. A degree of mixing at the interface can be controlled by adjusting a kinetic energy of particles containing atoms for forming the third layer, which are supplied to a non-film-formation material. The kinetic energy of the particles can be adjusted by adjusting the film formation condition. In addition, the degree of mixing at the interface can also be adjusted by the film formation condition such as the temperature during film formation.

The content of the third specific element in a portion of the region F3 closest to the third layer on a vertical cross section is preferably 20 at % to 80 at %, more preferably 20 at % to 60 at %, and still more preferably 20 at % to 40 at %. In addition, the content of the third specific element in a portion of the region F3 closest to the first layer on the vertical cross section is preferably 60 at % to 100 at %, more preferably 70 at % or more and less than 100 at %, and still more preferably 80 at % or more and less than 100 at %.

A difference obtained by subtracting the content of the third specific element in the portion closest to the third layer from the content of the third specific element in the portion closest to the first layer is preferably 10 at % to 80 at %, and more preferably 20 at % to 70 at %.

As described above, in the modification of the first embodiment, the third layer includes the region G3 in which a content of the third specific element increases in a thickness direction from a side opposite to the protective film toward the protective film, and the region G3 is present adjacent to the protective film.

The expression "in the region G3, a content of the third specific element increases in a thickness direction from a side opposite to the protective film toward the protective film" means that the content of the third specific element may continuously increase in the thickness direction from the side opposite to the protective film toward the protective film, or may increase stepwise in the thickness direction from the side opposite to the protective film toward the protective film. In addition, continuous increase and stepwise increase may be combined.

In addition, the expression "in the region G3, a content of the third specific element increases in a thickness direction from a side opposite to the protective film toward the protective film" means that the third specific element may increase as an overall tendency as viewed from the entire third layer. Specific examples in which the third specific element increases as an overall tendency as viewed from the entire third layer include an aspect in which the region G3 includes a region in which the content of the third specific element continuously increases in the thickness direction from the side opposite to the protective film toward the protective film and a region in which the content of the third specific element is substantially constant, and an aspect in which the region G3 includes a region in which the content of the third specific element increases stepwise in the thickness direction from the side opposite to the protective film toward the protective film and a region in which the content of the third specific element is substantially constant.

The content of the element (particularly, the third specific element) contained in the region G3 can be measured by the above-described method.

The region G3 is usually disposed in a part of the third layer in the thickness direction, and a proportion of a thickness of the region G3 to a total thickness of the third layer is preferably 1% to 50%, and more preferably 3% to 30%.

A film thickness of the region G3 is preferably 0.1 nm to 10 nm, and more preferably 0.5 nm to 10 nm.

Examples of a method for forming the region G3 include a method in accordance with the method for forming the region F3.

Examples of the method for manufacturing the reflective mask blank according to the modification of the first embodiment include a method of forming the region G3 under the above condition after formation of the protective film and at the start of formation of the third layer, forming the region F3 under the above condition during formation of the third layer and at completion of the formation of the third layer, then forming the region A1 under the above condition at the start of formation of the first layer, during the formation of the first layer, and before completion of the formation of the first layer, and then forming the second layer.

The content of the third specific element in a portion of the region G3 closest to the third layer on a vertical cross section is preferably 20 at % to 80 at %, more preferably 20 at % to 60 at %, and still more preferably 20 at % to 40 at %. In addition, the content of the third specific element in a portion of the region F3 closest to the protective film on the vertical cross section is preferably 60 at % to 100 at %, more preferably 70 at % or more and less than 100 at %, and still more preferably 80 at % or more and less than 100 at %.

A difference obtained by subtracting the content of the third specific element in the portion closest to the third layer from the content of the third specific element in the portion closest to the protective film is preferably 10 at % to 80 at %, and more preferably 20 at % to 70 at %.

FIG. 6 shows an aspect in which the third layer includes two regions of the region F3 and the region G3, but an aspect in which only one of the regions is included may be adopted.

Reflective Mask Blank (Second Embodiment)

A reflective mask blank according to the second embodiment of the present invention includes, a substrate, a multilayer reflective film that reflects EUV light, a protective film, and a phase shift film that shifts a phase of EUV light, in this order, in which the phase shift film includes a first layer containing one or more first elements selected from the group consisting of Ru, Re, Ir, Ag, Os, Au, Pd, and Pt, and a second layer containing one or more second elements selected from the group consisting of Ta and Cr, the first layer includes a region A1 in which a content of an element having a highest content among the one or more first elements increases in a thickness direction from a side opposite to the second layer toward the second layer, and the region A1 is present adjacent to the second layer.

Regarding the first layer, in other words, the first layer includes the region A1 present adjacent to the second layer, and in the region A1, the content of the element having the highest content among the one or more first elements increases in the thickness direction from the side opposite to the second layer toward the second layer.

The reflective mask blank according to the second embodiment will be described with reference to FIG. 7. A reflective mask blank 10g shown in FIG. 7 includes the substrate 11, the multilayer reflective film 12, the protective film 13, and a phase shift film 14g in this order. The phase shift film 14g includes the second layer 18 containing the one or more second elements and the first layer 16a containing the one or more first elements in this order from the protective film 13. In addition, the first layer 16a includes the region A1 in which the content of the element having the highest content among the one or more first elements increases in a thickness direction from a side opposite to the second layer 18 toward the second layer 18, and the region A1 is present adjacent to the second layer 18. A region of the first layer 16a other than the region A1 is a first layer normal region 16x, and the content of the element having the highest content among the one or more first elements in the first layer normal region 16x is smaller than that in the region A1.

In the reflective mask blank according to the second embodiment of the present invention, occurrence of interfacial peeling is suppressed even when a heat treatment is performed.

A mechanism of suppressing the occurrence of interfacial peeling by the heat treatment is considered to be the same as the mechanism in the first embodiment.

The reflective mask blank according to the first embodiment of the present invention and the mask blank according to the second embodiment of the present invention have the same configuration except that positions of the first layer and the second layer in the phase shift film are reversed.

That is, the substrate, the multilayer reflective film, the protective film, and the phase shift film included in the reflective mask blank according to the second embodiment, and the back surface conductive film and other films that may be included in the reflective mask blank according to the second embodiment are the same as those in the first embodiment, and thus description thereof is omitted.

Examples of a method for manufacturing the reflective mask blank according to the second embodiment include a method of forming the region A1 under the above condition in the first embodiment after formation of the protective film and the second layer and at the start of formation of the first layer, and then forming the first layer.

In the reflective mask blank 10g described above, the second layer 18 may include the region A2 in which a content of an element having a highest content among the one or more second elements contained in the second layer 18 increases in a thickness direction from a side opposite to the first layer 16a toward the first layer 16a.

In an aspect including the region A2, interfacial peeling at an interface between the first layer 16a and the second layer 18 can be further suppressed.

(Modification)

Hereinafter, modifications of the reflective mask blank according to the second embodiment will be described.

In an aspect to be described below, a definition and an aspect of "increase" are the same as those in the region A1 and the like.

Figure 8:
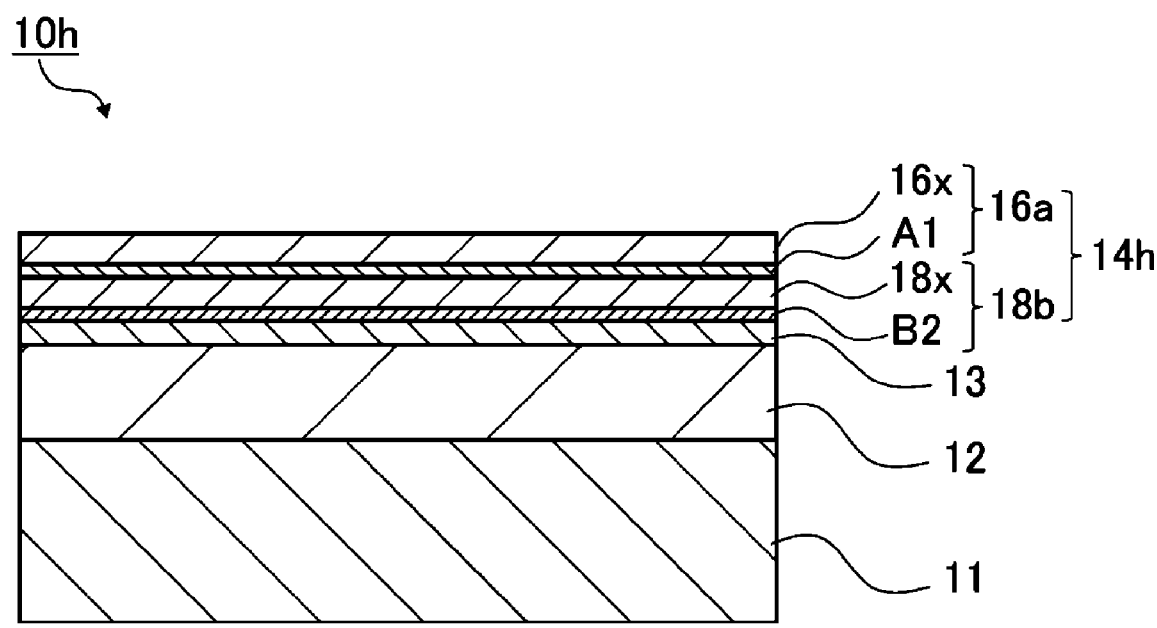
FIG. 8 is a schematic diagram showing an example of the reflective mask blank according to the second embodiment of the present invention.

FIG. 8 shows a modification of the reflective mask blank according to the second embodiment of the present invention.

A reflective mask blank 10h shown in FIG. 8 includes the substrate 11, the multilayer reflective film 12, the protective film 13, and a phase shift film 14h in this order. The phase shift film 14h includes a second layer 18b containing the one or more second elements and the first layer 16a containing the one or more first elements in this order from the protective film 13. In addition, the first layer 16a includes the region A1 in which a content of an element (first specific element) having a highest content among the one or more first elements increases in a thickness direction from a side opposite to the second layer 18b toward the second layer 18b, and the region A1 is present adjacent to the second layer 18b. In addition, the second layer 18b includes a region B2 in which a content of an element (second specific element) having a highest content among the one or more second elements increases in a thickness direction from a side opposite to the protective film 13 toward the protective film 13, and the region B2 is present adjacent to the protective film 13. A region of the first layer 16a other than the region A1 is a first layer normal region 16x, and the content of the element having the highest content among the one or more first elements in the first layer normal region 16x is smaller than that in the region A1. A region of the second layer 18b other than the region B2 is the second layer normal region 18x, and the content of the element having the highest content among the one or more second elements in the second layer normal region 18x is smaller than that in the region B2.

Figure 7:
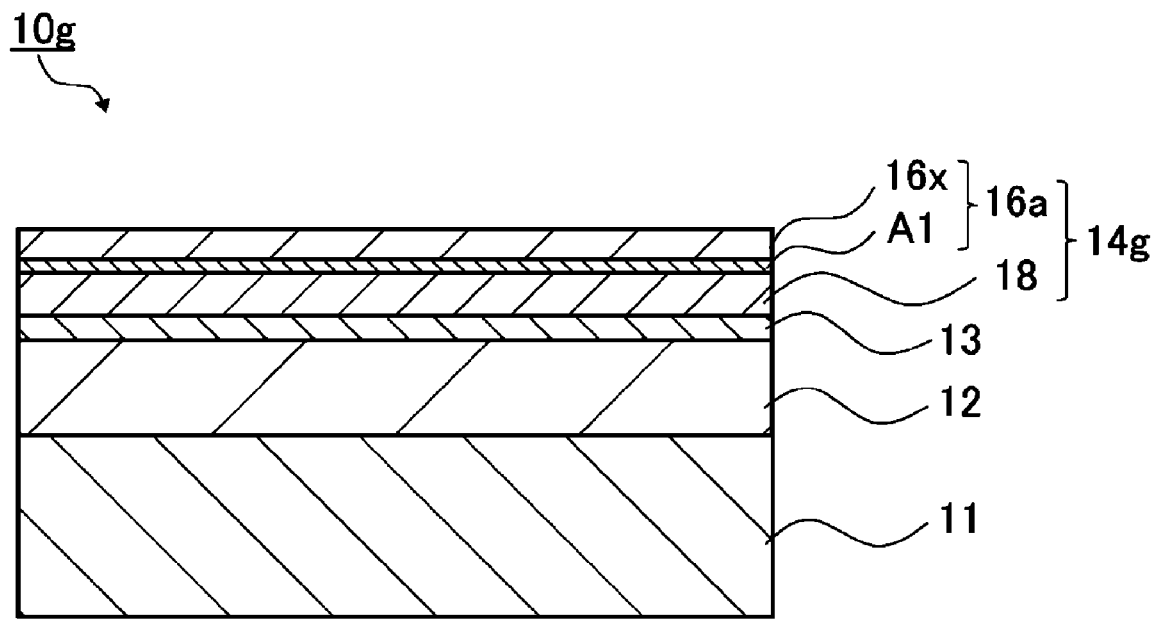
FIG. 7 is a schematic view showing an example of a reflective mask blank according to a second embodiment of the present invention.

In the case of being compared, the reflective mask blank 10g shown in FIG. 7 and the reflective mask blank 10h shown in FIG. 8 have the same configuration except that the second layer 18b of the reflective mask blank 10g shown in FIG. 7 includes the region B2. Therefore, description of the same configuration is omitted, and only the region B2 will be mainly described later.

In the reflective mask blank 10h shown in FIG. 8, interfacial peeling at an interface between the second layer 18b and the protective film 13 can be suppressed due to the presence of the region B2.

As described above, in the modification of the second embodiment, the second layer includes the region B2 in which a content of the second specific element increases in a thickness direction from a side opposite to the protective film toward the protective film, and the region B2 is present adjacent to the protective film.

The expression "in the region B2, a content of the second specific element increases in a thickness direction from a side opposite to the protective film toward the protective film" means that the content of the second specific element may continuously increase in the thickness direction from the side opposite to the protective film toward the protective film, or may increase stepwise in the thickness direction from the side opposite to the protective film toward the protective film. In addition, continuous increase and stepwise increase may be combined.

In addition, the expression "in the region B2, a content of the second specific element increases in a thickness direction from a side opposite to the protective film toward the protective film" means that the second specific element may increase as an overall tendency as viewed from the entire second layer. Specific examples in which the second specific element increases as an overall tendency as viewed from the entire second layer include an aspect in which the region B2 includes a region in which the content of the second specific element continuously increases in the thickness direction from the side opposite to the protective film toward the protective film and a region in which the content of the second specific element is substantially constant, and an aspect in which the region B2 includes a region in which the content of the second specific element increases stepwise in the thickness direction from the side opposite to the protective film toward the protective film and a region in which the content of the second specific element is substantially constant.

The content of the element (particularly, the second specific element) contained in the region B2 can be measured by the above-described method.

The region B2 is usually disposed in a part of the second layer in the thickness direction, and a proportion of a thickness of the region B2 to a total thickness of the second layer is preferably 1% to 50%, and more preferably 3% to 30%.

A film thickness of the region B2 is preferably 0.1 nm to 10 nm, and more preferably 0.5 nm to 10 nm.

The content of the second specific element in the portion of the region B2 closest to the second layer on a vertical cross section is preferably 20 at % to 80 at %, more preferably 20 at % to 60 at %, still more preferably 20 at % to 40 at %. In addition, the content of the second specific element in a portion of the region B2 closest to the protective film on the vertical cross section is preferably 60 at % to 100 at %, more preferably 70 at % or more and less than 100 at %, and still more preferably 80 at % or more and less than 100 at %.

A difference obtained by subtracting the content of the second specific element in the portion closest to the second layer from the content of the second specific element in the portion closest to the protective film is preferably 10 at % to 80 at %, and more preferably 20 at % to 70 at %.

Examples of a method for forming the region B2 include a method in accordance with the method for forming the region D2. Examples of a method for manufacturing the reflective mask blank according to the modification of the second embodiment include a method of forming the region B2 under the above condition after formation of the protective film and at the start of formation of the second layer, forming the second layer, then forming the region A1 under the above condition at the start of formation of the first layer, and then forming the first layer.

Figure 9:
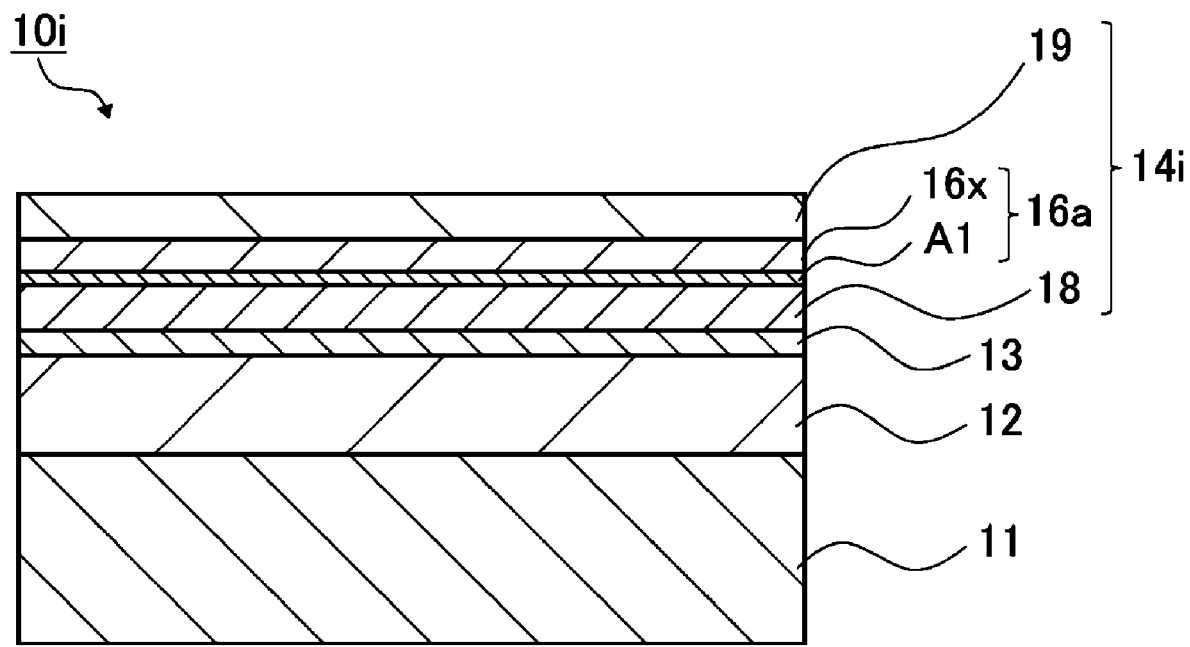
FIG. 9 is a schematic view showing an example of the reflective mask blank according to the second embodiment of the present invention.

FIG. 9 shows a modification of the reflective mask blank according to the second embodiment of the present invention.

A reflective mask blank 10$i$ shown in FIG. 9 includes the substrate 11, the multilayer reflective film 12, the protective film 13, and a phase shift film 14$i$ in this order. The phase shift film 14$i$ includes, from the protective film 13, the second layer 18, the first layer 16$a$, and the third layer 19 containing one or more third elements selected from the group consisting of Ta and Cr in this order. In addition, the first layer 16$a$ includes the region A1 in which a content of an element (first specific element) having a highest content among the one or more first elements increases in a thickness direction from a side opposite to the second layer 18 toward the second layer 18, and the region A1 is present adjacent to the second layer 18. A region of the first layer 16$a$ other than the region A1 is a first layer normal region 16$x$, and the content of the element having the highest content among the one or more first elements in the first layer normal region 16$x$ is smaller than that in the region A1.

In the case of being compared, the reflective mask blank 10$c$ shown in FIG. 3 and the reflective mask blank 10$i$ shown in FIG. 9 have the same configuration except that in the reflective mask blank 10$i$ shown in FIG. 9, a lamination order of the layers in the phase shift film 14$i$ is reversed. Therefore, description of the same configuration is omitted.

In the reflective mask blank 10$i$ shown in FIG. 9, the third layer 19 may function as an anti-reflection film for deep-UV.

A film thickness of the third layer is preferably 2 nm to 45 nm, and more preferably 10 nm to 30 nm.

The film thickness of the third layer is determined by the XRR method.

The third layer can be formed by the same method as the second layer described above.

Figure 10:
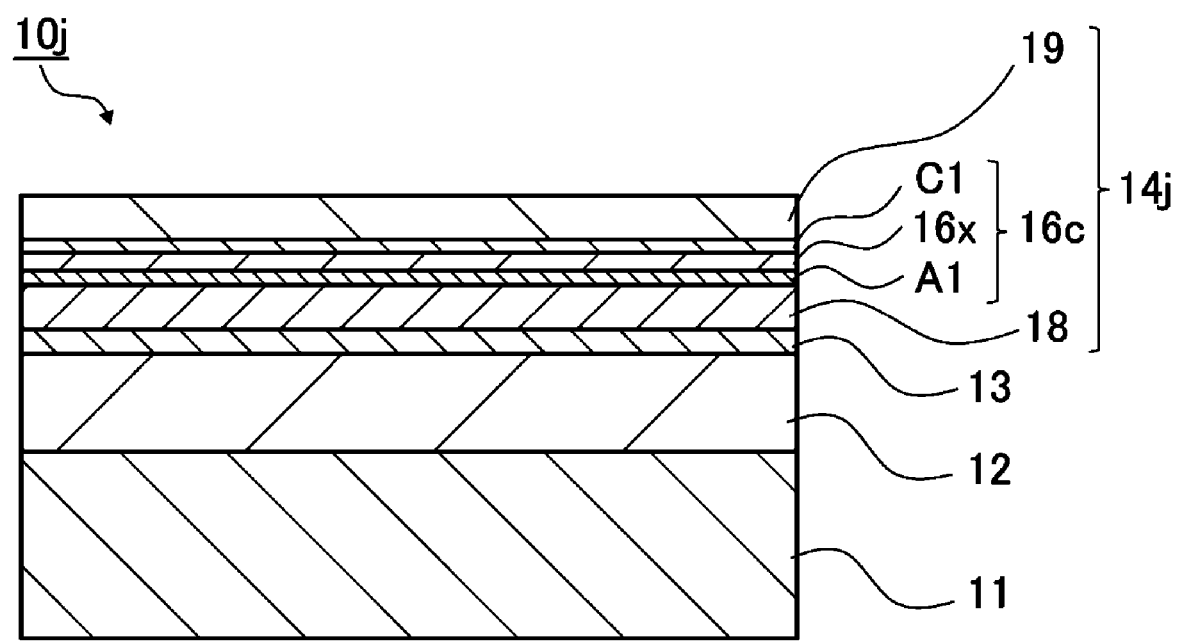
FIG. 10 is a schematic view showing an example of the reflective mask blank according to the second embodiment of the present invention.

FIG. 10 shows a modification of the reflective mask blank according to the second embodiment of the present invention.

A reflective mask blank 10$j$ shown in FIG. 10 includes the substrate 11, the multilayer reflective film 12, the protective film 13, and a phase shift film 14$j$ in this order. The phase shift film 14$j$ includes, from the protective film 13, the second layer 18 containing the one or more second elements, the first layer 16$c$ containing the one or more first elements, and the third layer 19 containing the one or more third elements in this order. In addition, the first layer 16$c$ includes the region A1 in which a content of an element (first specific element) having a highest content among the one or more first elements increases in a thickness direction from a side opposite to the second layer 18 toward the second layer 18, and the region A1 is present adjacent to the second layer 18. In addition, the first layer 16$c$ includes a region C1 in which the content of the element having the highest content among the one or more first elements increases in a thickness direction from a side opposite to the third layer 19 toward the third layer 19, and the region C1 is present adjacent to the third layer 19. A region of the first layer 16$c$ other than the region A1 and the region C1 is the first layer normal region 16$x$, and the content of the element having the highest content among the one or more first elements in the first layer normal region 16$x$ is smaller than that in the region A1 and the region C1.

In the case of being compared, the reflective mask blank 10$d$ shown in FIG. 4 and the reflective mask blank 10$j$ shown in FIG. 10 have the same configuration except that in the reflective mask blank 10$j$ shown in FIG. 10, a lamination order of the layers in the phase shift film 14$j$ is reversed. Therefore, description of the same configuration is omitted.

In the reflective mask blank 10$j$ shown in FIG. 10, interfacial peeling at an interface between the first layer 16$c$ and the third layer 19 can be suppressed due to the presence of the region C1.

A preferable aspect of the third layer 19 is the same as the aspect of the third layer 19 of the reflective mask blank 10$i$ shown in FIG. 9, and thus description thereof is omitted.

Figure 11:
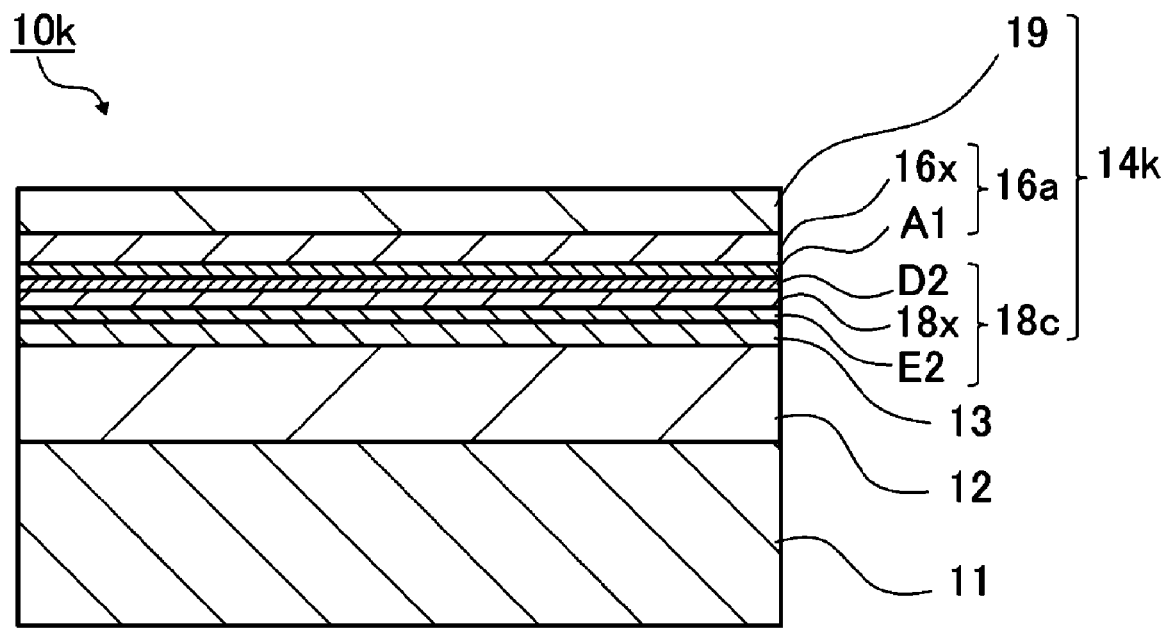
FIG. 11 is a schematic diagram showing an example of the reflective mask blank according to the second embodiment of the present invention.

FIG. 11 shows a modification of the reflective mask blank according to the second embodiment of the present invention.

A reflective mask blank 10$k$ shown in FIG. 11 includes the substrate 11, the multilayer reflective film 12, the protective film 13, and a phase shift film 14$k$ in this order. The phase shift film 14$k$ includes, from the protective film 13, a second layer 18$c$ containing the one or more second elements, the first layer 16$a$ containing the one or more first elements, and the third layer 19 containing the one or more third elements in this order. In addition, the first layer 16$a$ includes the region A1 in which a content of an element (first specific element) having a highest content among the one or more first elements increases in a thickness direction from a side opposite to the second layer 18$c$ toward the second layer 18$c$, and the region A1 is present adjacent to the second layer 18$c$. In addition, the second layer 18$c$ includes the region D2 in which a content of an element (second specific element) having a highest content among the one or more second elements increases in a thickness direction from a side opposite to the first layer 16a toward the first layer 16a, and the region D2 is present adjacent to the first layer 16a. In addition, the second layer 18c includes a region E2 in which the content of the element having the highest content among the one or more second elements increases in a thickness direction from a side opposite to the protective film 13 toward the protective film 13, and the region E2 is present adjacent to the protective film 13. A region of the second layer 18c other than the region D2 and the region E2 is the second layer normal region 18x, and the content of the element having the highest content among the one or more second elements in the second layer normal region 18x is smaller than that in the region D2 and the region E2.

In the case of being compared, the reflective mask blank 10i shown in FIG. 9 and the reflective mask blank 10k shown in FIG. 11 have the same configuration except that the second layer 18c of the reflective mask blank 10k shown in FIG. 11 includes the region D2 and the region E2. Therefore, description of the same configuration is omitted.

In the reflective mask blank 10k shown in FIG. 11, interfacial peeling at an interface between the second layer 18c and the protective film 13 can be suppressed due to the presence of the region E2 and interfacial peeling at an interface between the first layer 16a and the second layer 18c can be suppressed due to the presence of the region D2.

A preferable aspect of the region D2 is the same as the aspect of the region D2 of the reflective mask blank 10e shown in FIG. 5. In addition, a preferable aspect of the region E2 is the same as the aspect of the region B2 of the reflective mask blank 10h shown in FIG. 8.

Figure 12:
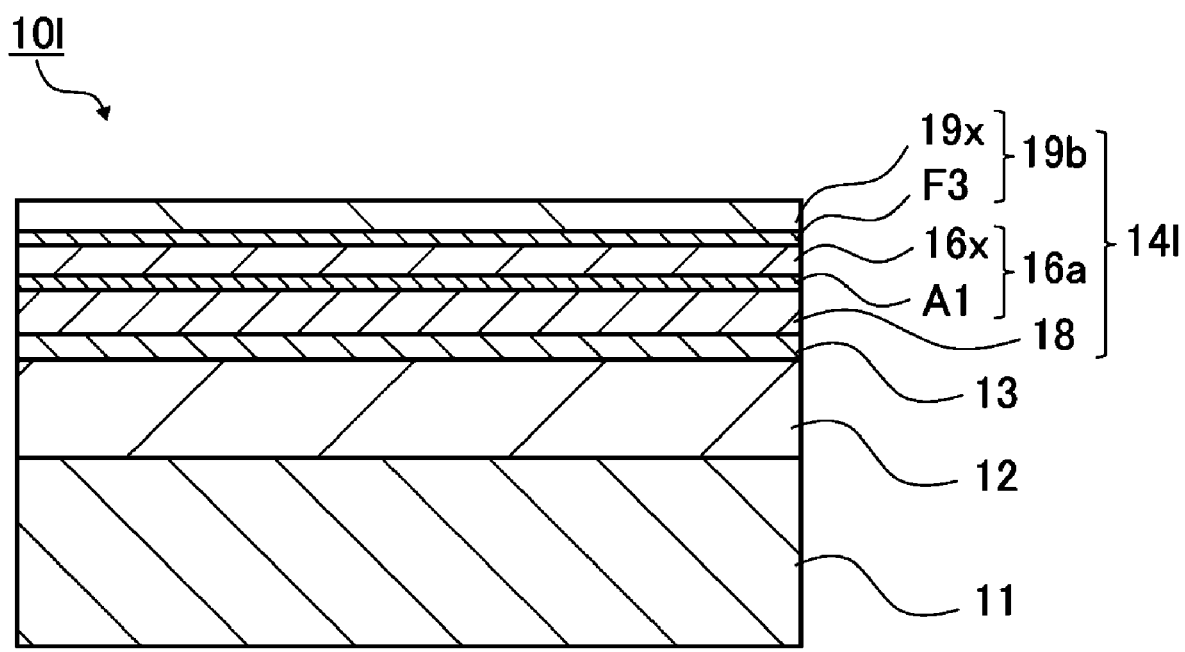
FIG. 12 is a schematic diagram showing an example of the reflective mask blank according to the second embodiment of the present invention.

FIG. 12 shows a modification of the reflective mask blank according to the second embodiment of the present invention.

A reflective mask blank 10l shown in FIG. 12 includes the substrate 11, the multilayer reflective film 12, the protective film 13, and a phase shift film 14l in this order. The phase shift film 14l includes, from the protective film 13, the second layer 18 containing the one or more second elements, the first layer 16a containing the one or more first elements, and a third layer 19b containing the one or more third elements in this order. In addition, the first layer 16a includes the region A1 in which a content of an element (first specific element) having a highest content among the one or more first elements increases in a thickness direction from a side opposite to the second layer 18 toward the second layer 18, and the region A1 is present adjacent to the second layer 18. In addition, the third layer 19b includes the region F3 in which a content of an element (third specific element) having a highest content among the one or more third elements increases in a thickness direction from a side opposite to the first layer 16a toward the first layer 16a, and the region F3 is present adjacent to the first layer 16a. A region of the first layer 16a other than the region A1 is a first layer normal region 16x, and the content of the element having the highest content among the one or more first elements in the first layer normal region 16x is smaller than that in the region A1. In addition, a region of the third layer 19b other than the region F3 is the third layer normal region 19x, and the content of the element having the highest content among the one or more third elements in the third layer normal region 19x is smaller than that in the region F3.

In the case of being compared, the reflective mask blank 10i shown in FIG. 9 and the reflective mask blank 10l shown in FIG. 12 have the same configuration except that the third layer 19b of the reflective mask blank 10l shown in FIG. 12 includes the region F3. Therefore, description of the same configuration is omitted.

In the reflective mask blank 10l shown in FIG. 12, interfacial peeling at an interface between the first layer 16a and the third layer 19b can be suppressed due to the presence of the region F3.

A preferable aspect of the region F3 is the same as the aspect of the region F3 of the reflective mask blank 10f shown in FIG. 6.

The content of the second specific element in the portion of the region E2 closest to the second layer on a vertical cross section is preferably 20 at % to 80 at %, more preferably 20 at % to 60 at %, still more preferably 20 at % to 40 at %. In addition, the content of the second specific element in a portion of the region E2 closest to the protective film on the vertical cross section is preferably 60 at % to 100 at %, more preferably 70 at % or more and less than 100 at %, and still more preferably 80 at % or more and less than 100 at %.

A difference obtained by subtracting the content of the third specific element in the portion closest to the second layer from the content of the second specific element in the portion closest to the protective film is preferably 10 at % to 80 at %, and more preferably 20 at % to 70 at %.

Reflective Mask Blank (Third Embodiment)

A reflective mask blank according to the third embodiment of the present invention includes, a substrate, a multilayer reflective film that reflects EUV light, a protective film, and a phase shift film that shifts a phase of EUV light, in this order, in which the phase shift film includes a first layer containing one or more first elements selected from the group consisting of Ru, Re, Ir, Ag, Os, Au, Pd, and Pt, and a second layer containing one or more second elements selected from the group consisting of Ta and Cr, the second layer includes a region G2 in which a content of an element having a highest content among the one or more second elements increases in a thickness direction from a side opposite to the first layer toward the first layer, and the region G2 is present adjacent to the first layer.

Regarding the second layer, in other words, the second layer includes the region G2 present adjacent to the first layer, and in the region G2, the content of the element having the highest content among the one or more second elements increases in the thickness direction from the side opposite to the first layer toward the first layer.

The fact that in the region G2, the content of the element having the highest content among the one or more second elements increases in the thickness direction from the side opposite to the first layer toward the first layer is the same as the definition of the region D2.

The reflective mask blank according to the third embodiment will be described with reference to FIG. 13. A reflective mask blank 10m shown in FIG. 13 includes the substrate 11, the multilayer reflective film 12, the protective film 13, and a phase shift film 14m in this order. The phase shift film 14m includes the first layer 16 containing the one or more first elements and a second layer 18d containing the one or more second elements in this order from the protective film 13. In addition, the second layer 18d includes the region G2 in which a content of an element having a highest content among the one or more second elements increases in a thickness direction from a side opposite to the first layer 16 toward the first layer 16, and the region G2 is present adjacent to the first layer 16. A region of the second layer

18*d* other than the region G2 is the second layer normal region 18*x*, and the content of the element having the highest content among the one or more second elements in the second layer normal region 18*x* is smaller than that in the region G2.

In the reflective mask blank according to the third embodiment of the present invention, occurrence of interfacial peeling is suppressed even when a heat treatment is performed.

A mechanism of suppressing the occurrence of interfacial peeling by the heat treatment is considered to be the same as the mechanism in the first embodiment.

The reflective mask blank according to the first embodiment of the present invention and the mask blank according to the third embodiment of the present invention have the same configuration except that the first layer in the phase shift film does not include the region A1 and the second layer includes the region G2.

That is, the substrate, the multilayer reflective film, and the protective film included in the reflective mask blank according to the third embodiment, and a back surface conductive film and other films that may be included in the reflective mask blank according to the third embodiment are the same as those in the first embodiment, and thus description thereof is omitted.

A content of the first specific element in a portion of the region G2 closest to the second layer on a vertical cross section is preferably 20 at % to 80 at %, more preferably 20 at % to 60 at %, and still more preferably 20 at % to 40 at %. In addition, the content of the first specific element in a portion of the region G2 closest to the first layer on the vertical cross section is preferably 60 at % to 100 at %, more preferably 70 at % or more and less than 100 at %, and still more preferably 80 at % or more and less than 100 at %.

A difference obtained by subtracting the content of the first specific element in the portion closest to the second layer from the content of the first specific element in the portion closest to the first layer is preferably 10 at % to 80 at %, and more preferably 20 at % to 70 at %.

(Phase Shift Film)

The phase shift film included in the reflective mask blank according to the third embodiment of the present invention includes a first layer containing one or more first elements selected from the group consisting of Ru, Re, Ir, Ag, Os, Au, Pd, and Pt, and a second layer containing one or more second elements selected from the group consisting of Ta and Cr.

In addition, the phase shift film may include a third layer containing one or more third elements selected from the group consisting of Ta and Cr as in an aspect to be described later.

Hereinafter, the respective layers constituting the phase shift film will be described in detail.

In the third embodiment, the first layer contains one or more first elements selected from the group consisting of Ru, Re, Ir, Ag, Os, Au, Pd, and Pt. The first layer preferably further contains one or more elements selected from the group consisting of B, C, N, and O.

In the case where the first layer contains Ru as the one or more first elements, the first layer preferably contains an element other than Ru, and examples of the other element include one or more elements selected from the group consisting of B, C, N, O, Mo, Ta, and Nb. Among them, as the elements other than Ru, one or more elements selected from the group consisting of B, N, and O are preferable. In the case where the first layer contains Ru, examples of a material constituting the first layer include ruthenium boride, ruthenium nitride, ruthenium oxide, ruthenium oxynitride, complex nitride of Ru and Mo, complex oxynitride of Ru and Mo, complex oxycarbide of Ru and Mo, complex nitride of Ru and Ta, complex oxynitride of Ru and Ta, and complex oxycarbide of Ru and Ta.

In the case where the first layer contains Re as the one or more first elements, the first layer may preferably contain an element other than Re, and examples of the other element include one or more elements selected from the group consisting of B, C, N, O, and Ru. In the case where the first layer contains Re, examples of a material constituting the first layer include Re metal simple substance, rhenium boride, rhenium carbide, rhenium nitride, rhenium oxide, rhenium oxycarbide, rhenium oxynitride, Re—Ru alloy, complex nitride of Re and Ru, and complex oxynitride of Re and Ru.

In the case where the first layer contains Ir as the one or more first elements, the first layer may preferably contain an element other than Ir, and examples of the other element include one or more elements selected from the group consisting of B, C, N, O, and Ru. In the case where the first layer contains Ir, examples of the material constituting the first layer include Ir metal simple substance, iridium boride, iridium nitride, iridium oxide, iridium oxynitride, Ir—Ru alloy, composite nitride of Ir and Ru, and composite oxynitride of Ir and Ru.

In the case where the first layer contains Ag as the one or more first elements, the first layer may preferably contain an element other than Ag, and examples of the other element include one or more elements selected from the group consisting of B, C, N, O, and Ru. In the case where the first layer contains Ag, examples of the material constituting the first layer include Ag metal simple substance, silver boride, silver nitride, silver oxide, silver oxynitride, Ag—Ru alloy, composite nitride of Ag and Ru, and composite oxynitride of Ag and Ru.

In the case where the first layer contains Os as the one or more first elements, the first layer may preferably contain an element other than Os, and examples of the other element include one or more elements selected from the group consisting of B, C, N, O, and Ru. In the case where the first layer contains Os, examples of the material constituting the first layer include Os metal simple substance, osmium boride, osmium nitride, osmium oxide, osmium oxynitride, Os—Ru alloy, composite nitride of Os and Ru, and composite oxynitride of Os and Ru.

In the case where the first layer contains Au as the one or more first elements, the first layer may preferably contain an element other than Au, and examples of the other element include one or more elements selected from the group consisting of B, C, N, O, and Ru. In the case where the first layer contains Au, examples of the material constituting the first layer include Au metal simple substance, gold boride, gold nitride, gold oxide, gold oxynitride, Au—Ru alloy, composite nitride of Au and Ru, and composite oxynitride of Au and Ru.

In the case where the first layer contains Pd as the one or more first elements, the first layer may preferably contain an element other than Pd, and examples of the other element include one or more elements selected from the group consisting of B, C, N, O, and Ru. In the case where the first layer contains Pd, examples of the material constituting the first layer include Pd metal simple substance, palladium boride, palladium nitride, palladium oxide, palladium oxynitride, Pd—Ru alloy, composite nitride of Pd and Ru, and composite oxynitride of Pd and Ru.

In the case where the first layer contains Pt as the one or more first elements, the first layer may preferably contain an element other than Pt, and examples of the other element include one or more elements selected from the group consisting of B, C, N, O, and Ru. In the case where the first layer contains Pt, examples of the material constituting the first layer include Pt metal simple substance, platinum boride, platinum nitride, platinum oxide, platinum oxynitride, Pt—Ru alloy, composite nitride of Pt and Ru, and composite oxynitride of Pt and Ru.

Among them, as the material constituting the first layer, ruthenium boride, ruthenium nitride, ruthenium oxynitride, composite nitride of Ru and Ta, composite nitride of Ru and Mo, Re metal simple substance, Re—Ru alloy, composite oxynitride of Re and Ru, Ir metal simple substance, Ir—Ru alloy, composite oxynitride of Ir and Ru, and Pt metal simple substance are preferable.

A film thickness of the first layer is preferably 2 nm to 55 nm, more preferably 10 nm to 50 nm, and still more preferably 20 nm to 45 nm.

A film thickness of the region G2 is determined based on a measurement result of the content of the element measured by the above-described measurement method.

A preferable aspect of the refractive index n and the extinction coefficient k of the first layer is the same as the preferable aspect of the refractive index n and the extinction coefficient k of the first layer according to the first embodiment.

In the third embodiment, the second layer contains one or more second elements selected from the group consisting of Ta and Cr. The second layer preferably contains one or more elements selected from the group consisting of B, C, N, and O.

In the case where the second layer contains Ta as the one or more second elements, the second layer may contain an element other than Ta, and examples of the other element include one or more elements selected from the group consisting of B, C, N, and O. In the case where the second layer contains Ta, examples of a material constituting the second layer include tantalum boride, tantalum boron nitride, tantalum borate, tantalum carbide, tantalum carbonitride, tantalum oxycarbonitride, tantalum nitride, tantalum oxide, and tantalum oxynitride.

In the case where the second layer contains Cr as the one or more second elements, the second layer may contain an element other than Cr, and examples of the other element include one or more elements selected from the group consisting of B, C, N, and O. In the case where the second layer contains Cr, examples of the material constituting the second layer include chromium boride, chromium boron nitride, chromium borate, chromium carbide, chromium carbonitride, chromium oxycarbonitride, chromium oxycarbide, chromium nitride, chromium oxide, and chromium oxynitride.

Among them, tantalum boron nitride, tantalum nitride, tantalum oxynitride, chromium nitride, chromium oxide, chromium oxycarbonitride, and chromium oxynitride are preferable as the material constituting the second layer.

In the case where the first layer contains the one or more first elements and Ta or Cr, a layer containing the one or more first elements is defined as the first layer and is not defined as the second layer.

In the third embodiment, the second layer includes the region G2 in which a content of an element having a highest content among the one or more second elements increases in a thickness direction from a side opposite to the first layer toward the first layer, and the region G2 is present adjacent to the first layer.

A definition and a preferable aspect of "increase" are as described above.

A film thickness of the region G2 is determined based on a measurement result of the content of the element measured by the above-described measurement method.

A film thickness of the second layer is preferably 2 nm to 45 nm, and more preferably 10 nm to 30 nm.

The film thickness of the second layer is determined by the XRR method.

The region G2 is usually disposed in a part of the second layer in the thickness direction, and a proportion of a thickness of the region G2 to a total thickness of the second layer is preferably 1% to 50%, and more preferably 3% to 30%.

A film thickness of the region G2 is preferably 0.1 nm to 10 nm, and more preferably 0.5 nm to 10 nm.

A method for forming the first layer and the second layer is as described in the first embodiment.

As a method for forming the region G2 included in the second layer, film formation may be performed under a condition that the element having the highest content among the one or more second elements contained in the second layer increases. Examples of the film formation method include the film formation method described in the first embodiment.

Examples of the condition include the condition described in the first embodiment.

Examples of a method for manufacturing the reflective mask blank according to the third embodiment include a method of forming the region G2 under the above condition after formation of the protective film and the first layer and at the start of formation of the second layer, and then forming the second layer.

A preferable aspect of the film thickness of the phase shift film, the EUV light reflectance of the reflective mask blank, the phase difference caused by the phase shift film, and the reflectance for deep-UV is the same as the preferable aspect of the first embodiment.

(Modification)

Hereinafter, modifications of the reflective mask blank according to the third embodiment will be described.

In an aspect to be described below, a definition and an aspect of "increase" are the same as those in the region A1 and the like.

Figure 14:
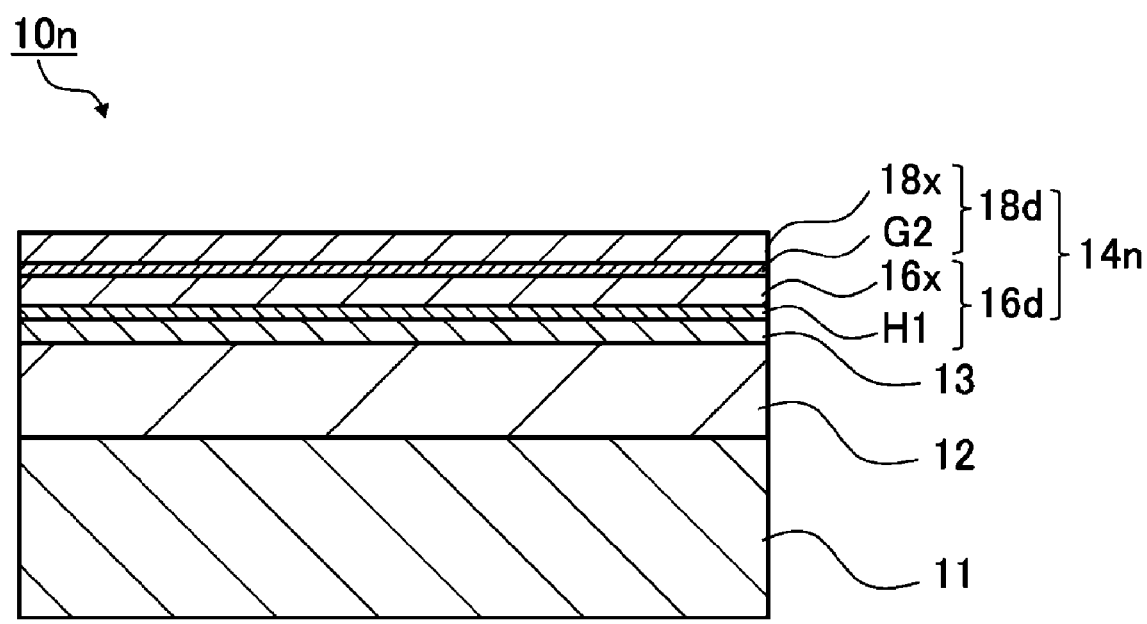
FIG. 14 is a schematic view showing an example of the reflective mask blank according to the third embodiment of the present invention.

FIG. 14 shows a modification of the reflective mask blank according to the third embodiment of the present invention.

A reflective mask blank 10n shown in FIG. 14 includes the substrate 11, the multilayer reflective film 12, the protective film 13, and a phase shift film 14n in this order. The phase shift film 14n includes a first layer 16d containing the one or more first elements and the second layer 18d containing the one or more second elements in this order from the protective film 13. In addition, the second layer 18d includes the region G2 in which a content of an element (second specific element) having a highest content among the one or more second elements increases in a thickness direction from a side opposite to the first layer 16d toward the first layer 16d, and the region G2 is present adjacent to the first layer 16d. In addition, the first layer 16d includes a region H1 in which a content of an element having a highest content among the one or more first elements increases in a thickness direction from a side opposite to the protective film 13 toward the protective film 13, and the region H1 is present adjacent to the protective film 13. A region of the second layer 18d other than the region G2 is the second layer normal region 18x, and the content of the element having the highest content among the one or more second elements in the second layer normal region 18x is smaller than that in the region G2. A region of the first layer 16d other than the region H1 is the first layer normal region 16x, and the content of the element having the highest content among the one or more first elements in the first layer normal region 16x is smaller than that in the region H1.

Figure 13:
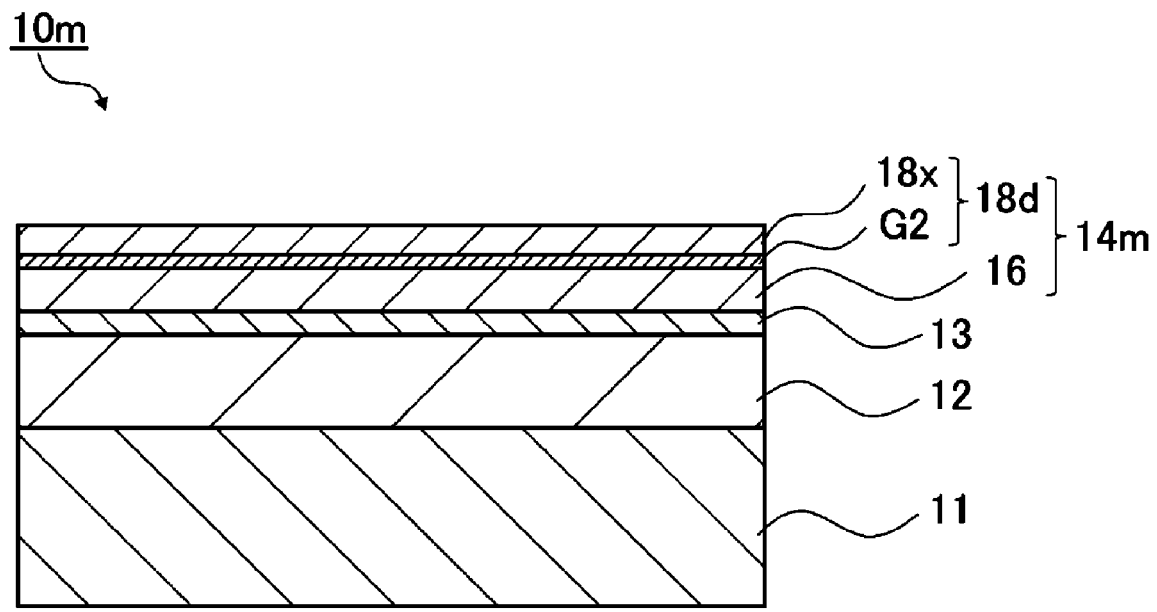
FIG. 13 is a schematic view showing an example of a reflective mask blank according to a third embodiment of the present invention.

In the case of being compared, the reflective mask blank 10m shown in FIG. 13 and the reflective mask blank 10n shown in FIG. 14 have the same configuration except that the first layer 16d of the reflective mask blank 10n shown in FIG. 14 includes the region H1. Therefore, description of the same configuration is omitted.

In the reflective mask blank 10n shown in FIG. 14, interfacial peeling at an interface between the first layer 16d and the protective film 13 can be suppressed due to the presence of the region H1.

A preferable aspect of the region H1 of the first layer 16d is the same as the aspect of the region B1 of the first layer 16b of the reflective mask blank 10b shown in FIG. 2, and thus description thereof is omitted.

The content of the first specific element in a portion of the region H1 closest to the first layer on a vertical cross section is preferably 50 at % to 95 at %, more preferably 50 at % to 85 at %, and still more preferably 50 at % to 75 at %. In addition, the content of the first specific element in a portion of the region H1 closest to a protective layer on the vertical cross section is preferably 60 at % to 100 at %, more preferably 70 at % or more and less than 100 at %, and still more preferably 80 at % or more and less than 100 at %.

A difference obtained by subtracting the content of the first specific element in the portion closest to the first layer from the content of the first specific element in the portion closest to the protective layer is preferably 5 at % to 50 at %, and more preferably 10 at % to 50 at %.

Figure 15:
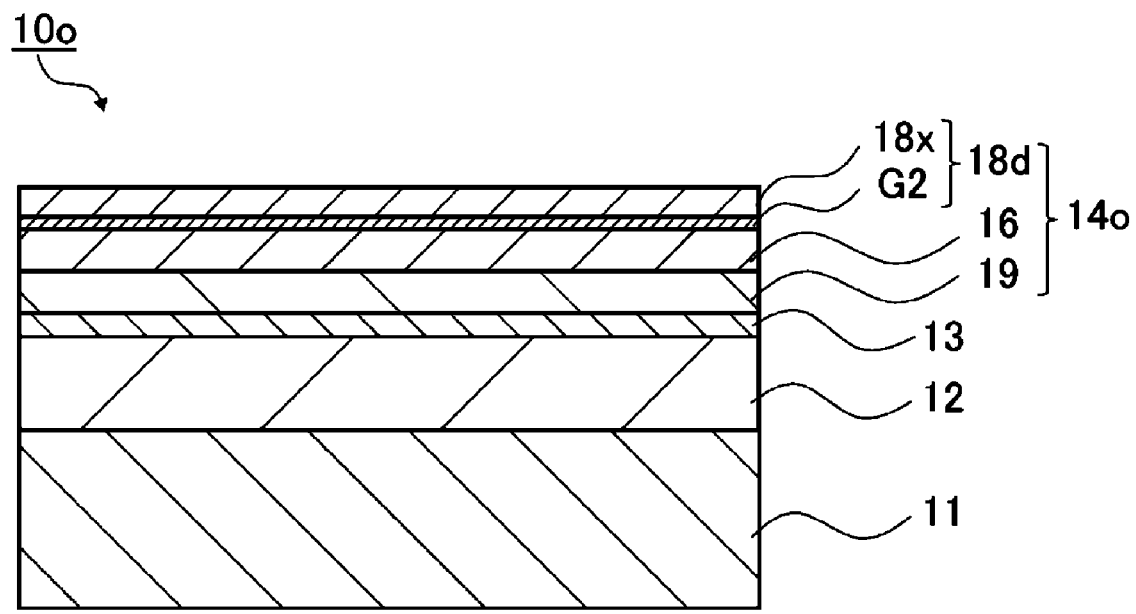
FIG. 15 is a schematic view showing an example of the reflective mask blank according to the third embodiment of the present invention.

FIG. 15 shows a modification of the reflective mask blank according to the third embodiment of the present invention.

A reflective mask blank 10o shown in FIG. 15 includes the substrate 11, the multilayer reflective film 12, the protective film 13, and a phase shift film 14o in this order. The phase shift film 14o includes, from the protective film 13, the third layer 19 containing one or more third elements selected from the group consisting of Ta and Cr, the first layer 16 containing the one or more first elements, and the second layer 18d containing the one or more second elements in this order. In addition, the second layer 18d includes the region G2 in which a content of an element (second specific element) having a highest content among the one or more second elements increases in a thickness direction from a side opposite to the first layer 16 toward the first layer 16, and the region G2 is present adjacent to the first layer 16. A region of the second layer 18d other than the region G2 is the second layer normal region 18x, and the content of the element having the highest content among the one or more second elements in the second layer normal region 18x is smaller than that in the region G2.

In the case of being compared, the reflective mask blank 10m shown in FIG. 13 and the reflective mask blank 10o shown in FIG. 15 have the same configuration except that the reflective mask blank 10o shown in FIG. 15 includes the third layer 19. Therefore, description of the same configuration is omitted.

In the reflective mask blank 10o shown in FIG. 15, the third layer 19 may function as an etching stopper when a reflective mask to be described later is prepared.

A preferable aspect of the third layer 19 is the same as that of the third layer 19 of the reflective mask blank 10c shown in FIG. 3, and thus description thereof is omitted.

Figure 16:
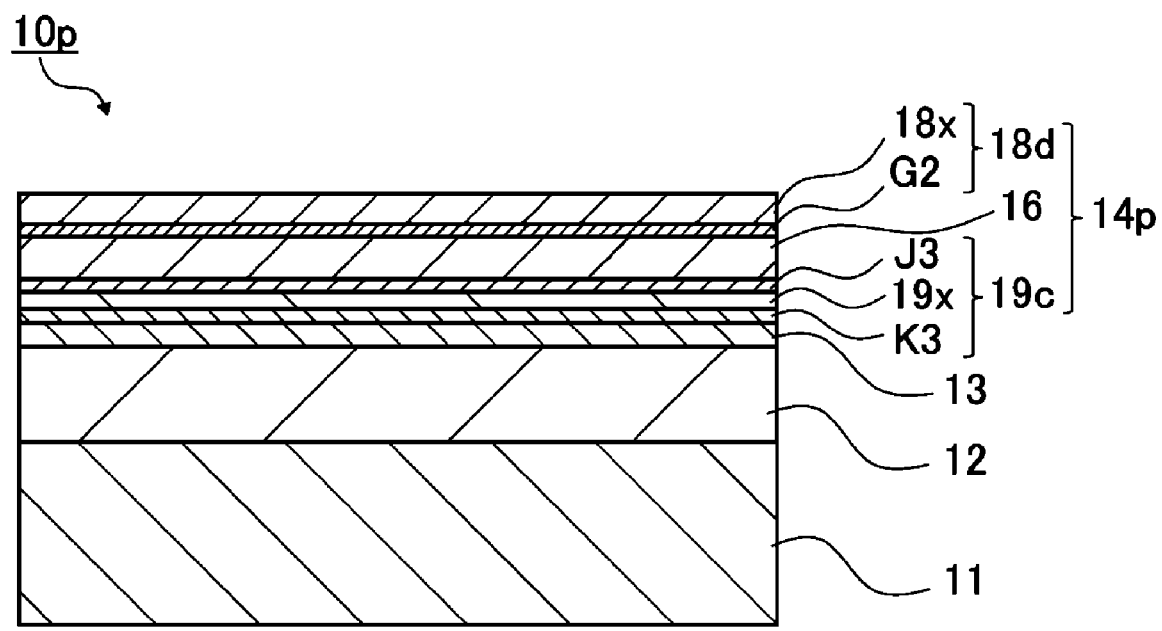
FIG. 16 is a schematic diagram showing an example of the reflective mask blank according to the third embodiment of the present invention.

FIG. 16 shows a modification of the reflective mask blank according to the third embodiment of the present invention.

A reflective mask blank 10p shown in FIG. 16 includes the substrate 11, the multilayer reflective film 12, the protective film 13, and a phase shift film 14p in this order. The phase shift film 14p includes, from the protective film 13, a third layer 19c containing the one or more third elements, the first layer 16 containing the one or more first elements, and the second layer 18d containing the one or more second elements in this order. In addition, the second layer 18d includes the region G2 in which a content of an element (second specific element) having a highest content among the one or more second elements increases in a thickness direction from a side opposite to the first layer 16 toward the first layer 16, and the region G2 is present adjacent to the first layer 16. In addition, the third layer 19c includes a region J3 in which a content of an element (third specific element) having a highest content among the one or more third elements increases in a thickness direction from a side opposite to the first layer 16 toward the first layer 16, and the region J3 is present adjacent to the first layer 16. In addition, the third layer 19c includes a region K3 in which the content of the element having the highest content among the one or more third elements increases in a thickness direction from a side opposite to the protective film 13 toward the protective film 13, and the region K3 is present adjacent to the protective film 13. A region of the third layer 19c other than the region J3 and the region K3 is the third layer normal region 19x, and the content of the element having the highest content among the one or more third elements in the third layer normal region 19x is smaller than that in the region J3 and the region K3.

In the case of being compared, the reflective mask blank 10o shown in FIG. 15 and the reflective mask blank 10p shown in FIG. 16 have the same configuration except that the third layer 19c of the reflective mask blank 10p shown in FIG. 16 includes the region J3 and the region K3. Therefore, description of the same configuration is omitted.

In the reflective mask blank 10p shown in FIG. 16, interfacial peeling at an interface between the first layer 16 and the third layer 19c and interfacial peeling at an interface between the third layer 19c and the protective film 13 can be suppressed due to the presence of the region J3 and the region K3.

A preferable aspect of each of the region J3 and the region K3 is the same as that of each of the regions F3 and G3 of the third layer 19a of the reflective mask blank 10f shown in FIG. 6, and thus description thereof is omitted.

The content of the third specific element in a portion of the region J3 closest to the third layer on a vertical cross section is preferably 20 at % to 80 at %, more preferably 20 at % to 60 at %, and still more preferably 20 at % to 40 at %. In addition, the content of the third specific element in a portion of the region J3 closest to the first layer on the vertical cross section is preferably 60 at % to 100 at %, more preferably 70 at % or more and less than 100 at %, and still more preferably 80 at % or more and less than 100 at %.

A difference obtained by subtracting the content of the third specific element in the portion closest to the third layer from the content of the third specific element in the portion closest to the first layer is preferably 10 at % to 80 at %, and more preferably 20 at % to 70 at %.

The content of the third specific element in a portion of the region K3 closest to the third layer on a vertical cross section is preferably 20 at % to 80 at %, more preferably 20 at % to 60 at %, and still more preferably 20 at % to 40 at %. In addition, the content of the third specific element in a portion of the region K3 closest to the protective film on the vertical cross section is preferably 60 at % to 100 at %, more preferably 70 at % or more and less than 100 at %, and still more preferably 80 at % or more and less than 100 at %.

A difference obtained by subtracting the content of the third specific element in the portion closest to the third layer from the content of the third specific element in the portion closest to the protective film is preferably 10 at % to 80 at %, and more preferably 20 at % to 70 at %.

Further, in the aspect of the reflective mask blank 10o, the first layer 16 may include a region L1 in which a content of an element having a highest content among the one or more first elements contained in the first layer 16 increases in a thickness direction from a side opposite to the second layer 18d toward the second layer 18d. The region L1 is present adjacent to the second layer 18d. In addition, the first layer 16 may include a region M1 in which the content of the element having the highest content among the one or more first elements contained in the first layer 16 increases in a thickness direction from a side opposite to the third layer 19c toward the third layer 19c. The region M1 is present adjacent to the third layer 19c.

The first layer 16 may include both the regions L1 and M1.

In an aspect including the region L1, interfacial peeling at an interface between the second layer 18d and the first layer 16 can be further suppressed. In addition, in an aspect including the region M1, interfacial peeling at an interface between the first layer 16 and the third layer 19c can also be suppressed.

Reflective Mask Blank (Fourth Embodiment)

A reflective mask blank according to the fourth embodiment of the present invention includes, a substrate, a multilayer reflective film that reflects EUV light, a protective film, and a phase shift film that shifts a phase of EUV light, in this order, in which the phase shift film includes a first layer containing one or more first elements selected from the group consisting of Ru, Re, Ir, Ag, Os, Au, Pd, and Pt, and a second layer containing one or more second elements selected from the group consisting of Ta and Cr, the second layer includes a region G2 in which a content of an element having a highest content among the one or more second elements increases in a thickness direction from a side opposite to the first layer toward the first layer, and the region G2 is present adjacent to the first layer.

Regarding the second layer, in other words, the second layer includes the region G2 present adjacent to the first layer, and in the region G2, the content of the element having the highest content among the one or more second elements increases in the thickness direction from the side opposite to the first layer toward the first layer.

The reflective mask blank according to the fourth embodiment will be described with reference to FIG. 17. A reflective mask blank 10q shown in FIG. 17 includes the substrate 11, the multilayer reflective film 12, the protective film 13, and a phase shift film 14q in this order. The phase shift film 14q includes the second layer 18d containing the one or more second elements and the first layer 16 containing the one or more first elements in this order from the protective film 13. In addition, the second layer 18d includes the region G2 in which a content of an element having a highest content among the one or more second elements increases in a thickness direction from a side opposite to the first layer 16 toward the first layer 16, and the region G2 is present adjacent to the first layer 16. A region of the second layer 18d other than the region G2 is the second layer normal region 18x, and the content of the element having the highest content among the one or more second elements in the second layer normal region 18x is smaller than that in the region G2.

The reflective mask blank according to the fourth embodiment of the present invention and the mask blank according to the third embodiment of the present invention have the same configuration except that positions of the first layer and the second layer in the phase shift film are reversed.

That is, the substrate, the multilayer reflective film, the protective film, and the phase shift film included in the reflective mask blank according to the fourth embodiment, and a back surface conductive film and other films that may be included in the reflective mask blank according to the fourth embodiment are the same as those in the third embodiment, and thus description thereof is omitted.

Examples of a method for manufacturing the reflective mask blank according to the fourth embodiment include a method of forming the region G2 under the above condition after formation of the protective film, during formation of the second layer, and before completion of the formation of the second layer, and then forming the first layer.

(Modification)

Hereinafter, modifications of the reflective mask blank according to the fourth embodiment will be described.

In an aspect to be described below, a definition and an aspect of "increase" are the same as those in the region A1 and the like.

Figure 18:
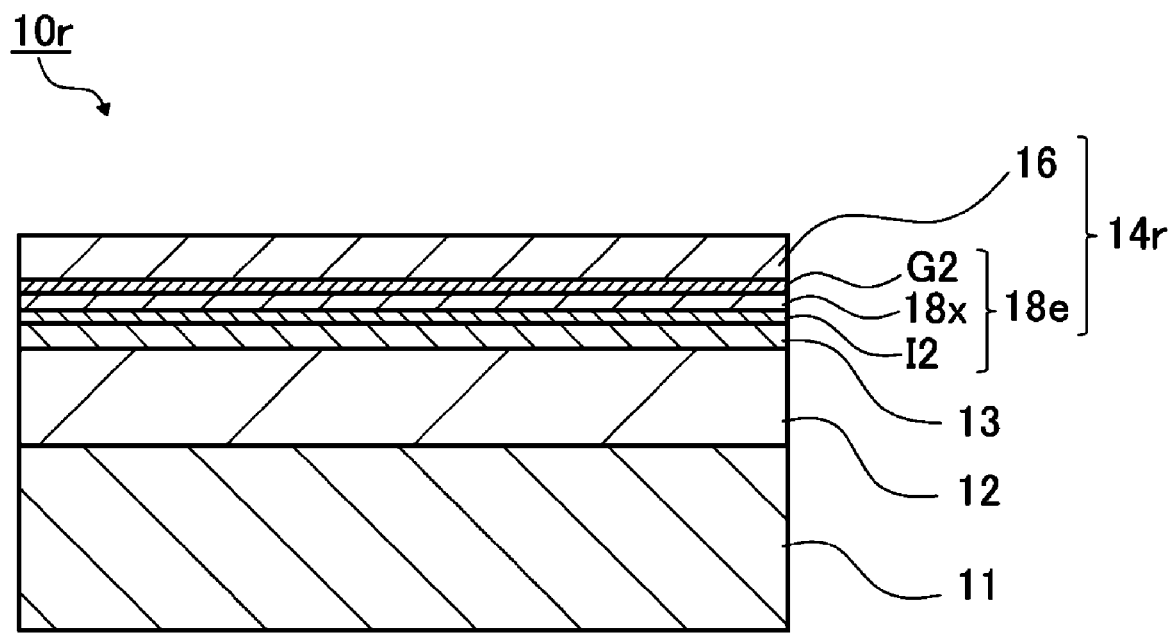
FIG. 18 is a schematic diagram showing an example of the reflective mask blank according to the fourth embodiment of the present invention.

FIG. 18 shows a modification of the reflective mask blank according to the fourth embodiment of the present invention.

A reflective mask blank 10r shown in FIG. 18 includes the substrate 11, the multilayer reflective film 12, the protective film 13, and a phase shift film 14r in this order. The phase shift film 14r includes a second layer 18e containing the one or more second elements and the first layer 16 containing the one or more first elements in this order from the protective film 13. In addition, the second layer 18e includes the region G2 in which a content of an element (second specific element) having a highest content among the one or more second elements increases in a thickness direction from a side opposite to the first layer 16 toward the first layer 16, and the region G2 is present adjacent to the first layer 16. In addition, the second layer 18e includes a region I2 in which the content of the element having the highest content among the one or more second elements increases in a thickness direction from a side opposite to the protective film 13 toward the protective film 13, and the region I2 is present adjacent to the protective film 13. A region of the second layer 18e other than the regions G2 and I2 is the second layer normal region 18x, and the content of the element having the highest content among the one or more second elements in the second layer normal region 18x is smaller than that in the region G2 and the region I2.

Figure 17:
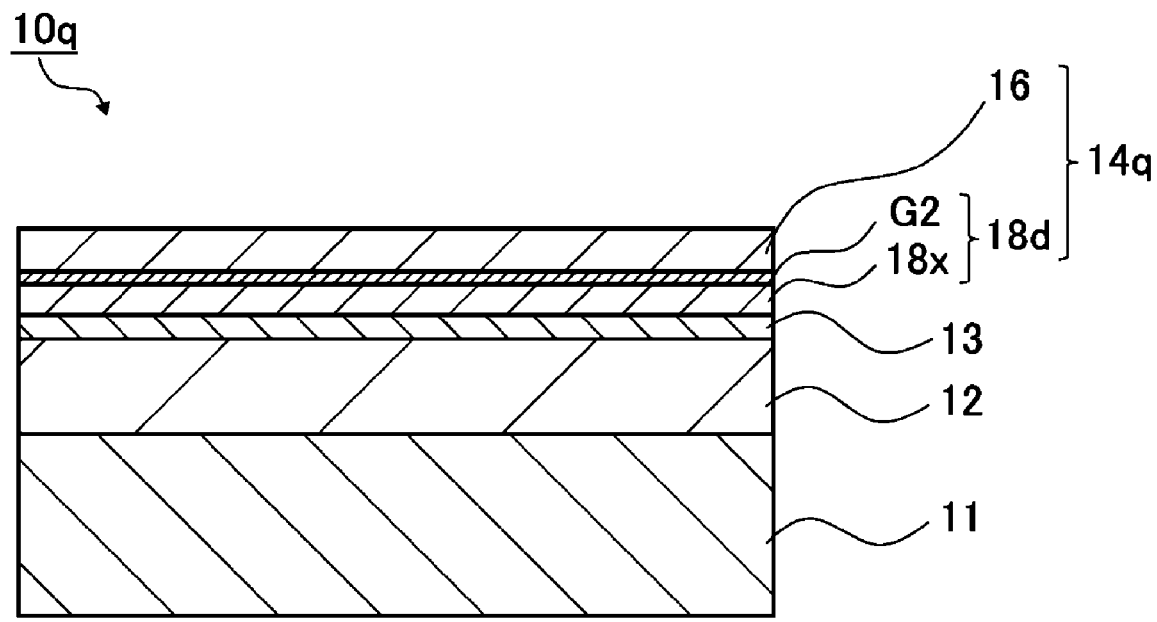
FIG. 17 is a schematic diagram showing an example of a reflective mask blank according to a fourth embodiment of the present invention.

In the case of being compared, the reflective mask blank 10r shown in FIG. 18 and the reflective mask blank 10q shown in FIG. 17 have the same configuration except that the second layer 18e of the reflective mask blank 10r shown in FIG. 18 includes the region I2. Therefore, description of the same configuration is omitted.

In the reflective mask blank 10r shown in FIG. 18, interfacial peeling at an interface between the second layer 18e and the protective film 13 can be suppressed due to the presence of the region I2.

A preferable aspect of the region I2 of the second layer 18e is the same as the aspect of the region B2 of the second layer 18b of the reflective mask blank 10h shown in FIG. 8, and thus description thereof is omitted.

Figure 19:
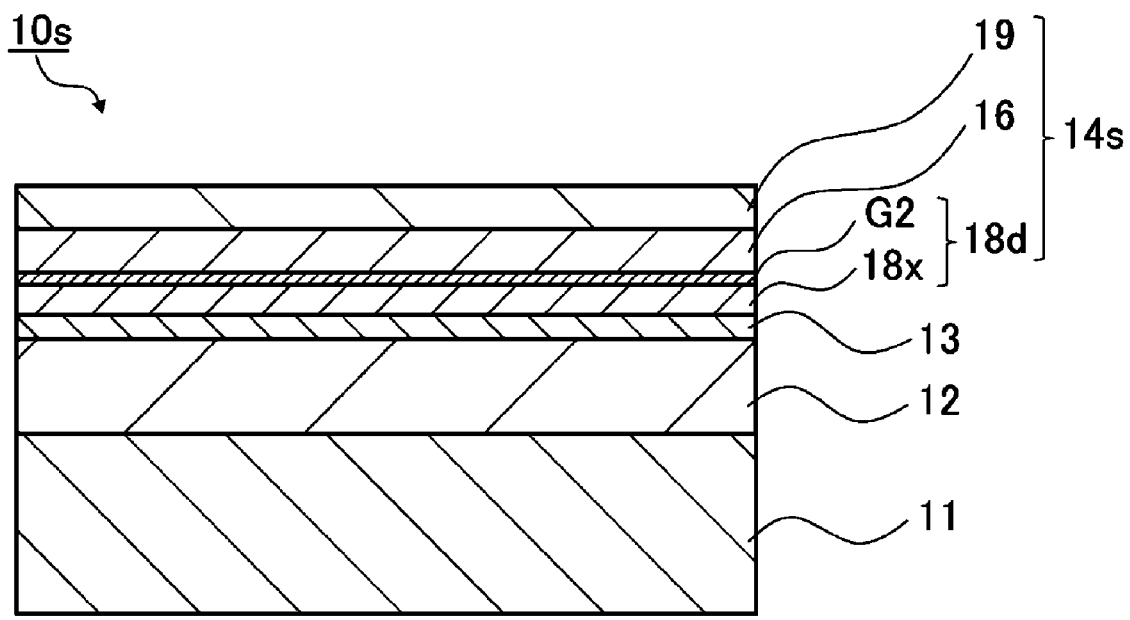
FIG. 19 is a schematic diagram showing an example of the reflective mask blank according to the fourth embodiment of the present invention.

FIG. 19 shows a modification of the reflective mask blank according to the fourth embodiment of the present invention.

A reflective mask blank 10s shown in FIG. 19 includes the substrate 11, the multilayer reflective film 12, the protective film 13, and a phase shift film 14s in this order. The phase shift film 14s includes, from the protective film 13, the second layer 18d, the first layer 16, and the third layer 19 containing one or more third elements selected from the group consisting of Ta and Cr in this order. In addition, the second layer 18d includes the region G2 in which a content of an element having a highest content among the one or more second elements increases in a thickness direction from a side opposite to the first layer 16 toward the first layer 16, and the region G2 is present adjacent to the first layer 16. A region of the second layer 18d other than the region G2 is the second layer normal region 18x, and the content of the element having the highest content among the one or more second elements in the second layer normal region 18x is smaller than that in the region G2.

In the case of being compared, the reflective mask blank 10o shown in FIG. 15 and the reflective mask blank 10s shown in FIG. 19 have the same configuration except that in the reflective mask blank 10s shown in FIG. 19, a lamination order of the layers in the phase shift film 14s is reversed. Therefore, description of the same configuration is omitted.

In the reflective mask blank 10s shown in FIG. 19, the third layer 19 may function as an anti-reflection film for deep-UV.

A preferable aspect of the third layer 19 is the same as the aspect of the third layer 19 of the reflective mask blank 10i shown in FIG. 9, and thus description thereof is omitted.

Figure 20:
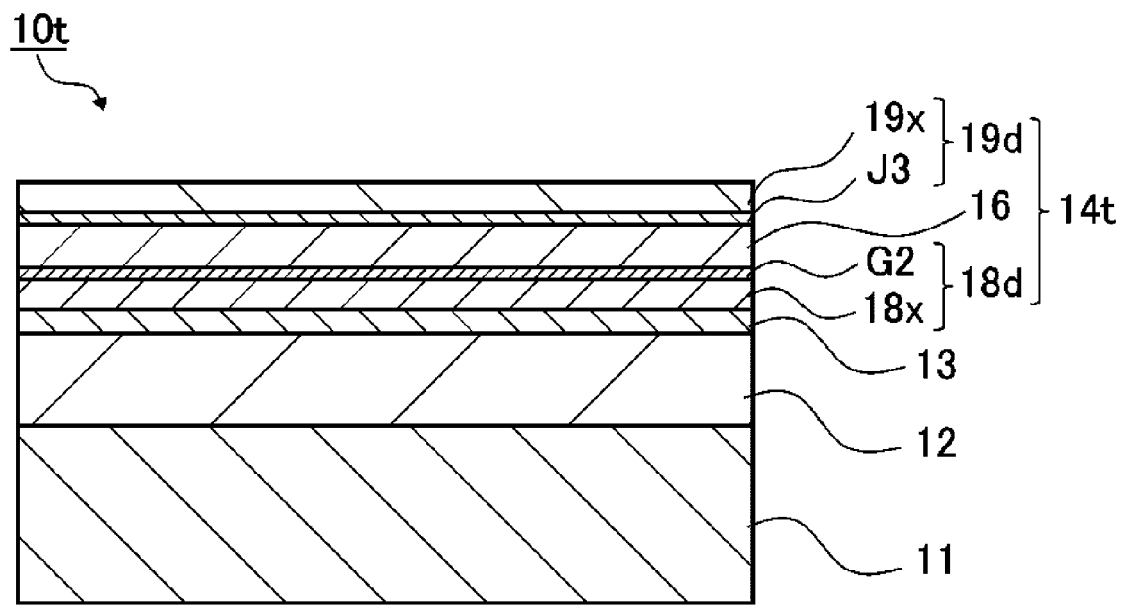
FIG. 20 is a schematic diagram showing an example of the reflective mask blank according to the fourth embodiment of the present invention.

FIG. 20 shows a modification of the reflective mask blank according to the fourth embodiment of the present invention.

A reflective mask blank 10t shown in FIG. 20 includes the substrate 11, the multilayer reflective film 12, the protective film 13, and a phase shift film 14t in this order. The phase shift film 14t includes, from the protective film 13, the second layer 18d containing the one or more second elements, the first layer 16 containing the one or more first elements, and a third layer 19d containing the one or more third elements in this order. In addition, the second layer 18d includes the region G2 in which a content of an element having a highest content among the one or more second elements increases in a thickness direction from a side opposite to the first layer 16 toward the first layer 16, and the region G2 is present adjacent to the first layer 16. In addition, the third layer 19d includes the region J3 in which a content of an element (third specific element) having a highest content among the one or more third elements increases in a thickness direction from a side opposite to the first layer 16 toward the first layer 16, and the region J3 is present adjacent to the first layer 16. A region of the second layer 18d other than the region G2 is the second layer normal region 18x, and the content of the element having the highest content among the one or more second elements in the second layer normal region 18x is smaller than that in the region G2. In addition, a region of the third layer 19d other than the region J3 is the third layer normal region 19x, and the content of the element having the highest content among the one or more third elements in the third layer normal region 19x is smaller than that in the region J3.

In the case of being compared, the reflective mask blank 10s shown in FIG. 19 and the reflective mask blank 10t shown in FIG. 20 have the same configuration except that the third layer 19d of the reflective mask blank 10t shown in FIG. 20 includes the region J3. Therefore, description of the same configuration is omitted.

In the reflective mask blank 10t shown in FIG. 20, interfacial peeling at an interface between the first layer 16 and the third layer 19d can be suppressed due to the presence of the region J3.

A preferable aspect of the region J3 is the same as the aspect of the region J3 of the reflective mask blank 10p shown in FIG. 16.

Further, in the aspect of the reflective mask blank 10s, the first layer 16 may include the region L1 in which a content of an element having a highest content among the one or more first elements contained in the first layer 16 increases in a thickness direction from a side opposite to the second layer 18d toward the second layer 18d. The region L1 is present adjacent to the second layer 18d. In addition, the first layer 16 may include the region M1 in which the content of the element having the highest content among the one or more first elements contained in the first layer 16 increases in a thickness direction from a side opposite to the third layer 19 toward the third layer 19. The region M1 is present adjacent to the third layer 19.

The first layer 16 may include both the regions L1 and M1.

In an aspect including the region L1, interfacial peeling at an interface between the second layer 18d and the first layer 16 can be further suppressed. In addition, in an aspect including the region M1, interfacial peeling at an interface between the first layer 16 and the third layer 19 can be suppressed.

Reflective Mask Blank (Fifth Embodiment)

A reflective mask blank according to the fifth embodiment of the present invention includes, a substrate, a multilayer reflective film that reflects EUV light, a protective film, and a phase shift film that shifts a phase of EUV light, in this order, in which the phase shift film includes a first layer containing one or more first elements selected from the group consisting of Ru, Re, Ir, Ag, Os, Au, Pd, and Pt, and a second layer containing one or more second elements selected from the group consisting of Ta and Cr from a side of the protective film in this order, the first layer includes a region N1 in which a content of an element having a highest content among the one or more first elements increases in a thickness direction from a side opposite to the protective film toward the protective film, and the region N1 is present adjacent to the protective film.

Regarding the first layer, in other words, the first layer includes the region N1 present adjacent to the protective film, and in the region N1, the content of the element having the highest content among the one or more first elements increases in the thickness direction from the side opposite to the protective film toward the protective film.

The fact that in the region N1, the content of the element having the highest content among the one or more first elements increases in the thickness direction from the side opposite to the protective film toward the protective film is the same as the definition of the region B1.

Figure 21:
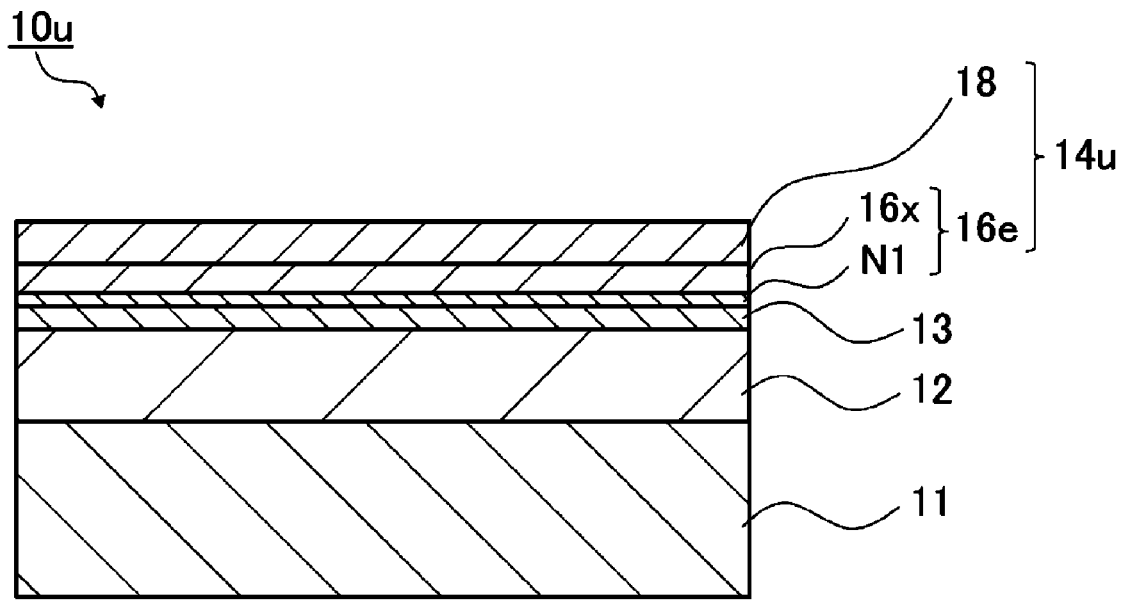
FIG. 21 is a schematic diagram showing an example of a reflective mask blank according to a fifth embodiment of the present invention.

The reflective mask blank according to the fifth embodiment will be described with reference to FIG. 21. A reflective mask blank 10u shown in FIG. 21 includes the substrate 11, the multilayer reflective film 12, the protective film 13, and a phase shift film 14u in this order. The phase shift film 14u includes a first layer 16e containing the one or more first elements and the second layer 18 containing the one or more second elements in this order from the protective film 13. In addition, the first layer 16e includes the region N1 in which a content of an element having a highest content among the one or more first elements increases in a thickness direction from a side opposite to the protective film 13 toward the protective film 13, and the region N1 is present adjacent to the protective film 13. A region of the first layer 16e other than the region N1 is the first layer normal region 16x, and the content of the element having the highest content among the one or more first elements in the first layer normal region 16x is smaller than that in the region N1.

The content of the first specific element in a portion of the region N1 closest to the first layer on a vertical cross section is preferably 50 at % to 95 at %, more preferably 50 at % to 85 at %, and still more preferably 50 at % to 75 at %. In addition, the content of the first specific element in a portion of the region N1 closest to the protective film on the vertical cross section is preferably 60 at % to 100 at %, more preferably 70 at % or more and less than 100 at %, and still more preferably 80 at % or more and less than 100 at %.

A difference obtained by subtracting the content of the first specific element in the portion closest to the first layer from the content of the first specific element in the portion closest to the protective film is preferably 5 at % to 50 at %, and more preferably 10 at % to 50 at %.

In the reflective mask blank according to the fifth embodiment of the present invention, occurrence of interfacial peeling is suppressed even when a heat treatment is performed.

The present inventors have studied a reflective mask blank including a two-layer type phase shift film, and interfacial peeling may occur at an interface between a first layer of the phase shift film and a protective film.

A mechanism of suppressing the occurrence of interfacial peeling by the heat treatment is considered to be the same as the mechanism in the first embodiment.

The reflective mask blank according to the first embodiment of the present invention and the mask blank according to the fifth embodiment of the present invention have the same configuration except that the first layer in the phase shift film does not include the region A1 and includes the region N1.

That is, the substrate, the multilayer reflective film, and the protective film included in the reflective mask blank according to the fifth embodiment, and a back surface conductive film and other films that may be included in the reflective mask blank according to the fifth embodiment are the same as those in the first embodiment, and thus description thereof is omitted.

(Phase Shift Film)

The phase shift film included in the reflective mask blank according to the fifth embodiment of the present invention includes a first layer containing one or more first elements selected from the group consisting of Ru, Re, Ir, Ag, Os, Au, Pd, and Pt, and a second layer containing one or more second elements selected from the group consisting of Ta and Cr.

Hereinafter, the respective layers constituting the phase shift film will be described in detail.

In the fifth embodiment, the first layer contains one or more first elements selected from the group consisting of Ru, Re, Ir, Ag, Os, Au, Pd, and Pt, and a preferable aspect of a material constituting the first layer is the same as that of the first embodiment.

In the fifth embodiment, the first layer includes the region N1 in which a content of an element having a highest content among the one or more first elements increases in a thickness direction from a side opposite to the protective film toward the protective film, and the region N1 is present adjacent to the protective film.

A definition and a preferable aspect of "increase" are as described above.

A preferable aspect of the film thickness, the refractive index n, and the extinction coefficient k of the first layer is the same as the preferable aspect of the first layer according to the first embodiment.

The region N1 is usually disposed in a part of the first layer in the thickness direction, and a proportion of a thickness of the region N1 to a total thickness of the first layer is preferably 1% to 30%, and more preferably 3% to 15%.

In addition, a film thickness of the region N1 is preferably 0.1 nm to 10 nm, and more preferably 0.5 nm to 5 nm.

The film thickness of the region N1 is determined based on a measurement result of the content of the element measured by the above-described measurement method.

In the fifth embodiment, the second layer contains one or more second elements selected from the group consisting of Ta and Cr, and a preferable aspect of a material constituting the second layer is the same as that of the first embodiment.

A film thickness of the second layer is the same as the preferable aspect of the second layer according to the first embodiment.

A method for forming the first layer and the second layer is as described in the first embodiment.

As a method for forming the region N1 included in the first layer, film formation may be performed under a condition that the element having the highest content among the one or more first elements contained in the first layer increases. Examples of the film formation method include the above-described film formation method.

Examples of the condition include the condition described in the first embodiment.

The reflective mask blank according to the fifth embodiment can be manufactured by forming the region N1 under the above condition after formation of the protective film and at the start of formation of the first layer, forming the first layer after, and then forming the second layer.

A preferable aspect of the film thickness of the phase shift film, the EUV light reflectance of the reflective mask blank, the phase difference caused by the phase shift film, and the reflectance for deep-UV is the same as the preferable aspect of the first embodiment.

Reflective Mask Blank (Sixth Embodiment)

A reflective mask blank according to the sixth embodiment of the present invention includes, a substrate, a multilayer reflective film that reflects EUV light, a protective film, and a phase shift film that shifts a phase of EUV light, in this order, in which the phase shift film includes a second layer containing one or more second elements selected from the group consisting of Ta and Cr and a first layer containing one or more first elements selected from the group consisting of Ru, Re, Ir, Ag, Os, Au, Pd, and Pt in this order from a side of the protective film, the second layer includes a region O2 in which a content of an element having a highest content among the one or more second elements increases in a thickness direction from a side opposite to the protective film toward the protective film, and the region O2 is present adjacent to the protective film.

Regarding the second layer, in other words, the second layer includes the region O2 present adjacent to the protective film, and in the region O2, the content of the element having the highest content among the one or more second elements increases in the thickness direction from the side opposite to the protective film toward the protective film.

The fact that in the region O2, the content of the element having the highest content among the one or more second elements increases in a thickness direction from the side opposite to the protective film toward the protective film is the same as the definition of the region B2.

Figure 22:
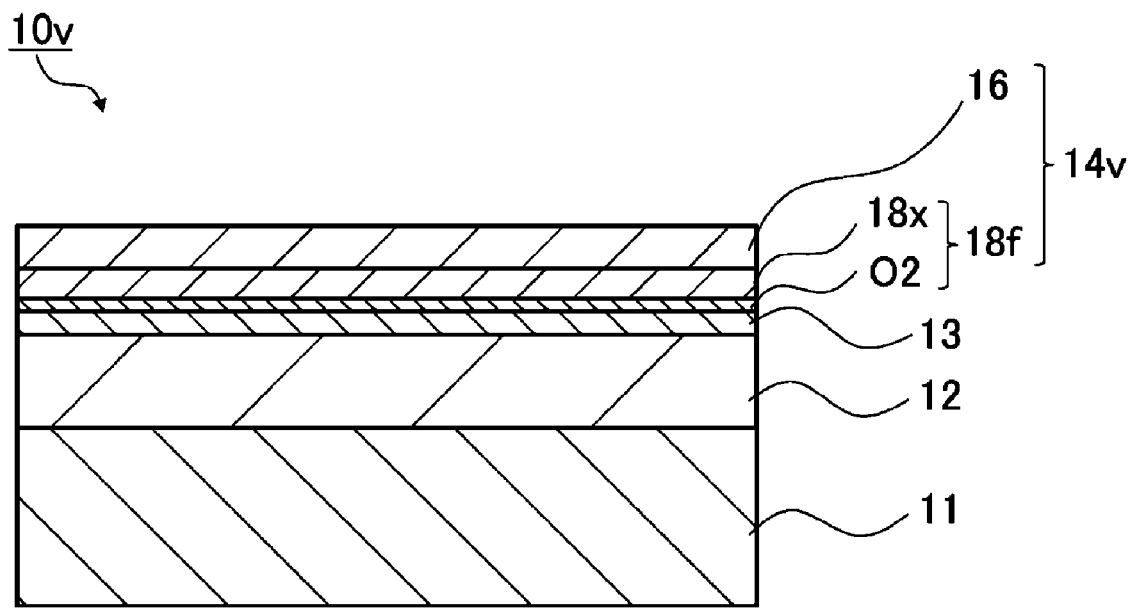
FIG. 22 is a schematic diagram showing an example of a reflective mask blank according to a sixth embodiment of the present invention.

The reflective mask blank according to the sixth embodiment will be described with reference to FIG. 22. A reflective mask blank 10v shown in FIG. 22 includes the substrate 11, the multilayer reflective film 12, the protective film 13, and a phase shift film 14v in this order. The phase shift film 14v includes a second layer 18f containing the one or more second elements and the first layer 16 containing the one or more first elements in this order from the protective film 13. In addition, the second layer 18f includes the region O2 in which a content of an element having a highest content among the one or more second elements increases in a thickness direction from a side opposite to the protective film 13 toward the protective film 13, and the region O2 is present adjacent to the protective film 13. A region of the second layer 18f other than the region O2 is the second layer normal region 18x, and the content of the element having the highest content among the one or more second elements in the second layer normal region 18x is smaller than that in the region O2.

A content of the first specific element in a portion of the region O2 closest to the second layer on a vertical cross section is preferably 20 at % to 80 at %, more preferably 20 at % to 60 at %, and still more preferably 20 at % to 40 at %. In addition, the content of the first specific element in a portion of the region O2 closest to the protective film on the vertical cross section in is preferably 60 at % to 100 at %, more preferably 70 at % or more and less than 100 at %, and still more preferably 80 at % or more and less than 100 at %.

A difference obtained by subtracting the content of the first specific element in the portion closest to the second layer from the content of the first specific element in the portion closest to the protective film is preferably 10 at % to 80 at %, and more preferably 20 at % to 70 at %.

In the reflective mask blank according to the sixth embodiment of the present invention, occurrence of interfacial peeling is suppressed even when a heat treatment is performed.

A mechanism of suppressing the occurrence of interfacial peeling by the heat treatment is considered to be the same as the mechanism in the fifth embodiment.

The reflective mask blank according to the second embodiment of the present invention and the mask blank according to the sixth embodiment of the present invention have the same configuration except that the second layer in the phase shift film does not include the region G2 and includes the region O2.

That is, the substrate, the multilayer reflective film, and the protective film included in the reflective mask blank according to the sixth embodiment, and a back surface conductive film and other films that may be included in the reflective mask blank according to the sixth embodiment are the same as those in the second embodiment, and thus description thereof is omitted.

(Phase Shift Film)

The phase shift film included in the reflective mask blank according to the sixth embodiment of the present invention includes a first layer containing one or more first elements selected from the group consisting of Ru, Re, Ir, Ag, Os, Au, Pd, and Pt, and a second layer containing one or more second elements selected from the group consisting of Ta and Cr.

Hereinafter, the respective layers constituting the phase shift film will be described in detail.

In the sixth embodiment, the first layer contains one or more first elements selected from the group consisting of Ru, Re, Ir, Ag, Os, Au, Pd, and Pt, and a preferable aspect of a material constituting the first layer is the same as that of the third embodiment.

A preferable aspect of the film thickness, the refractive index n, and the extinction coefficient k of the first layer is the same as the preferable aspect of the first layer according to the first embodiment.

In the sixth embodiment, the second layer contains one or more second elements selected from the group consisting of Ta and Cr, and a preferable aspect of a material constituting the second layer is the same as that of the second embodiment.

In the sixth embodiment, the second layer includes the region O2 in which the content of the element having the highest content among the one or more second elements increases in the thickness direction from the side opposite to the protective film toward the protective film, and the region O2 is present adjacent to the protective film.

A definition and a preferable aspect of "increase" are as described above.

The region O2 is usually disposed in a part of the first layer in the thickness direction, and a proportion of a thickness of the region O2 to a total thickness of the first layer is preferably 1% to 50%, and more preferably 3% to 30%.

In addition, a film thickness of the region O2 is preferably 0.1 nm to 15 nm, and more preferably 0.5 nm to 10 nm.

The film thickness of the region O2 is determined based on a measurement result of the content of the element measured by the above-described measurement method.

In the case where the first layer contains the one or more first elements and Ta or Cr, a layer containing the one or more first elements is defined as the first layer and is not defined as the second layer.

A film thickness of the second layer is the same as the preferable aspect of the second layer according to the first embodiment.

A method for forming the first layer and the second layer is as described in the first embodiment.

As a method for forming the region O2 included in the second layer, film formation may be performed under a condition that the element having the highest content among the one or more second elements contained in the second layer increases. Examples of the film formation method include the above-described film formation method.

Examples of the condition include the condition described in the first embodiment.

The reflective mask blank according to the sixth embodiment can be manufactured by forming the region O2 under the above condition after formation of the protective film and at the start of formation of the second layer, forming the second layer, and then forming the first layer after.

A preferable aspect of the film thickness of the phase shift film, the EUV light reflectance of the reflective mask blank, the phase difference caused by the phase shift film, and the reflectance for deep-UV is the same as the preferable aspect of the first embodiment.

(Modification)

Hereinafter, a modification of the reflective mask blank according to the sixth embodiment will be described.

In an aspect to be described below, a definition and an aspect of "increase" are the same as those in the region A1 and the like.

The reflective mask blank according to the sixth embodiment of the present invention may have an aspect in which in the reflective mask blank 10v, the phase shift film 14v includes, from the protective film 13, the second layer 18f, the first layer 16, and a third layer containing one or more third elements selected from the group consisting of Ta and Cr in this order.

A preferable aspect of the third layer is the same as the preferable aspect of the second layer described above.

In addition, in the above-described aspect, the third layer may include a region P3 in which a content of an element having the highest content among the one or more third elements contained in the third layer increases in a thickness direction from a side opposite to the first layer 16 toward the first layer 16. The region P3 is present adjacent to the first layer 16.

In an aspect including the region P3, interfacial peeling at an interface between the first layer 16 and the third layer can be suppressed.

<Method for Manufacturing Reflective Mask and Reflective Mask>

A reflective mask is obtained by patterning a phase shift film included in a reflective mask blank (first embodiment, second embodiment, third embodiment, fourth embodiment, fifth embodiment, or sixth embodiment) according to the present invention. An example of a method for manufacturing the reflective mask will be described with reference to each of FIG. 23A to FIG. 23D. Hereinafter, a method for manufacturing a reflective mask will be described using the reflective mask blank 10a according to the first embodiment described in FIG. 1, and a reflective mask can be similarly manufactured even in the other aspects.

Figure 23A:
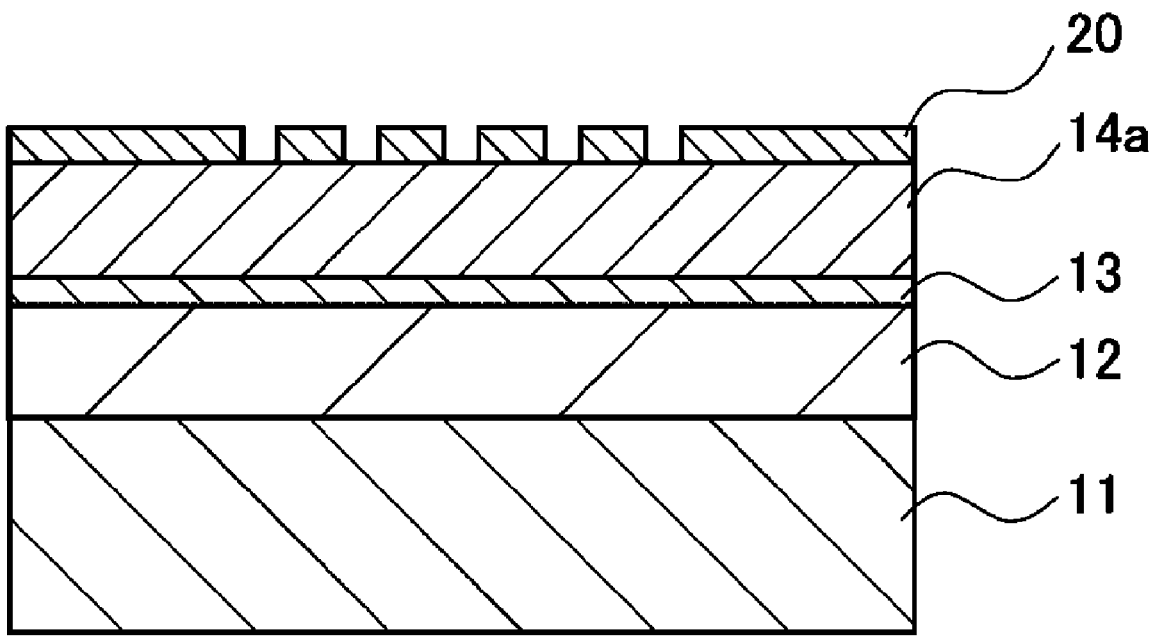

FIG. 23A shows a state where a resist pattern 20 is formed on a reflective mask blank including the substrate 11, the multilayer reflective film 12, the protective film 13, and the phase shift film 14a in this order. A method for forming the resist pattern 20 may be a known method, and for example, a resist is applied onto the phase shift film 14a of the reflective mask blank, and the resist pattern 20 is formed by performing exposure and development. The resist pattern 20 corresponds to a pattern formed on a wafer using a reflective mask.

Figure 23B:
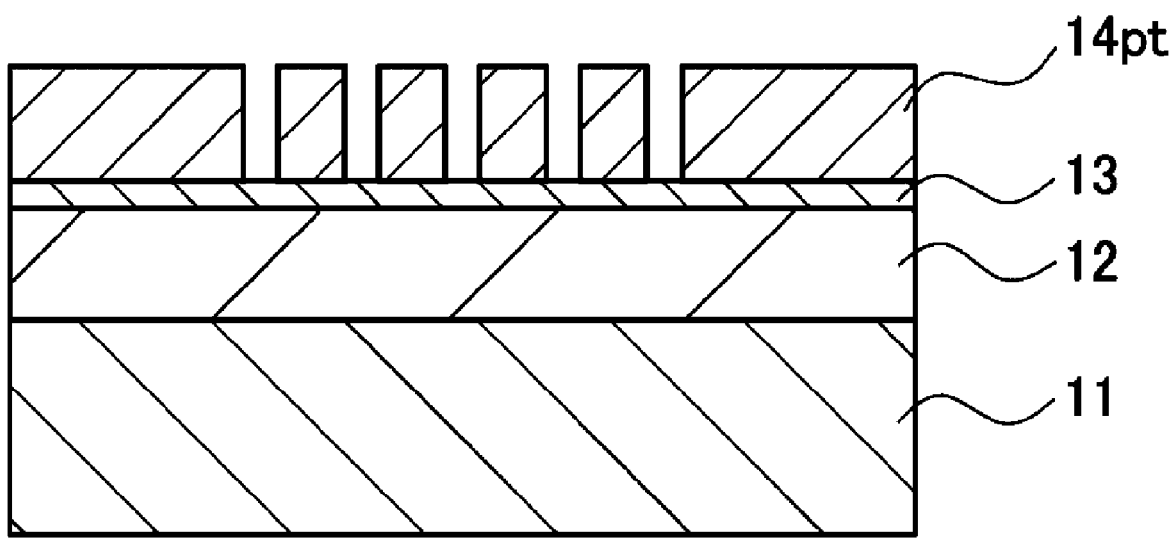

Thereafter, the phase shift film 14a is etched and patterned using the resist pattern 20 in FIG. 23A as a mask, and the resist pattern 20 is removed to obtain a laminate including a phase shift film pattern 14pt shown in FIG. 23B.

Figure 23C:
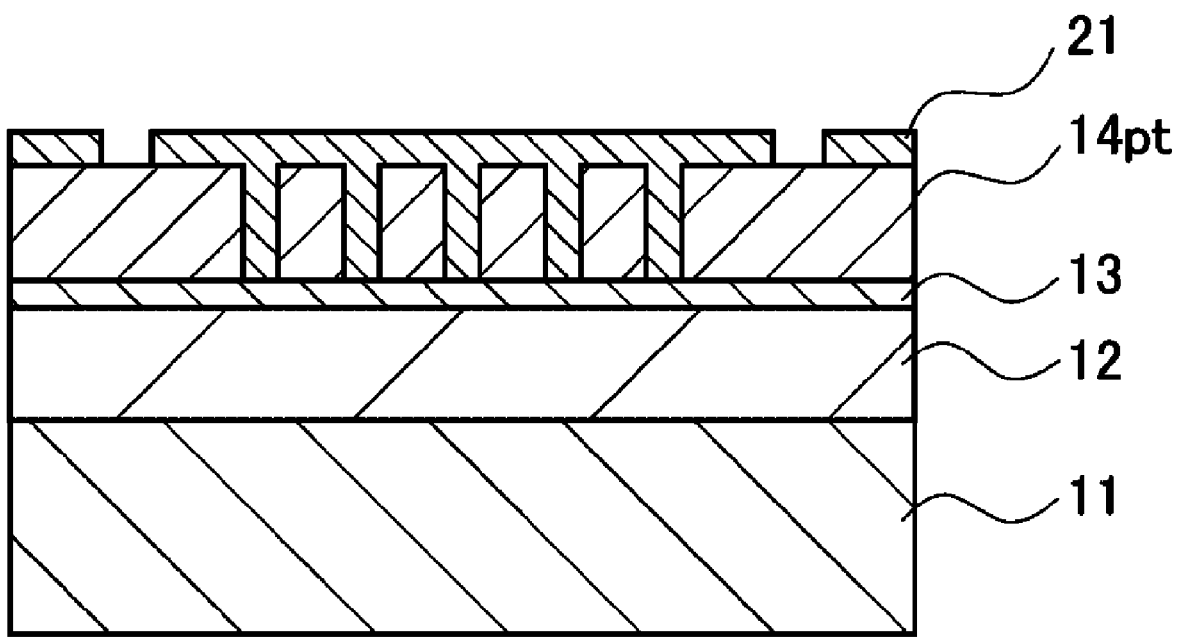
Figure 23D:
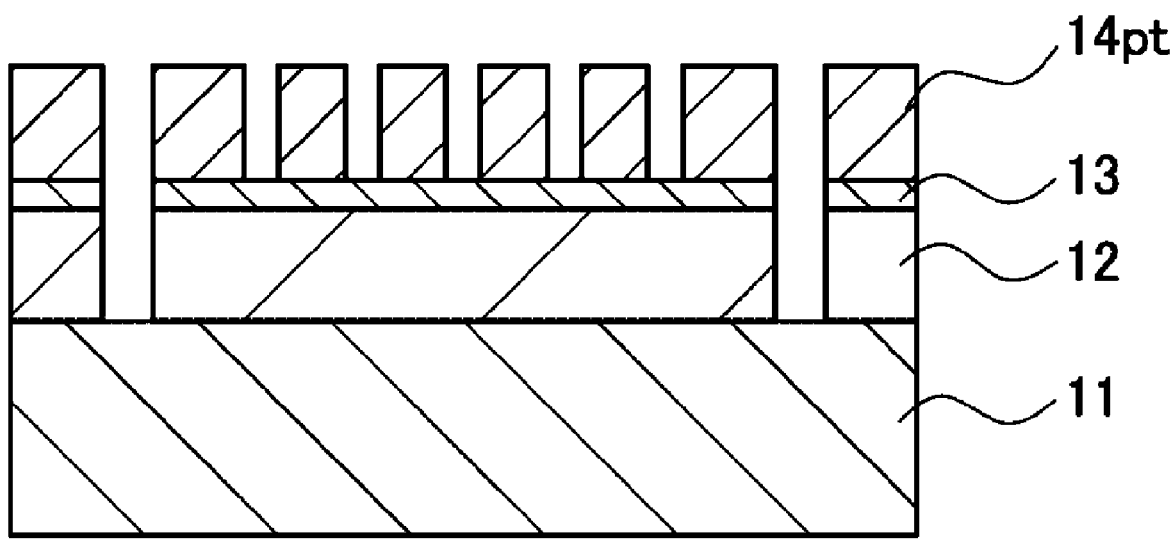

Next, as shown in FIG. 23C, a resist pattern 21 corresponding to a frame of an exposure region is formed on the laminate in FIG. 23B, and dry etching is performed using the resist pattern 21 in FIG. 23C as a mask. The dry etching is performed until the substrate 11 is reached. After the dry etching, the resist pattern 21 is removed to obtain a reflective mask shown in FIG. 23D.

Examples of the dry etching for forming the phase shift film pattern 14pt include a dry etching using a Cl gas and a dry etching using an F gas.

The resist pattern 20 or 21 may be removed by a known method, and may be removed by a cleaning solution. Examples of the cleaning solution include sulfuric peroxide mixture (SPM), sulfuric acid, ammonia water, ammonia peroxide mixture (APM), OH radical cleaning water, and ozone water.

The reflective mask obtained by patterning the phase shift film of the reflective mask blank according to the present invention can be suitably applied as a reflective mask used for exposure with EUV light.

Examples

Hereinafter, the present invention will be described in more detail based on Examples.

Materials, amounts used, proportions, and the like described in the following Examples can be appropriately changed without departing from the gist of the present invention. Therefore, the scope of the present invention should not be construed as being limited to the following Examples.

Examples 1, 2, and 8 to be described later are comparative examples, and Examples 3 to 7 are inventive examples.

<Preparation of Sample>

A sample for an interfacial peeling test used in Example 1 was prepared by the following procedure.

An $SiO_2$—$TiO_2$-based glass substrate (outer shape of 152 mm square, thickness of about 6.3 mm) was used. A thermal expansion coefficient of the glass substrate was $0.02 \times 10^{-7}$/° C. or less. The glass substrate was polished to obtain a smooth surface having a surface roughness of one surface of 0.15 nm or less in terms of a root mean square roughness Rq and a flatness of 100 nm or less.

A Cr layer having a thickness of about 100 nm was formed on a back surface (surface opposite to processed surface) of the glass substrate by using a magnetron sputtering method to form a back surface conductive film for an electrostatic chuck. A sheet resistance value of the Cr layer was about 100Ω/□.

After the conductive layer was formed on the back surface of the glass substrate, Mo layers (2.3 nm) and Si layers (4.5 nm) were alternately formed by an ion beam sputtering method to form a multilayer reflective film (272 nm). The number of Mo layers and the number of Si layers were each 40, and film formation was performed so that the Si layer became the outermost surface. Film formation conditions for the Mo layers and the Si layers were as follows. The film thickness of each layer was obtained by fitting using the material of the film and the film thickness as parameters by an X-ray reflectance (XRR) method.

Hereinafter, the glass substrate on which the multilayer reflective film is formed by the above-described procedure is also referred to as a "substrate attached with a multilayer reflective film".

(Film Formation Conditions for Mo layer (Ion Beam Sputtering Method))
Target: Mo target
Sputtering gas: Ar gas (gas partial pressure: 0.02 Pa)
Acceleration voltage: 700 V
Film formation rate: 0.064 nm/sec
(Film Formation Conditions for Si Layer (Ion Beam Sputtering Method))
Target: Si target (B doped)
Sputtering gas: Ar gas (gas partial pressure: 0.02 Pa)
Acceleration voltage: 700 V
Film formation rate: 0.077 nm/sec A phase shift film including a protective film made of Ru, a layer made of tantalum oxynitride, and a layer made of a composite nitride of Ru and Ta in this order was formed on the substrate attached with a multilayer reflective film under the following conditions to obtain a sample for an interfacial peeling test used in Example 1.

(Film Formation Conditions for Ru Protective Film (Direct Current Sputtering Method)
  Target: Ru target
  Sputtering gas: Ar gas (gas partial pressure: 0.2 Pa)
  Applied voltage: 400 V
  Film formation rate: 0.11 nm/sec
(Film Formation Conditions for Tantalum Oxynitride Layer (Reactive Sputtering Method))
  Target: Ta target
  Sputtering gas: mixed gas of Ar gas, $O_2$ gas, and $N_2$ gas (Ar:$O_2$:$N_2$=5:1:1, mixed gas partial pressure: 0.2 Pa)
  Applied voltage: 500 V
  Film formation rate: 0.01 nm/sec
(Film Formation Conditions for Composite Nitride Layer of Ru and Ta (Reactive Sputtering Method))
  Target: Ru—Ta alloy target
  Sputtering gas: mixed gas of Ar gas and $N_2$ gas (Ar:$N_2$=5:1, mixed gas partial pressure: 0.2 Pa)
  Applied voltage: 500 V
  Film formation rate: 0.07 nm/sec A sample used in Example 2 was obtained by forming a phase shift film including a protective film made of Rh, a layer made of a composite nitride of Ru and Ta, and a layer made of tantalum oxynitride in this order on the substrate attached with a multilayer reflective film. The formation of the protective film made of Rh was performed in the same manner as in the formation of the protective film made of Ru except that Rh was used as a target.

A procedure for preparing a sample used in Example 3 will be described below. The sample used in Example 3 corresponds to the second embodiment described above.

First, a protective film made of Ru and a layer (second layer) made of tantalum oxynitride were formed on the substrate attached with a multilayer reflective film by the same method as that of the sample used in Example 1. Thereafter, an Ru layer was formed under the film formation condition for the protective film made of Ru, and then a layer (first layer) made of a composite nitride of Ru and Ta was formed under the same condition as those of the sample used in Example 1 to obtain the sample used in Example 3. In the layer made of a composite nitride of Ru and Ta, a content of Ru is the highest, the first layer includes a region A1 in which the content of Ru increases in a thickness direction from a side opposite to the second layer toward the second layer, and the region A1 is present adjacent to the second layer.

A procedure for preparing a sample used in Example 4 will be described below. The sample used in Example 4 corresponds to the fourth embodiment described above.

First, a protective film made of Ru and a layer made of tantalum oxynitride were formed on the substrate attached with a multilayer reflective film by the same method as that of the sample used in Example 1, and thereafter, a Ta layer was formed using Ta as a target under the film formation condition for the protective film made of Ru (second layer). Next, a layer (first layer) made of a composite nitride of Ru and Ta was formed under the same condition as that of the sample used in Example 1 to obtain the sample used in Example 4. In the layer made of tantalum oxynitride, a content of Ta is the highest, the second layer includes a region G2 in which the content of Ta increases in a thickness direction from a side opposite to the first layer toward the first layer, and the region G2 is present adjacent to the first layer.

A procedure for preparing a sample used in Example 5 will be described below. The sample used in Example 5 corresponds to the third embodiment described above.

First, a protective film made of Rh and a layer (first layer) made of a composite nitride of Ru and Ta were formed on the substrate attached with a multilayer reflective film by the same method as that of the sample used in Example 1. Thereafter, a tantalum nitride layer was formed using a mixed gas of Ar gas and $N_2$ gas (Ar:$N_2$=5:1) as a sputtering gas under the film formation condition for the layer made of tantalum oxynitride, and next, a layer (second layer) made of tantalum oxynitride was formed by the same method as that of the sample used in Example 1, thereby obtaining the sample used in Example 5. In the layer made of tantalum oxynitride, a content of Ta is the highest, the second layer includes a region G2 in which the content of Ta increases in a thickness direction from a side opposite to the first layer toward the first layer, and the region G2 is present adjacent to the first layer.

A procedure for preparing a sample used in Example 6 will be described below. The sample used in Example 6 corresponds to the fifth embodiment described above.

First, a protective film made of Rh was formed on the substrate attached with a multilayer reflective film by the same method as that of the sample used in Example 2. Thereafter, an Ru layer was formed under the film formation condition for the protective film made of Ru. Next, a layer (first layer) made of a composite nitride of Ru and Ta and a layer (second layer) made of tantalum oxynitride were formed by the same method as that of the sample used in Example 1 to obtain the sample used in Example 6. In the layer made of a composite nitride of Ru and Ta, a content of Ru is the highest, the first layer includes a region N1 in which the content of Ru increases in a thickness direction from a side opposite to the protective film toward the protective film, and the region N1 is present adjacent to the protective film.

A procedure for preparing a sample used in Example 7 will be described below. The sample used in Example 7 corresponds to the sixth embodiment described above.

First, a protective film made of Ru was formed on the substrate attached with a multilayer reflective film by the same method as that of the sample used in Example 1. Thereafter, a tantalum nitride layer was formed using a mixed gas of Ar gas and $N_2$ gas (Ar:$N_2$=5:1) as a sputtering gas under the film formation condition for the layer made of tantalum oxynitride. Next, a layer (second layer) made of tantalum oxynitride and a layer (first layer) made of a composite nitride of Ru and Ta were formed by the same method as the sample used in Example 1 to obtain the sample used in Example 7. In the layer made of tantalum oxynitride, a content of Ta is the highest, the second layer includes a region O2 in which the content of Ta increases in a thickness direction from a side opposite to the protective film toward the protective film, and the region O2 is present adjacent to the protective film.

Configurations of the respective samples are also shown in the following table.

A procedure for preparing a sample used in Example 8 will be described below.

First, a protective film made of Ru and a layer (second layer) made of tantalum oxynitride were formed on the substrate attached with a multilayer reflective film by the same method as that of the sample used in Example 1. Next, a layer (RuTaN) made of a composite nitride of Ru and Ta was formed under the same condition as the sample used in Example 1, and then an Ru layer was formed under the film formation condition for the protective film made of Ru.

<Evaluation on Interfacial Peeling>

Each of the samples prepared by the above procedure was cut into a piece of 2.5 cm square to be used as a test piece for the interfacial peeling test.

Each test piece was placed on a hot plate heated to 240° C. and heated for 5 minutes. A surface of the heated test piece on a phase shift film side was observed with a scanning electron microscope (SU-70 manufactured by Hitachi High-Technologies Corporation) to confirm the presence or absence of interfacial peeling. Since it can be said that the interfacial peeling develops from a blister (film swelling due to partial peeling), the evaluation was performed based on an area of blisters. Evaluation criteria are as follows. Evaluation results are shown in the following table.

A: ratio of area of blister to observation field area of SEM observation image (observation magnification of 100,000 times) of heated test piece of less than 1%

B: ratio of area of blister to observation field area of SEM observation image (observation magnification of 100,000 times) of heated test piece of 1% or more and less than 20%

C: ratio of area of blister to observation field area of SEM observation image (observation magnification of 100,000 times) of heated test piece of 20% or more <Refractive Index and Extinction Coefficient>

According to the above-described method, a refractive index n and an extinction coefficient k of the first layer with respect to an electromagnetic wave having a wavelength of 13.5 nm were obtained using the glass substrate on which only the first layer was formed as a sample.

<EUV Light Reflectance>

A reflectance of the phase shift film of each sample was measured in accordance with the above-described method.

<Results>

The configurations and the evaluation results of each sample are shown in the table.

"TaON" and "RuTaN" in Table 1 represent tantalum oxynitride and a composite nitride of Ru and Ta, respectively.

Notation in a column "upper layer" of a column "phase shift film" of Example 3 in Table 1 represents that the upper layer includes both "RuTaN" and "region A1". The same applies to notations in columns "upper layer" and "lower layer" of Examples 4 to 7.

TABLE 1

|  |  | Example 1 | Example 2 | Example 3 | Example 4 | Example 5 | Example 6 | Example 7 | Example 8 |
|---|---|---|---|---|---|---|---|---|---|
| Phase shift film | Upper layer each lower part: film thickness (nm) | RuTaN 30 | TaON 20 | RuTaN 30 Region A1 2 | RuTaN 30 | TaON 10 Region G2 10 | TaON 20 | RuTaN 30 | Ru 30 RuTaN 2 |
|  | Lower layer each lower part: film thickness (nm) | TaON 20 | RuTaN 30 | TaON 20 | Region G2 2 TaON 20 | RuTaN 30 | RuTaN 30 Region N1 2 | TaON 10 Region O2 10 | TaON 20 |
|  | Protective film | Ru | Rh | Ru | Ru | Rh | Rh | Ru | Ru |
| Physical property | Refractive index of first layer | 0.899 | 0.899 | 0.899 | 0.899 | 0.899 | 0.899 | 0.899 | 0.896 |
|  | Extinction coefficient of first layer | 0.017 | 0.017 | 0.017 | 0.017 | 0.017 | 0.017 | 0.017 | 0.017 |
| Evaluation | EUV light reflectance | 9% | 10% | 12% | 10% | 8% | 11% | 7% | 12% |
|  | Evaluation on interfacial peeling | C | C | A | A | B | A | A | C |

According to the results of Table 1, it was confirmed that in Examples 3 to 7 including a region in which a content of an element having a highest content among the one or more first elements increases in the first layer, or a region in which a content of an element having a highest content among the one or more second elements increases in the second layer, the interfacial peeling can be suppressed as compared with Examples 1, 2, and 8 including neither of the above regions. In addition, Example 8 was provided with an intermediate region (RuTaN) having a smaller amount of the first specific element than that of the first layer, which could not suppress the interfacial peeling, and the interfacial peeling property was deteriorated.

Although the present invention has been described in detail with reference to specific embodiments, it is apparent to those skilled in the art that various changes and modifications can be made without departing from the spirit and scope of the present invention. The present application is based on Japanese Patent Application No. 2022-074386 filed on Apr. 28, 2022, the contents of which are incorporated herein by reference.

REFERENCE SIGNS LIST 10a to 10v: reflective mask blank
11: substrate
12: multilayer reflective film
13: protective film
14a to 14v: phase shift film
14pt: phase shift film pattern
16, 16a to 16e: first layer
16x: first layer normal region
18, 18a to 18f: second layer
18x: second layer normal region
19: third layer
20, 21: resist pattern

What is claimed is:

1. A reflective mask blank comprising:
a substrate;
a multilayer reflective film configured to reflect EUV light;
a protective film; and
a phase shift film configured to shift a phase of EUV light, in this order, wherein
the phase shift film comprises a first layer comprising one or more first elements selected from a group consisting of ruthenium, rhenium, iridium, silver, osmium, gold, palladium, and platinum, and a second layer comprising one or more second elements selected from a group consisting of tantalum and chromium,
the first layer comprises a region A1 in which a content of an element having a highest content among the one or more first elements increases in a thickness direction from a side opposite to the second layer toward the second layer, and the region A1 is present adjacent to the second layer.

2. The reflective mask blank according to claim 1, wherein
in a case where the first layer is disposed closer to the protective film than the second layer in the phase shift film, the first layer comprises a region B1 in which a content of an element having a highest content among the one or more first elements increases in a thickness direction from a side opposite to the protective film toward the protective film, and the region B1 is located closer to the protective film than the first layer and is adjacent to a layer in contact with the first layer, and in a case where the second layer is disposed closer to the protective film than the first layer in the phase shift film, the second layer comprises a region B2 in which a content of an element having a highest content among the one or more second elements increases in a thickness direction from a side opposite to the protective film toward the protective film, and the region B2 is located closer to the protective film than the second layer and is adjacent to a layer in contact with the second layer.

3. The reflective mask blank according to claim 1, wherein the phase shift film comprises a third layer comprising one or more third elements selected from a group consisting of tantalum and chromium, the first layer, and the second layer in this order.

4. The reflective mask blank according to claim 3, wherein the first layer comprises a region C1 in which a content of an element having a highest content among the one or more first elements increases in a thickness direction from a side opposite to the third layer toward the third layer, and the region C1 is present adjacent to the third layer.

5. The reflective mask blank according to claim 3, wherein
in a case where the third layer is disposed closer to the protective film in the phase shift film, the second layer comprises a region D2 in which a content of an element having a highest content among the one or more second elements increases in a thickness direction from a side opposite to the first layer toward the first layer, and the region D2 is present adjacent to the first layer, and
in a case where the second layer is disposed closer to the protective film in the phase shift film,
the second layer comprises the region D2 in which a content of an element having the highest content among the one or more second elements increases in a thickness direction from a side opposite to the first layer toward the first layer, and the region D2 is present adjacent to the first layer, or
the second layer comprises a region E2 in which a content of an element having a highest content among the one or more second elements increases in a thickness direction from a side opposite to the protective film toward the protective film, and the region E2 is present adjacent to the protective film.

6. The reflective mask blank according to claim 3, wherein
in a case where the third layer is disposed closer to the protective film in the phase shift film, the third layer comprises a region F3 in which a content of an element having a highest content among the one or more third elements increases in a thickness direction from a side opposite to the first layer toward the first layer, and the region F3 is present adjacent to the first layer, or
the third layer comprises a region G3 in which a content of an element having a highest content among the one or more third elements increases in a thickness direction from a side opposite to the protective film toward the protective film, and the region G3 is present adjacent to the protective film, and
in a case where the second layer is disposed closer to the protective film in the phase shift film, the third layer comprises the region F3 in which a content of an element having a highest content among the one or more third elements increases in a thickness direction from a side opposite to the first layer toward the first layer, and the region F3 is present adjacent to the first layer.

7. The reflective mask blank according to claim 1, wherein at least one of the first layer and the second layer comprises one or more elements selected from a group consisting of boron, carbon, nitrogen, and oxygen.

8. The reflective mask blank according to claim 1, wherein
the first layer has a refractive index of 0.860 to 0.950 for an electromagnetic wave having a wavelength of 13.5 nm, and
the first layer has an extinction coefficient of 0.009 to 0.095 an electromagnetic wave having a wavelength of 13.5 nm.

9. The reflective mask blank according to claim 1, having a reflectance of 1% to 30% for an electromagnetic wave having a wavelength of 13.5 nm.

10. The reflective mask blank according to claim 1, wherein the phase shift film has a film thickness of 20 nm to 65 nm.

11. A reflective mask comprising:
a phase shift film pattern formed by patterning the phase shift film of the reflective mask blank according to claim 1.

12. A method for manufacturing a reflective mask, the method comprising:
patterning the phase shift film of the reflective mask blank according to claim 1.

13. A reflective mask blank comprising:
a substrate;
a multilayer reflective film configured to reflect EUV light;
a protective film; and
a phase shift film configured to shift a phase of EUV light, in this order, wherein
the phase shift film comprises a first layer comprising one or more first elements selected from a group consisting of ruthenium, rhenium, iridium, silver, osmium, gold, palladium, and platinum, and a second layer comprising one or more second elements selected from a group consisting of tantalum and chromium,
the second layer comprises a region G2 in which a content of an element having a highest content among the one or more second elements increases in a thickness direction from a side opposite to the first layer toward the first layer, and the region G2 is present adjacent to the first layer.

14. The reflective mask blank according to claim 13, wherein
in a case where the first layer is disposed closer to the protective film than the second layer in the phase shift film, the first layer comprises a region H1 in which a content of an element having a highest content among the one or more first elements increases in a thickness direction from a side opposite to the protective film toward the protective film, and the region H1 is located closer to the protective film than the first layer and is adjacent to a layer in contact with the first layer, and
in a case where the second layer is disposed closer to the protective film than the first layer in the phase shift film, the second layer comprises a region I2 in which a content of an element having a highest content among the one or more second elements increases in a thickness direction from a side opposite to the protective film toward the protective film, and the region I2 is located closer to the protective film than the second layer and is adjacent to a layer in contact with the second layer.

15. The reflective mask blank according to claim 13, wherein the phase shift film comprises a third layer comprising one or more third elements selected from a group consisting of tantalum and chromium, the first layer, and the second layer in this order.

16. The reflective mask blank according to claim 15, wherein
in a case where the third layer is disposed closer to the protective film in the phase shift film, the third layer comprises a region J3 in which a content of an element having a highest content among the one or more third elements increases in a thickness direction from a side opposite to the first layer toward the first layer, and the region J3 is present adjacent to the first layer, or
the third layer comprises a region K3 in which a content of an element having a highest content among the one or more third elements increases in a thickness direction from the side opposite to the protective film toward the protective film, and the region K3 is present adjacent to the protective film, and
in a case where the second layer is disposed closer to the protective film in the phase shift film, the third layer comprises the region J3 in which a content of an element having a highest content among the one or more third elements increases in a thickness direction from a side opposite to the first layer toward the first layer, and the region J3 is present adjacent to the first layer.

17. A reflective mask blank comprising:
a substrate;
a multilayer reflective film configured to reflect EUV light;
a protective film; and
a phase shift film configured to shift a phase of EUV light, in this order, wherein
the phase shift film comprises, from a side of the protective film, a first layer comprising one or more first elements selected from a group consisting of ruthenium, rhenium, iridium, silver, osmium, gold, palladium, and platinum, and a second layer comprising one or more second elements selected from a group consisting of tantalum and chromium in this order,
the first layer comprises a region N1 in which a content of an element having a highest content among the one or more first elements increases in a thickness direction from a side opposite to the protective film toward the protective film, and the region N1 is present adjacent to the protective film.

18. A reflective mask blank comprising:
a substrate;
a multilayer reflective film configured to reflect EUV light;
a protective film; and
a phase shift film configured to shift a phase of EUV light, in this order, wherein
the phase shift film comprises, from a side of the protective film, a second layer comprising one or more second elements selected from a group consisting of tantalum and chromium, and a first layer comprising one or more first elements selected from a group consisting of ruthenium, rhenium, iridium, silver, osmium, gold, palladium, and platinum in this order, the second layer comprises a region O2 in which a content of an element having a highest content among the one or more second elements increases in a thickness direction from a side opposite to the protective film toward the protective film, and the region O2 is present adjacent to the protective film.

* * * * *